(12) United States Patent
Nagai et al.

(10) Patent No.: US 8,976,586 B2
(45) Date of Patent: Mar. 10, 2015

(54) SEMICONDUCTOR MEMORY DEVICE FOR PSEUDO-RANDOM NUMBER GENERATION

(75) Inventors: Yuji Nagai, Sagamihara (JP); Atsushi Inoue, Tokyo (JP); Yoshikazu Takeyama, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/985,436

(22) PCT Filed: Feb. 17, 2012

(86) PCT No.: PCT/JP2012/054497
§ 371 (c)(1),
(2), (4) Date: Jan. 29, 2014

(87) PCT Pub. No.: WO2012/164986
PCT Pub. Date: Dec. 6, 2012

(65) Prior Publication Data
US 2014/0146607 A1      May 29, 2014

(30) Foreign Application Priority Data
Jun. 3, 2011    (JP) ................. 2011-125282

(51) Int. Cl.
*G11C 16/22*    (2006.01)
*G06F 7/58*    (2006.01)

(52) U.S. Cl.
CPC   *G11C 16/22* (2013.01); *G06F 7/58* (2013.01); *G06F 7/584* (2013.01)
USPC ............... 365/185.04; 365/185.18; 365/233.1

(58) Field of Classification Search
CPC ..................................................... G11C 16/22
USPC .............................. 365/185.04, 185.18, 233.1
See application file for complete search history.

(56) References Cited

U.S. PATENT DOCUMENTS

| 7,099,190 B2 | 8/2006 | Noguchi et al. |
| 7,475,367 B2 | 1/2009 | Wang et al. |
| 7,613,048 B2 | 11/2009 | Inoue et al. |
| 8,000,927 B2 | 8/2011 | Sukegawa |

(Continued)

FOREIGN PATENT DOCUMENTS

| FR | 2 829 643 | 3/2003 |
| JP | 10-93548 A | 4/1998 |

(Continued)

OTHER PUBLICATIONS

U.S. Appl. No. 14/001,437, filed Aug. 23, 2013, Nagai et al.

(Continued)

*Primary Examiner* — Hoai V Ho
(74) *Attorney, Agent, or Firm* — Oblon, McClelland, Maier & Neustadt, L.L.P.

(57) ABSTRACT

According to one embodiment, a semiconductor memory device includes a memory cell array including a plurality of memory cells, a random number generation circuit configured to generate a random number, and a controller configured to control the memory cell array and the random number generation circuit. The random number generation circuit includes a random number control circuit configured to generate a random number parameter based on data which is read out from the memory cell by a generated control parameter, and a pseudo-random number generation circuit configured to generate the random number by using the random number parameter as a seed value.

20 Claims, 39 Drawing Sheets

(56) References Cited

U.S. PATENT DOCUMENTS

| | | |
|---|---|---|
| 2006/0136793 A1 | 6/2006 | Wang et al. |
| 2007/0130240 A1 | 6/2007 | Janke et al. |
| 2007/0266067 A1 | 11/2007 | Matsui |
| 2008/0123408 A1 | 5/2008 | Honma et al. |
| 2009/0165086 A1 | 6/2009 | Trichina et al. |
| 2010/0036900 A1 | 2/2010 | Ross |
| 2010/0057820 A1 | 3/2010 | Matsumoto et al. |
| 2012/0137047 A1* | 5/2012 | Hars et al. ............... 711/103 |

FOREIGN PATENT DOCUMENTS

| | | |
|---|---|---|
| JP | 10-257303 A | 9/1998 |
| JP | 2000-209195 A | 7/2000 |
| JP | 2000 357213 | 12/2000 |
| JP | 2002-358086 A | 12/2002 |
| JP | 2004 326867 | 11/2004 |
| JP | 2007-234001 A | 9/2007 |
| JP | 2008 117471 | 5/2008 |
| JP | 2008 269473 | 11/2008 |
| JP | 2010 55205 | 3/2010 |
| KR | 10-2011-0010733 | 2/2011 |
| TW | 1270003 | 1/2007 |
| TW | 1270003 B | 1/2007 |
| TW | 1340367 B | 4/2011 |
| WO | 2010 017320 | 2/2010 |

OTHER PUBLICATIONS

U.S. Appl. No. 14/001,577, filed Aug. 26, 2013, Nagai et al.
U.S. Appl. No. 14/001,609, field Aug. 26, 2013, Nagai et al.
Office Action and Search Report issued on May 9, 2014 in the corresponding Taiwanese Patent Application No. 101106412 (with English Translation).
International Search Report Issued Jan. 14, 2013 in PCT/JP12/54497 Filed Feb. 17, 2012.
Office Action issued Aug. 5, 2014 in Japanese Patent Application No. 2011-125282 (with English language translation).
Office Action issued Nov. 27, 2014 in Korean Patent Application No. 10-2013-7022824 (with English translation).
Office Action issued Jan. 20, 2015 in Japanese Patent Application No. 2011-125282 filed Jun. 3, 2011 (with English Translation).

* cited by examiner

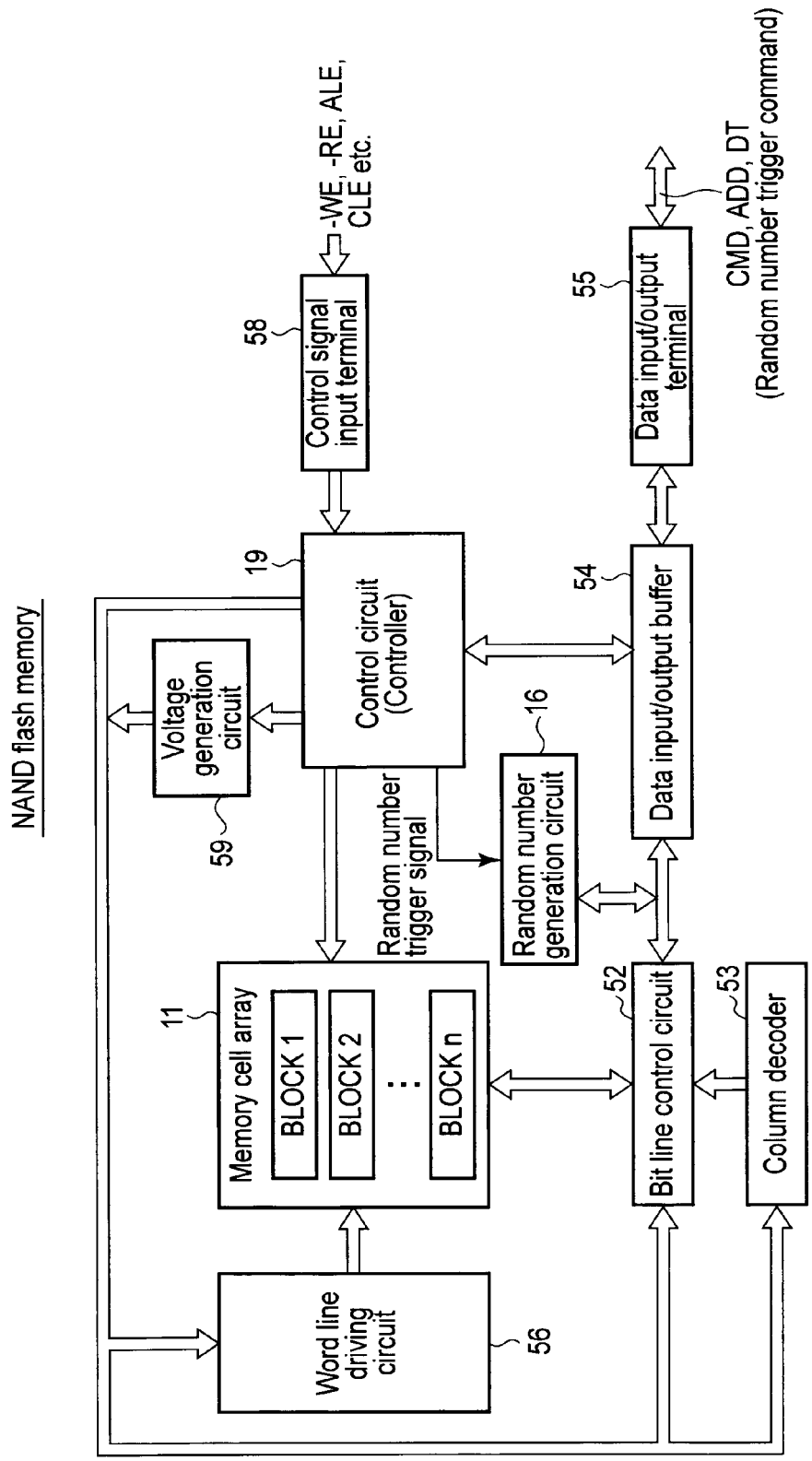
F I G. 1

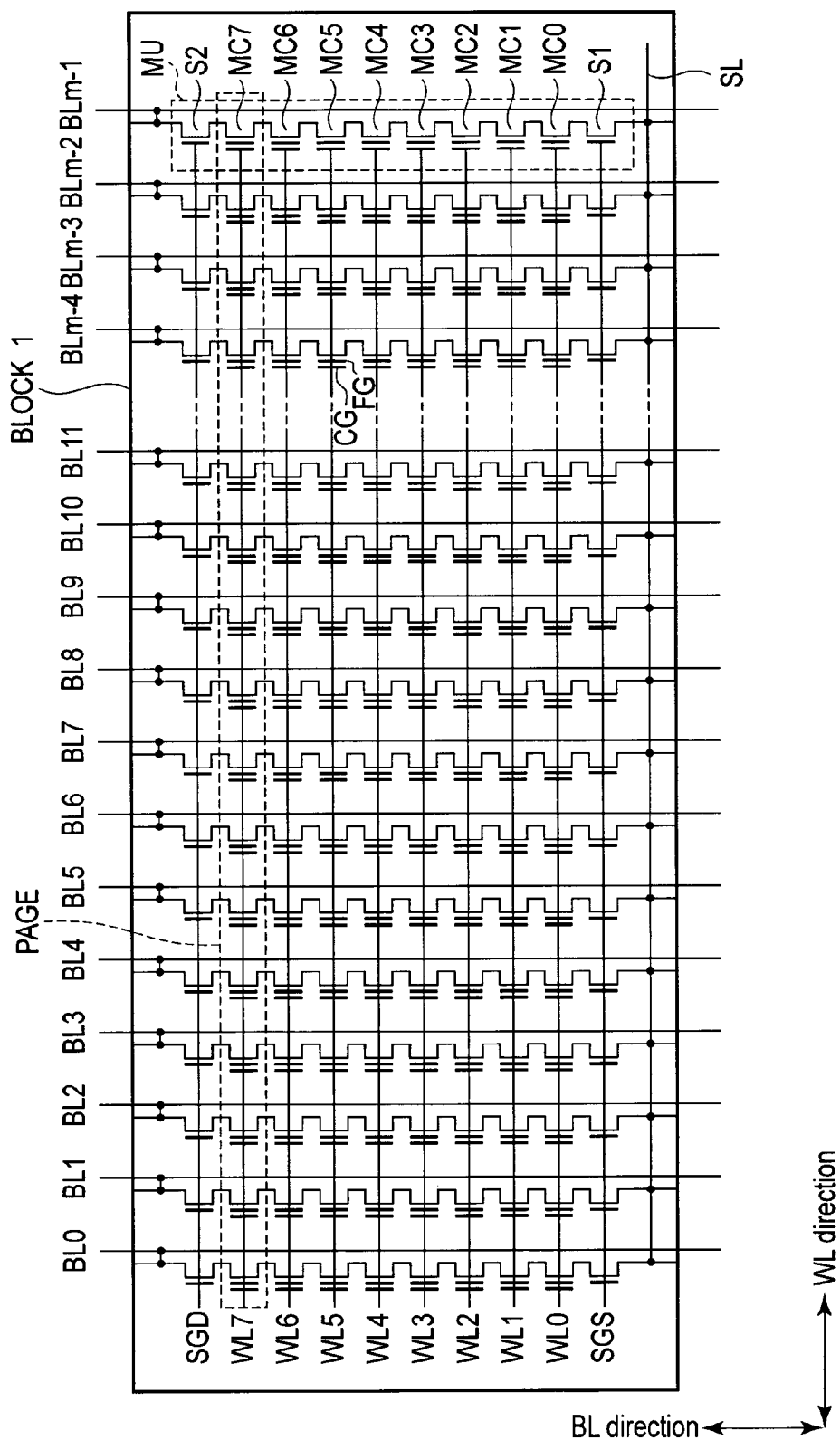
F I G. 2

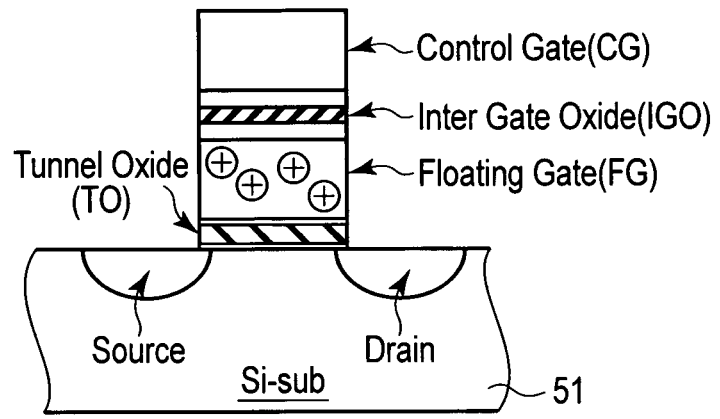
F I G. 3
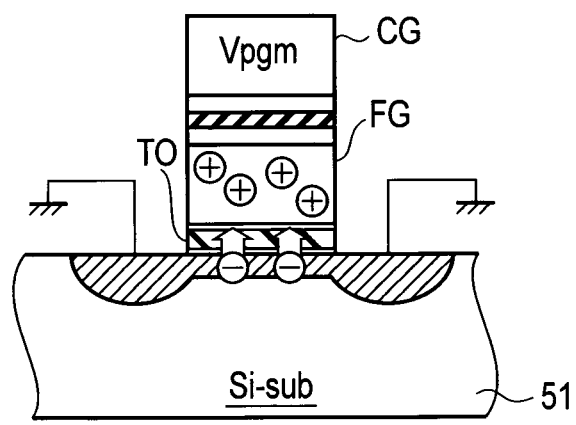
F I G. 4

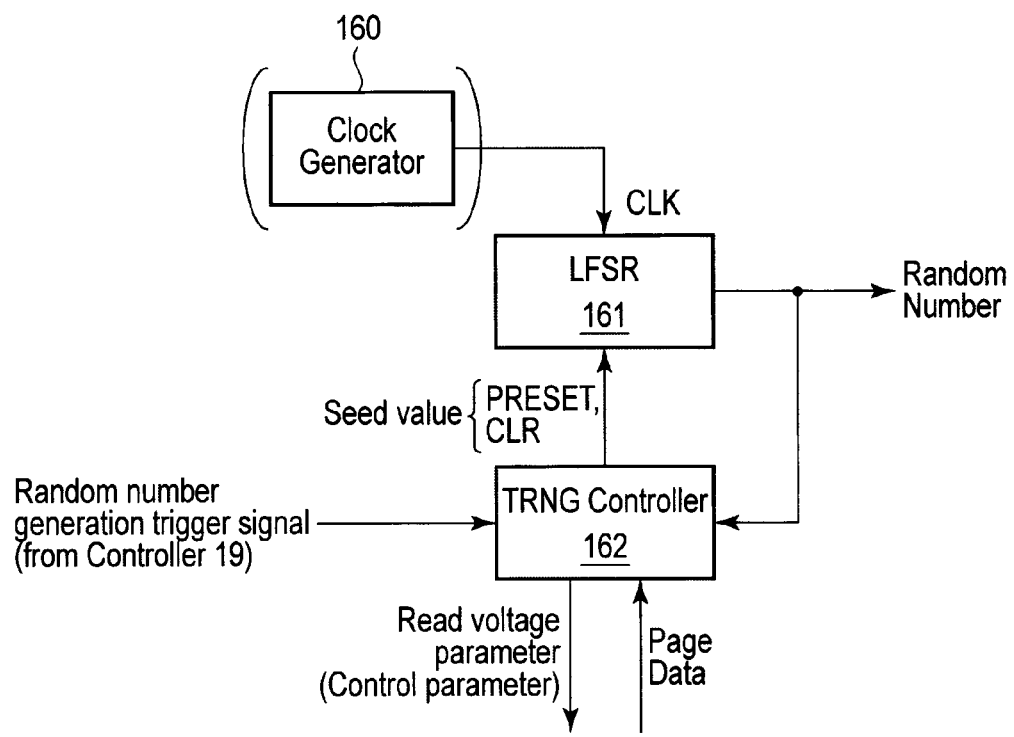
F I G. 11

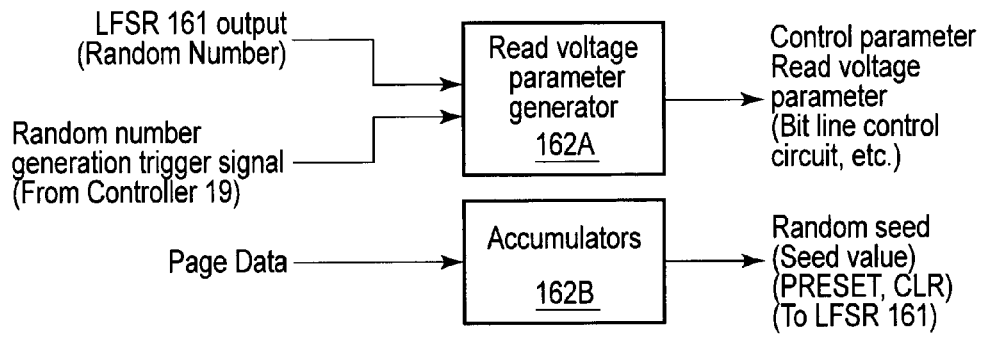
F I G. 13
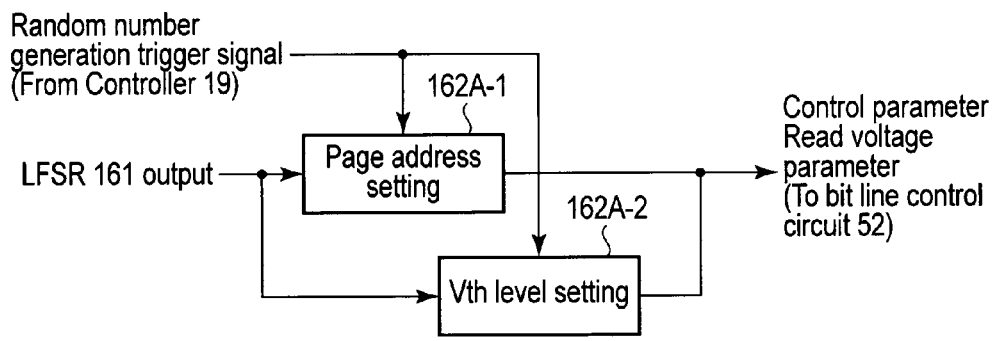
F I G. 14A

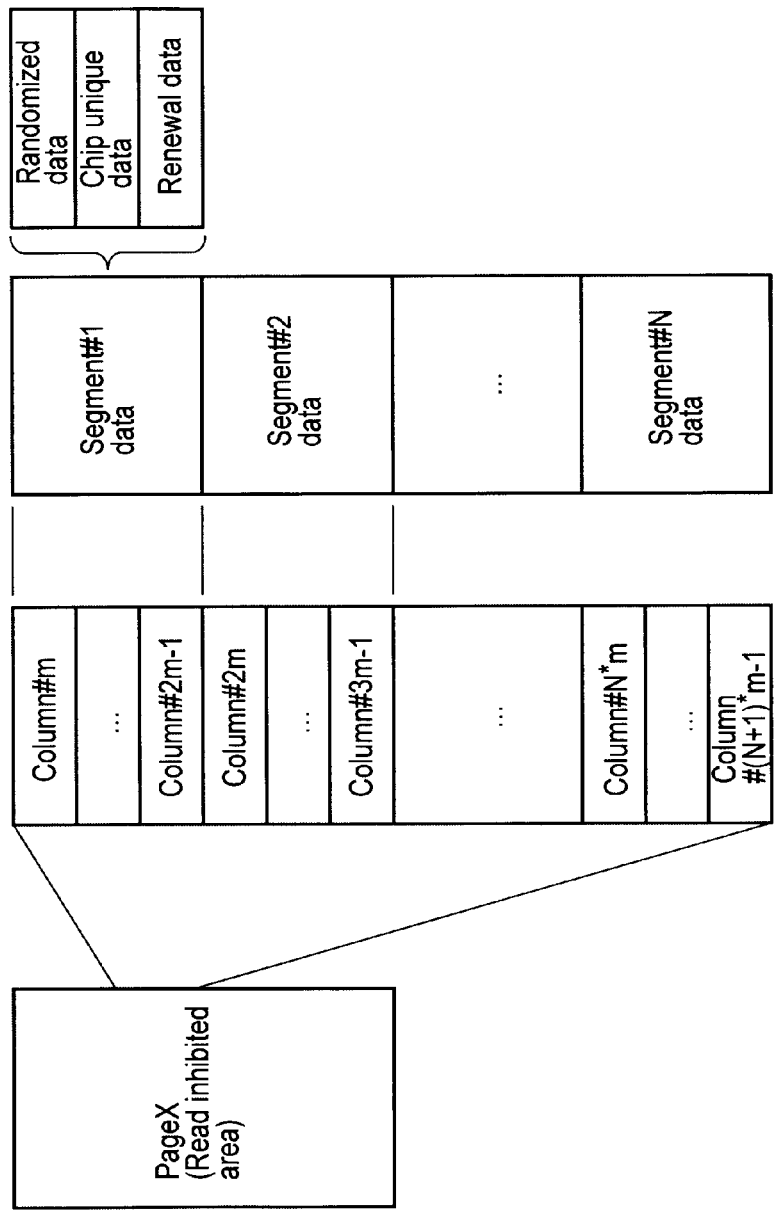
F I G. 14B

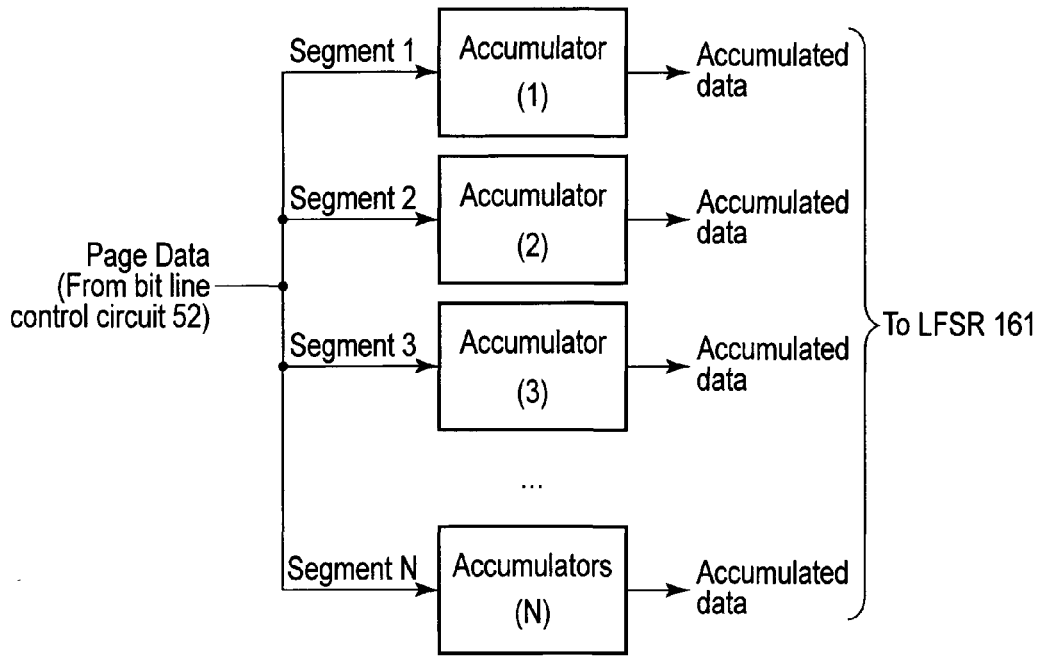
F I G. 15
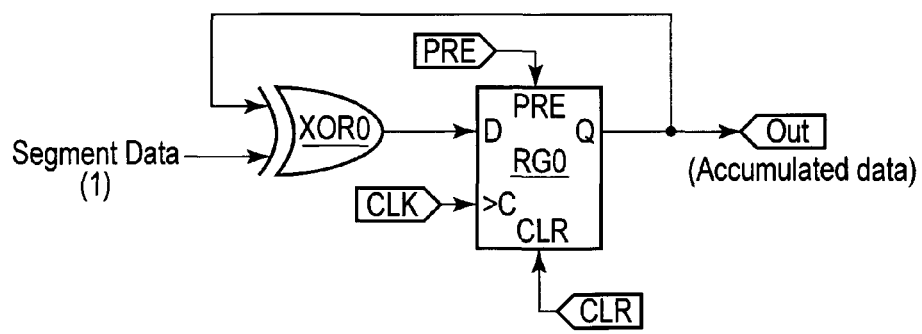
F I G. 16

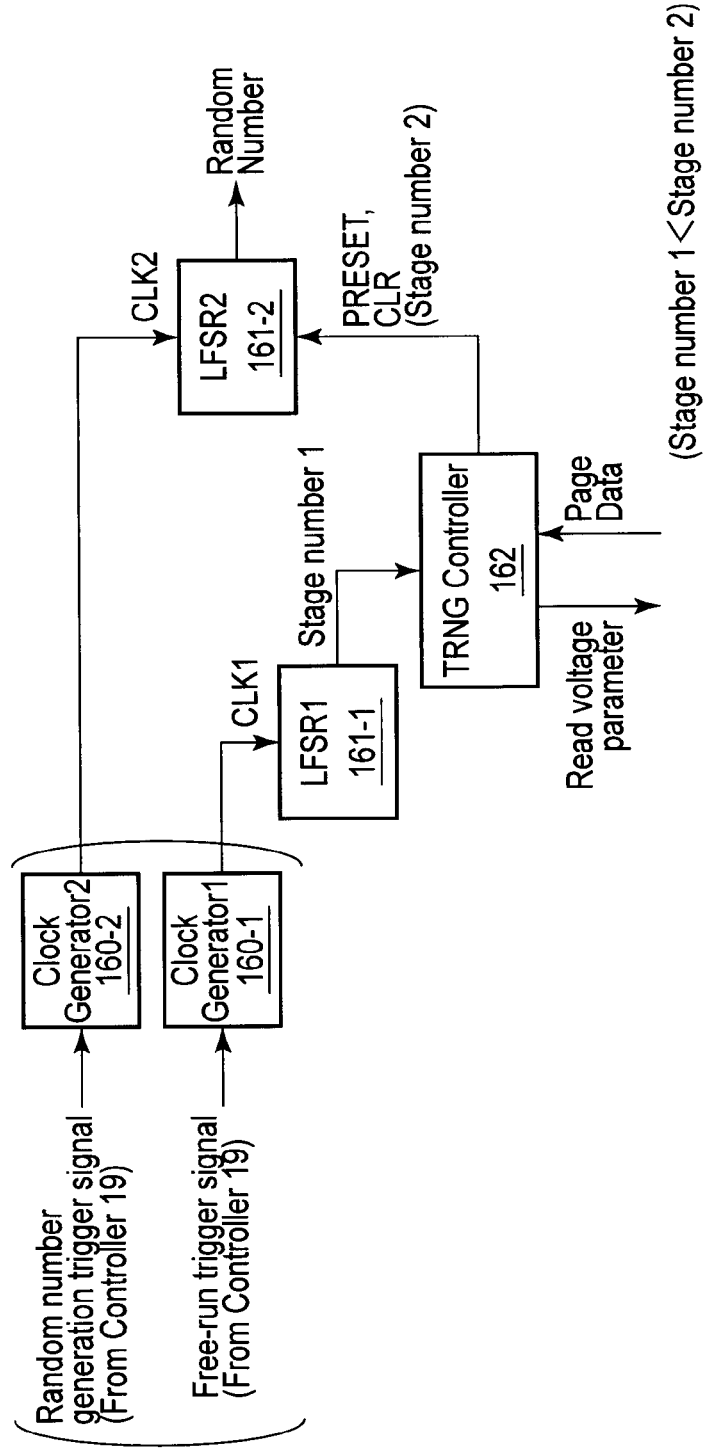
F I G. 21

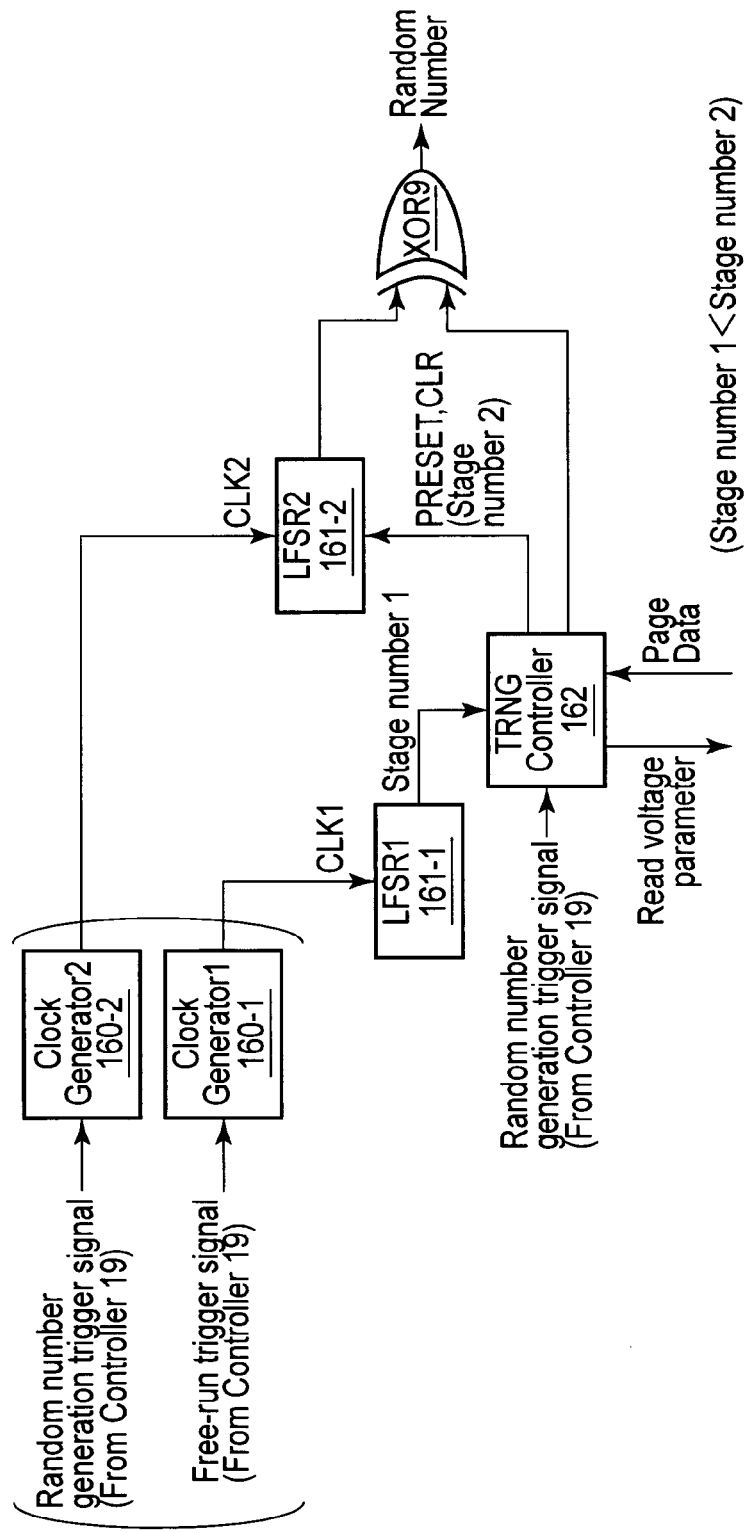
F I G. 22

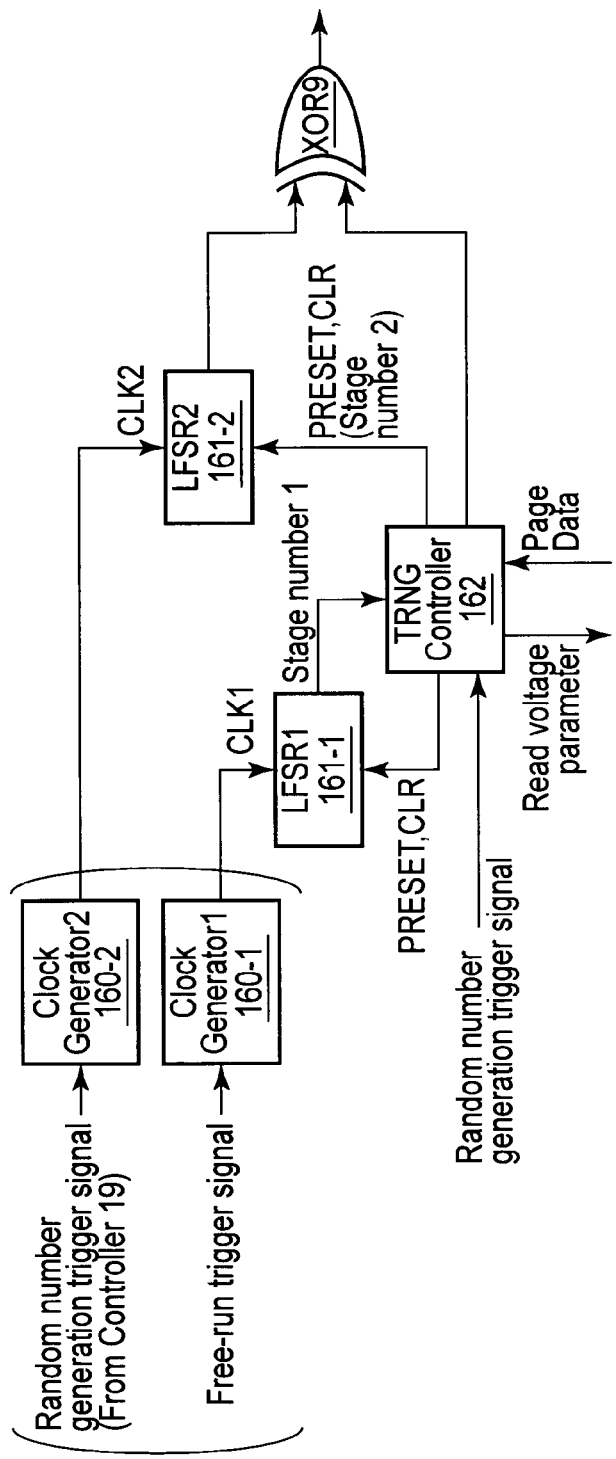
F I G. 23

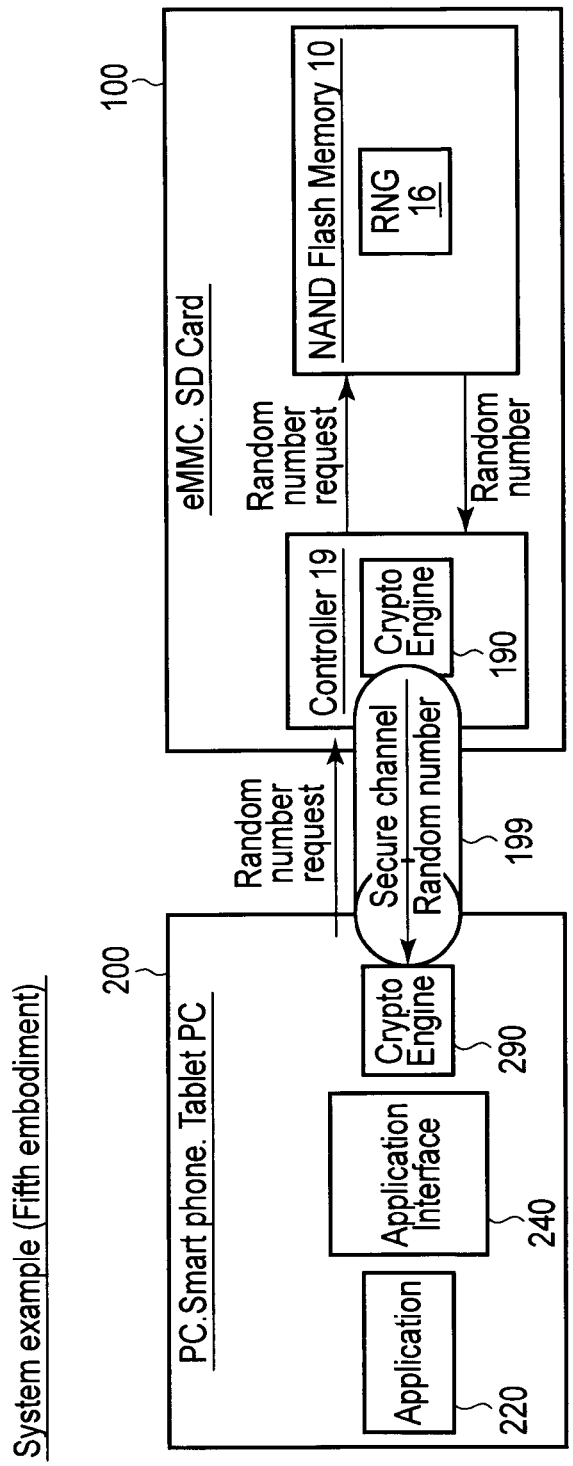
F I G. 24

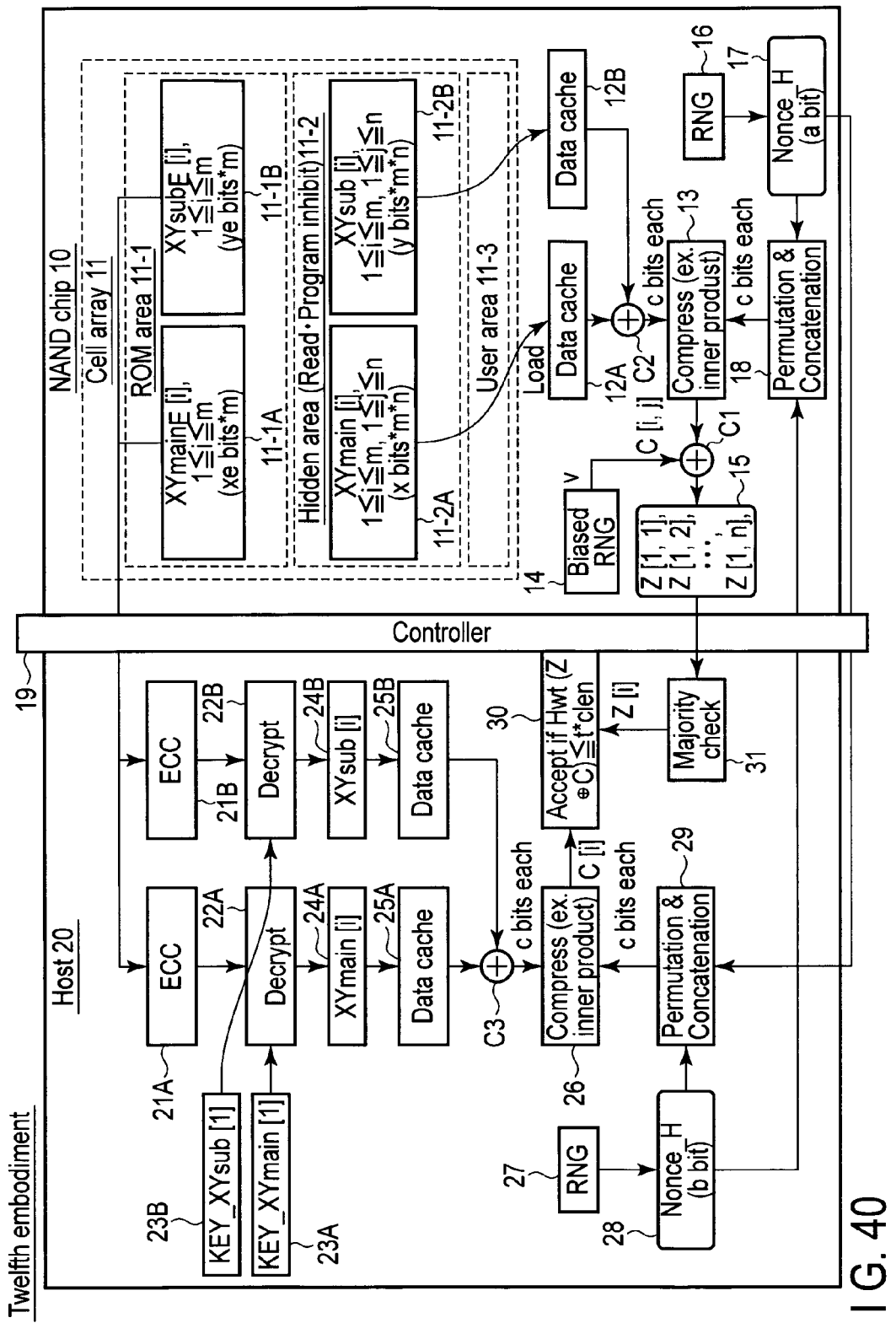
F I G. 40

13th embodiment (Media ID retvieval process)
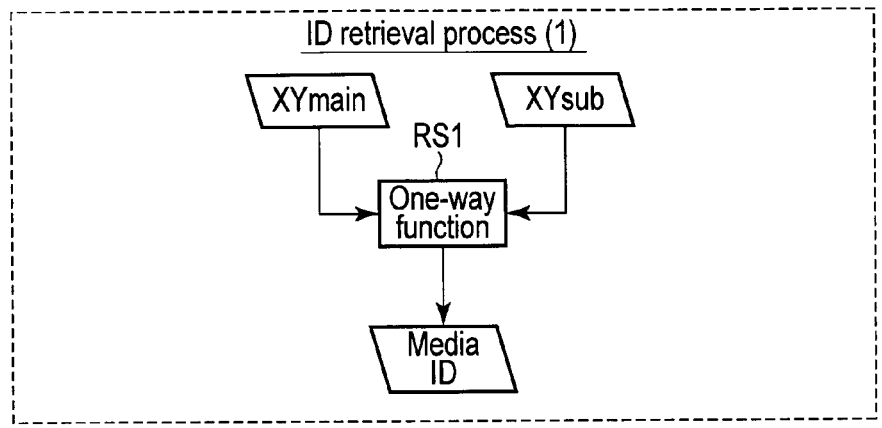
F I G. 42
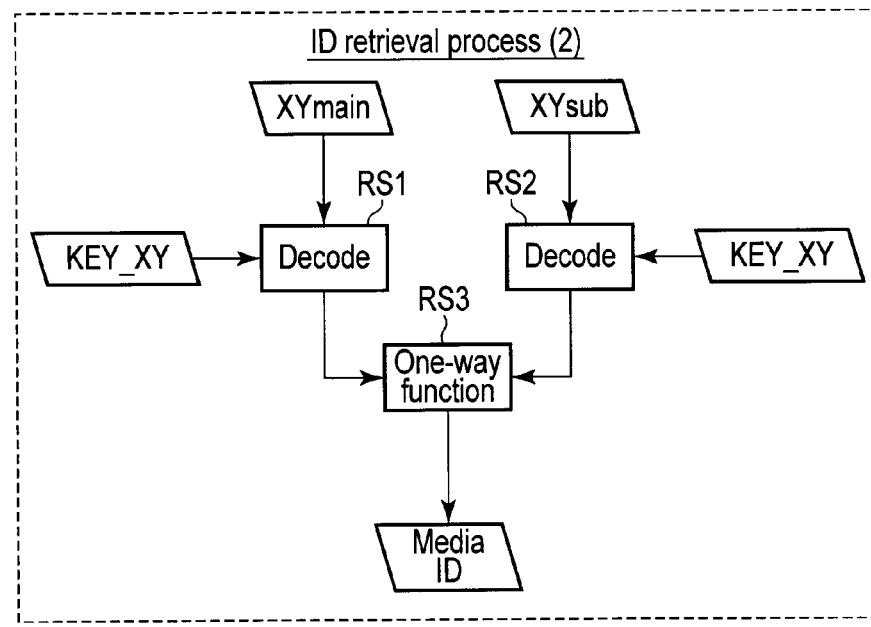
F I G. 43

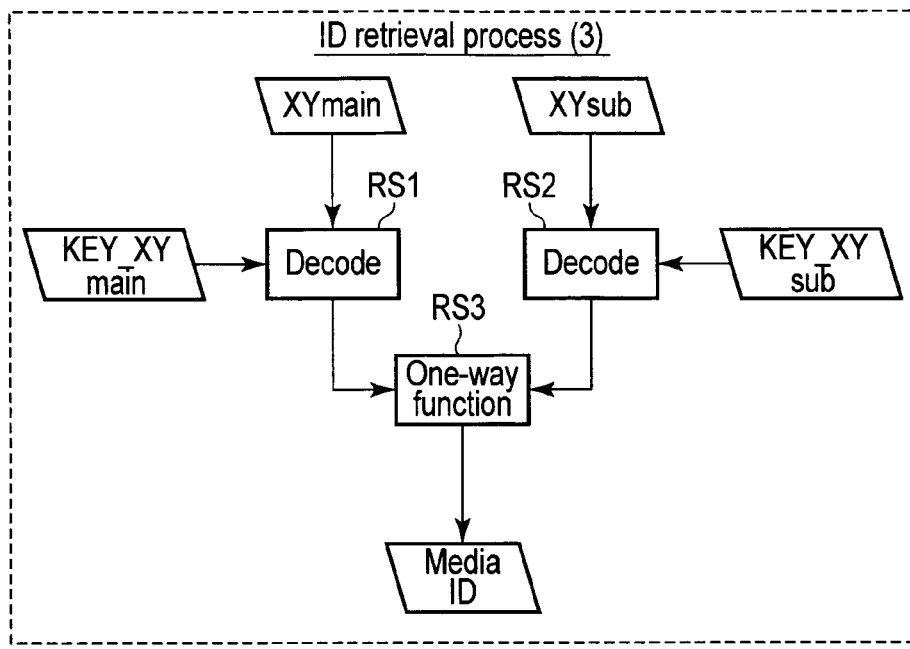
F I G. 44
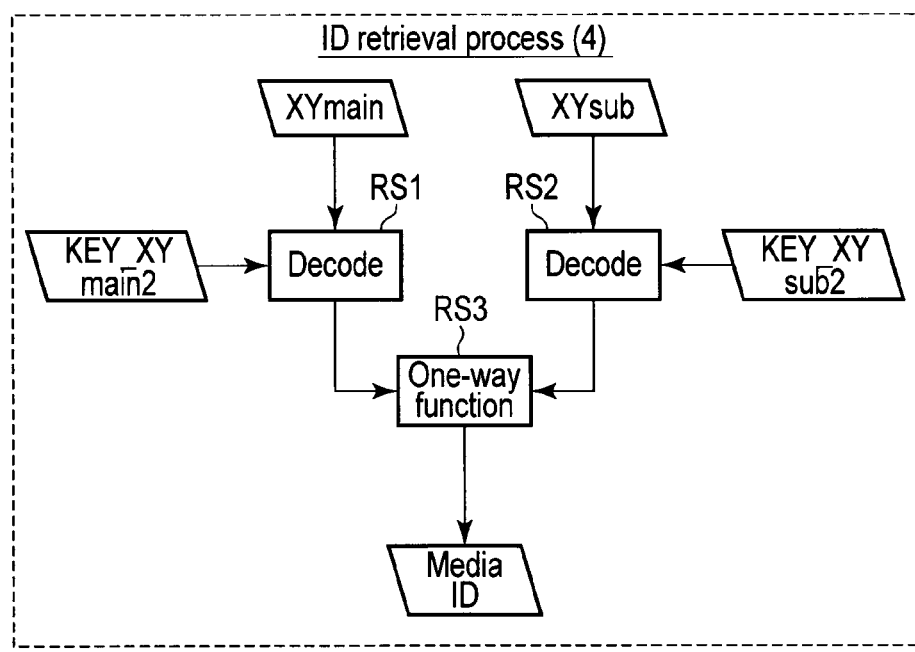
F I G. 45

14th embodiment (ID binding process)
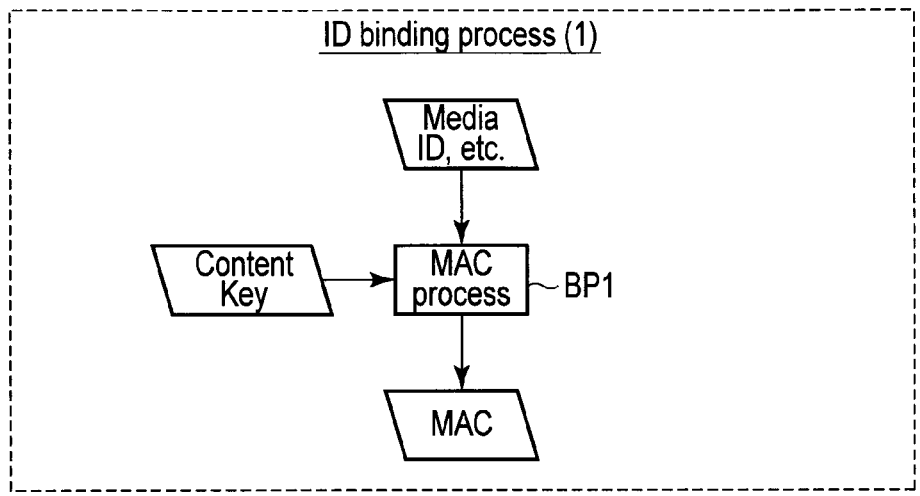
F I G. 46
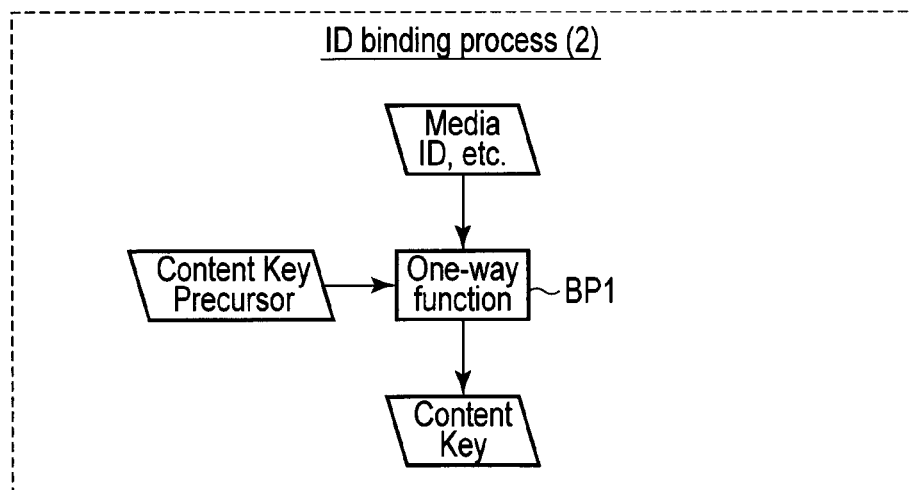
F I G. 47

SEMICONDUCTOR MEMORY DEVICE FOR PSEUDO-RANDOM NUMBER GENERATION

CROSS-REFERENCE TO RELATED APPLICATIONS

The present application is a U.S. national phase application under 35 U.S.C. §371 of International application PCT/JP2012/054497 (not published in English), filed Feb. 17, 2012, the entire contents of which are incorporated herein by reference.

This application is based upon and claims the benefit of priority from prior Japanese Patent Application No. 2011-125282, filed Jun. 3, 2011, the entire contents of which are incorporated herein by reference.

FIELD

Embodiments described herein relate generally to, for example, a semiconductor memory device.

BACKGROUND

In fields which require security, a random number generator is used in order to generate a secret key or challenge data in an authentication process between a plurality of parties.

In recent years, for example, in an environment of smartphones, tablet PCs, etc., there are strict restrictions to circuit scales and power consumption. In such an environment, there has been an increasing need for high-capability random numbers which are to be used in the use of commercial contents or in accounting/settlement.

On the other hand, in mobile devices which are exemplified by smartphones and tablet PCs, as mentioned above, NAND flash memories, for instance, are mainly used as nonvolatile memories.

BRIEF DESCRIPTION OF THE DRAWINGS

FIG. 1 is a block diagram showing an entire structure example of a semiconductor memory device according to a first embodiment;

FIG. 2 is an equivalent circuit diagram showing a block (BLOCK) in FIG. 1;

FIG. 3 is a cross-sectional view showing a memory cell in an erase state;

FIG. 4 is a cross-sectional view showing a memory cell at a time of injecting electrons;

FIG. 11 is a block diagram showing a random number generation circuit according to a first embodiment;

FIG. 13 is a block diagram showing a structure example of a random number control circuit in FIG. 11;

FIG. 14A is a block diagram showing a structure example of a control parameter generation circuit in FIG. 13;

FIG. 14B shows data which is recorded in a page which is set to be a read target by a page address setting circuit;

FIG. 15 is a block diagram showing a structure example of an accumulation circuit in FIG. 13;

FIG. 16 is a block diagram showing a structure example of the accumulation circuit in FIG. 15;

FIG. 21 is a block diagram showing a random number generation circuit according to a second embodiment;

FIG. 22 is a block diagram showing a random number generation circuit according to a third embodiment;

FIG. 23 is a block diagram showing a random number generation circuit according to a fourth embodiment;

FIG. 24 is a block diagram showing a system according to a fifth embodiment;

FIG. 40 is a block diagram showing a structure example according to a twelfth embodiment;

FIG. 42 is a block diagram illustrating an ID retrieval process (1) according to a 13th embodiment;

FIG. 43 is a block diagram illustrating an ID retrieval process (2) according to the 13th embodiment;

FIG. 44 is a block diagram illustrating an ID retrieval process (3) according to the 13th embodiment;

FIG. 45 is a block diagram illustrating an ID retrieval process (4) according to the 13th embodiment;

FIG. 46 is a block diagram illustrating an ID binding process (1) according to a 14th embodiment;

FIG. 47 is a block diagram illustrating an ID binding process (2) according to the 14th embodiment;

DETAILED DESCRIPTION

Figure 5:
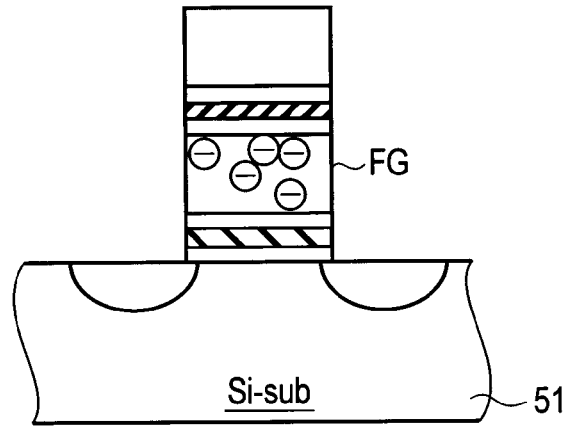
FIG. 5 is a cross-sectional view showing a memory cell in a programmed state.

In general, according to one embodiment, a semiconductor memory device includes a memory cell array in which a plurality of memory cells are disposed; a random number generation circuit configured to generate a random number; and a controller configured to control the memory cell array and the random number generation circuit. The random number generation circuit includes a random number control circuit configured to generate a random number parameter based on data which is read out from the memory cell by a generated control parameter; and a pseudo-random number generation circuit configured to generate the random number by using the random number parameter as a seed value.

[Re: Random Number Generator (Random Number Generation Circuit)]

Before describing embodiments, a description is first given of the outline of a random number generator (random number generation circuit).

As describe above, in fields which require security, a random number generator is used in order to generate a secret key or challenge data in an authentication process between a plurality of parties. In general terms, random number generators are classified into two types.

The first type is a random number generator which is called "deterministic random number generator (Deterministic RNG)" or "pseudo-random number generator Pseudo RNG)". This type of random number generator generates a random number by setting a predetermined initial value (seed). Examples of the deterministic random number generator include random number generators based on encryptors listed in FIPS 140-2 Annex C, and, as simplified generators, M-sequence generators which are composed of linear feedback shift registers (LFSR: Linear Feedback Shift Register). The deterministic random number generator may have a structure of software alone, a structure of hardware alone, or a structure of both.

The second type is a random number generator which is called "nondeterministic random number generator (Nondeterministic RNG)" or "physical random number generator (Physical RNG)". This random number generator is mainly composed of hardware. Examples of the nondeterministic include a random number generator composed of a circuit in which thermal noise (Johnson noise) of an electric circuit is amplified, and a random number generator composed of a high-speed oscillation circuit and a smoothing circuit.

Main capabilities, which are required for random numbers generated by the above random number generators, are the following three:

"Difficulty in prediction": The difficulty in prediction means that it is not possible to predict, from an observed random number, a random number of the next stage. For this purpose, for example, aperiodicity and irregularity are required.

"Uniformity": The uniformity means that the probability of occurrence of 0 and the probability of occurrence of 1 are statistically equal in random numbers which are output.

"Long periodicity": The long periodicity means that the period, in which an output random number is output once again, is sufficiently long.

The uniformity and the long periodicity can be realized by constructing the M-sequence generator, which has been mentioned as an example of the deterministic random number generator, with a proper number of register stages. On the other hand, as regards the difficult in prediction, in the M-sequence generator, since the structure of the M-sequence generator can easily be made clear from an observed random number sequence, the output random number can be predicted, and it is difficult to meet the required capability. Thus, when generators are used for content protection or for generation of a secret key of security for settlement, it is necessary to use the above-mentioned random number generator based on encryptors listed in FIPS 140-2 Annex C, or to construct a nondeterministic random number generator by a special method in an IC card, etc.

However, when the deterministic random number generator based on the encryptor is realized by hardware, a multiple-precision arithmetic circuit or a multistage nonlinear circuit is required, and a circuit scale of 10K to 100K gates, in usual cases, is necessary. On the other hand, even in the thermal noise amplification circuit that has been mentioned above as the example of the nondeterministic random number generator, the thermal noise is several-ten μm at most, and the thermal noise is amplified by four or five orders of magnitude, and furthermore a circuit for adjusting the balance between 0 and 1 is added. Thus, the circuit scale of the thermal noise amplification circuit becomes large. Besides, in the random number generator composed of a high-speed oscillation circuit and a smoothing circuit, there is a tendency that the periodicity that is inherent in the oscillation circuit remains in random numbers, and the consumption of current increases.

Thus, as described above, in the environment in which there are strict restrictions to circuit scales and power consumption, it is difficult to apply the above-mentioned random number generators.

In recent years, as described above, for example, in the environment of smartphones, tablet PCs, etc., in which the restrictions to circuit scales and power consumption are strict, there has been an increasing need for high-capability random numbers which are to be used in the use of commercial contents or in accounting/settlement.

On the other hand, in mobile devices which are exemplified by smartphones and tablet PCs, NAND flash memories, for instance, are mainly used as nonvolatile memories.

Therefore, there is a high utility value when the semiconductor memory device, such as a NAND flash memory, has a random number generation function.

In the embodiments which will be described below, NAND flash memories are taken as examples of the semiconductor memory device, and concrete examples, in which a random number generator is constructed in the semiconductor memory device, are proposed.

Various embodiments will be described hereinafter with reference to the accompanying drawings. In the description below, a NAND flash memory is described as an example of the semiconductor memory device, but the semiconductor memory device is not limited to the NAND flash memory. In the description, common parts are denoted by like reference numerals throughout the drawings.

[First Embodiment]

A semiconductor memory device according to a first embodiment is described with reference to FIG. 1 to FIG. 20.

1. Structure Example

1-1. Entire Structure Example

To begin with, referring to FIG. 1, a description is given of an entire structure example of the semiconductor memory device according to the first embodiment. As shown in FIG. 1, a NAND flash memory is illustrated by way of example.

The NAND flash memory of this embodiment includes a memory cell array 11, a random number generation circuit 16, a control circuit 19, a bit line control circuit 52, a column decoder 53, a data input/output buffer 54, a data input/output terminal 55, a word line driving circuit 56, a control signal input terminal 58, and a power generation circuit 59.

The memory cell array 11 is composed of a plurality of blocks (BLOCK 1 to BLOCK n). Each of the blocks (BLOCK 1 to BLOCK n) includes a plurality of memory cells which are arranged at intersections between word lines and bit lines. The details will be described later.

The random number generation circuit 16 generates, where necessary, a predetermined random number, in accordance with a random number trigger signal which is output from the control circuit 19 in response to a random number trigger command that is input from the outside. Under the control of the control circuit 19, the generated random number is used, for example, for the generation of a secret key or challenge data in an authentication process, or the generated random number is transmitted, where necessary, to an external host device via the data input/output terminal 55.

The random number generation circuit 16 according to the present embodiment includes, for example, a pseudo-random number generation circuit which generates a random number by setting a predetermined initial value (seed value). An example of the pseudo-random number generation circuit is a linear feedback shift register (LFSR: Linear Feedback Shift Register). The details will be described later.

The bit line control circuit 52 reads out data of a memory cell in the memory cell array 11 via a bit line, and detects the state of a memory cell in the memory cell array 11 via a bit line. In addition, the bit line control circuit 52 applies a write control voltage to a memory cell in the memory cell array 11 via a bit line, thereby writing data in the memory cell.

In the bit line control circuit 52, a data memory circuit, such as a page buffer (not shown), is provided, and this data memory circuit is selected by the column decoder 53. The data of the memory cell, which has been read out to the data memory circuit, is output to the outside from the data input/output terminal 55 via the data input/output buffer 54.

The data input/output terminal 55 is connected to, for example, an external host device. The data input/output terminal 55 has a bus width of, e.g. 8 bits or 16 bits. The NAND flash memory may support a high-speed interface standard such as a toggle mode interface. In the toggle mode interface, for example, data transfer is performed via the data input/output terminal 55, in sync with both the rising and falling edges of a data strobe signal (DQS).

The host device is, for example, a microcomputer, and receives data which is output from the data input/output terminal 55. The host device 20 outputs various commands CMD (write command, read command, erase command, status read command, random number trigger command, etc.) for controlling the operation of the NAND flash memory, addresses ADD, and data DT. The write data DT, which has been input to the data input/output terminal 55 from the host device, is supplied via the data input/output buffer 54 to the data memory circuit (not shown) which is selected by the column decoder 53. On the other hand, the commands CMD and addresses ADD are supplied to the control circuit 19.

The word line driving circuit 56, under the control of the control circuit 19, selects a word line in the memory cell array 11, and applies to the selected word line the voltage that is necessary for data read, write or erase.

The voltage generation circuit 59, under the control of the control circuit 19, supplies necessary voltages for the operations of the connected structural circuits shown in the Figure. For example, the voltage generation circuit 59 boosts an external voltage which is supplied from the host device, and generates a voltage which is applied to the word line at a time of data read, write or erase.

The control circuit (Controller) 19 delivers necessary control signals and control voltages to the respective connected circuits, thereby to control the operation of the entirety of the NAND flash memory 10. The control circuit 19 is connected to the memory cell array 11, random number generation circuit 16, bit line control circuit 52, column decoder 53, data input/output buffer 54, word line driving circuit 56 and voltage generation circuit 59. The connected structural circuits are controlled by the control circuit 19.

The control circuit 19 is connected to the control signal input terminal 58, and is controlled by a combination of control signals, such as a WE (write enable) signal, a RE (read enable) signal, an ALE (address latch enable) signal and a CLE (command latch enable) signal, which are input via the control signal input terminal 58 from the host device.

In terms of functions, the word line driving circuit 56, bit line control circuit 52, column decoder 53 and control circuit 19 constitute a data write circuit, a data read circuit and a data erase circuit. The host device detects whether the NAND flash memory is executing an internal operation, such as a write operation, a read operation or an erase operation, by monitoring an RY/BY (ready/busy) signal output terminal (not shown). The control circuit 19 outputs an RY/BY signal via the RY/BY signal output terminal.

1-2. Structure Example of Block (BLOCK)

Next, referring to FIG. 2, a structure example of the block (BLOCK), which constitutes the memory cell array relating to the first embodiment, is described. The block BLOCK 1 in FIG. 2 is described by way of example. In this example, since the memory cells in the block BLOCK 1 are erased batchwise, this block is a data erase unit.

The block BLOCK 1 comprises a plurality of memory cell units MU which are arranged in a word line direction (WL direction). The memory cell unit MU comprises a NAND string (memory cell string) which is arranged in a bit line direction (BL direction) crossing the WL direction and is composed of 8 memory cells MC0 to MC7 having current paths connected in series; a source-side select transistor S1 connected to one end of the current path of the NAND string; and a drain-side select transistor S2 connected to the other end of the current path the NAND string.

In the present embodiment, the memory cell unit MU comprises 8 memory cells MC0 to MC7. However, the number of memory cells is not limited to 8, and may be two or more, for example, 56 or 32.

The other end of the current path of the source-side select transistor S1 is connected to a source line SL. The other end of the current path of the drain-side select transistor S2 is connected to a bit line BLm-1 which is provided on an upper side of the memory cell unit MU in association with each memory cell unit MU and extends in the BL direction.

Word lines WL0 to WL7 extend in the WL direction, and are connected commonly to the control electrodes of the plural memory cells in the WL direction. A select gate line SGS extends in the WL direction, and is connected commonly to the plural select transistors S1 in the WL direction. Similarly, a select gate line SGD extends in the WL direction, and is connected commonly to the plural select transistors S2 in the WL direction.

A page (PAGE) is present in association with each of the word lines WL0 to WL7. For example, as indicated by a broken line in FIG. 2, a page 7 (PAGE 7) is present in association with the word line WL7. Since a data read operation and a data write operation, which will be described later, are executed in units of the page (PAGE), the page (PAGE) is a data read unit and a data write unit.

1-3. Re: Memory Cell MC

Next, referring to FIG. 3 to FIG. 6, a description is given of the cell structure of the memory cell MC, and the memory cell MC in the case where data write, etc. is executed.

FIG. 3 illustrates the memory cell MC in an erase state (Erase state). As shown in FIG. 3, the memory cell MC is configured such that a tunnel insulation film (Tunnel Oxide) TO, a floating gate (Floating Gate) FG, an inter-gate insulation film (Inter-gate Oxide) IGO and a control gate (Control Gate) CG are successively stacked on a semiconductor substrate (Si-sub) 51, and a source (Source) and a drain (Drain) are provided, spaced apart, in the semiconductor substrate 51 in a manner to sandwich the stacked structure.

In the memory cell MC in the erase state, no electron is injected in the floating gate FG, and the floating gate FG is positively charged.

FIG. 4 shows the memory cell MC at a time of injecting electrons into the floating gate (Inserting electron). As shown in FIG. 4, by applying a write voltage Vpgm to the control gate CG, electrons, which have tunneled through the tunnel insulation film TO via a source/drain channel, are injected into the floating gate FG. In the description below, an operation of injecting electrons into the floating gate FG is expressed as "data program" in some cases.

FIG. 5 shows the memory cell MC in a programmed state (Programmed state). As shown in FIG. 5, in the memory cell MC in the programmed state, electrons are injected in the floating gate FG, and the floating gate FG is negatively charged. Since electrons are sufficiently injected in the floating gate FG, the threshold voltage of the memory cell MC in the programmed state becomes higher than the threshold voltage of the memory cell MC in the erase state. The memory cell MC stores data by making use of this change in threshold voltage.

Figure 6:
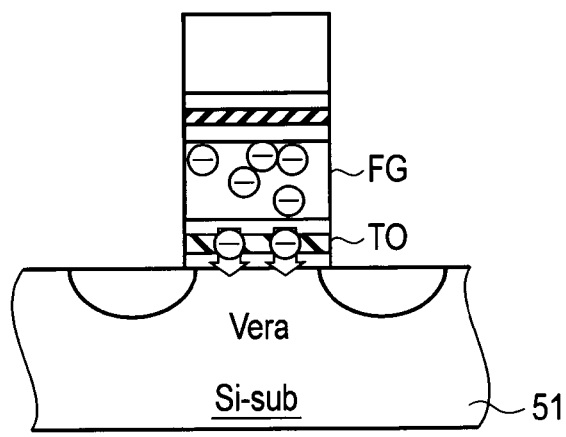
FIG. 6 is a cross-sectional view showing a memory cell at a time of releasing electrons.

FIG. 6 shows the memory cell MC at a time of releasing the electrons from the floating gate (Extracting electron). As shown in FIG. 6, by applying an erase voltage Vera to the semiconductor substrate 51, the electrons, which have been injected in the floating gate FG, are caused to tunnel through the tunnel insulation film TO and are released into the semiconductor substrate 51. In the description below, an operation of extracting electrons from the floating gate FG is expressed as "data erase" in some cases.

In the case of the present embodiment, data write and data read are executed in units of the above-described page (PAGE). In addition, data erase is executed in units of the above-described block (BLOCK).

1-4. Re: Threshold Voltage Distribution

Next, a threshold voltage distribution of the memory cell is described.

1-4-1. Threshold Distribution of Single-Level Memory Cell (SLC: Single Level Cell)

Figure 7:
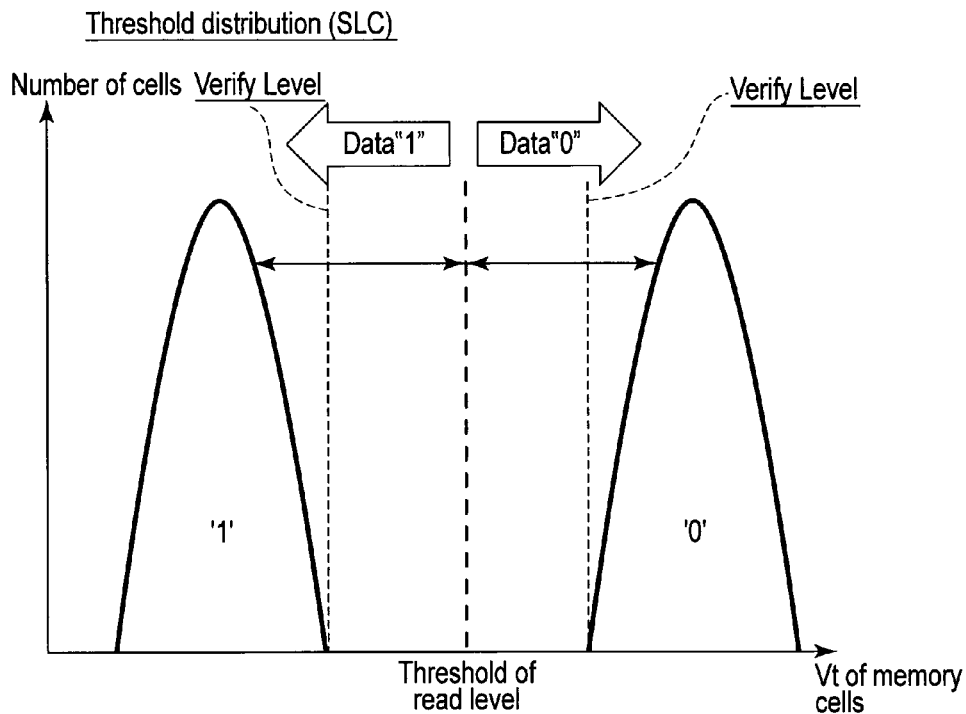
FIG. 7 shows a threshold distribution of a single-level memory cell.

To begin with, referring to FIG. 7, a threshold distribution of a single-level memory cell (SLC: Single Level Cell) is described.

In the threshold distribution (Vth distribution) of the single-level memory cell, a distribution of '1', '0', as illustrated in FIG. 7, is exhibited after data is recorded in the memory cell by the above-described operation. In this example, '1' is allocated to an erase state (Erase state), and '0' is allocated to a programmed state (Programmed state).

At a time of a data write operation and a data erase operation, after the application of a write voltage or an erase voltage, a verify (Verify) operation is executed to check the threshold voltage of each memory cell, and to execute once again the data write or to continuously control the data erase operation in the cell in which a target level has not been reached. Thus, a verify level (Verify level) for determining whether the verify operation has been completed is provided in the distributions of '1' and '0'.

In an example of control, in the data write operation, the control circuit (Controller) 19 combinationally increases the voltage that is applied to the control gate, increases the voltage application time, and increases the number of times of voltage application, thereby setting the threshold voltage of each memory cell to the target level. Also in the data erase operation, the control circuit (Controller) 19 combinationally increases the voltage that is applied to the p well (Pwell) in the semiconductor substrate 51, increases the voltage application time, and increases the number of times of voltage application, thereby setting the threshold voltage of each memory cell to the target level. In this manner, the programmed data has predetermined distribution widths of '1' and '0', as shown in FIG. 7.

In the data read, a read voltage (Threshold of read level) is set at a middle point between the '0' distribution and '1' distribution. Thereby, it is determined which data is held by each memory cell. Specifically, when the read voltage is applied to the control gate CG, '1' is determined if the memory cell MC is set in the ON state, and '0' is determined if the memory cell MC remains in the OFF state.

1-4-2. Re: Verify Operation

Figure 8:
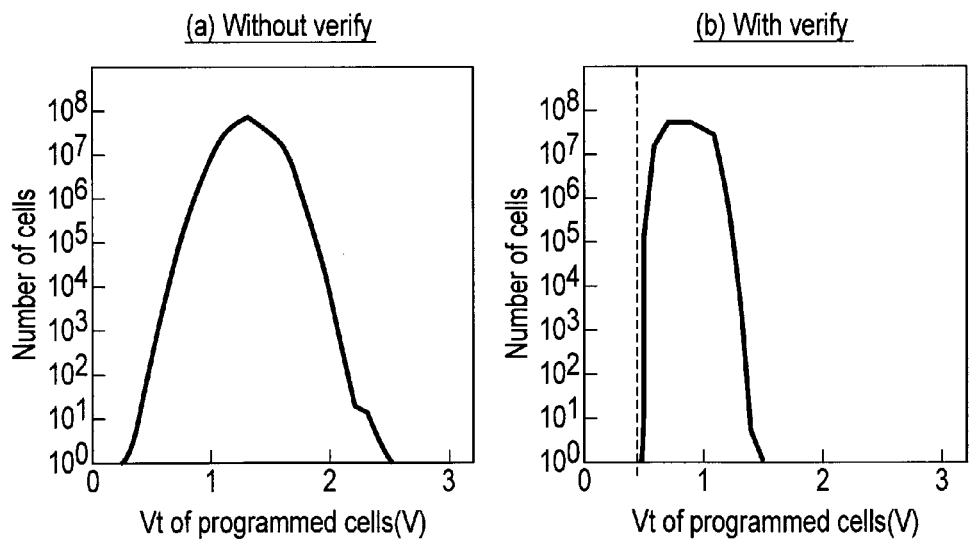
FIG. 8 shows threshold distributions with a verify operation and without a verify operation.

Next, referring to FIG. 8, threshold distributions before and after the verify operation are described.

Part (a) of FIG. 8 shows a threshold distribution in the case where the above-described verify operation is not executed (Without verify). Part (b) of FIG. 8 shows a threshold distribution in the case where the above-described verify operation is executed (With verify).

As shown in FIG. 8, the threshold distribution becomes narrower in the case where the verify operation has been executed, than in the case where the verify operation has not been executed. The reason for this is that the amount of electrons, which are injected by one-time application of write voltage, varies between memory cells, and there are a memory cell which is programmed earlier and a memory cell which is programmed later.

In part (a) of FIG. 8, since the verify operation is not executed, data program is continued even in, the memory cell in which electrons have been sufficiently injected, and, as a result, the threshold distribution spreads as a whole. On the other hand, in part (b) of FIG. 8, the threshold voltage of each memory cell is checked at each time of write voltage application. In the memory cell which has reached the verify level, subsequent electron injection is prohibited (suppressed). In the memory cell which has not reached the verify level, write voltage is applied once again, and electron injection is continued. As a result, the threshold distribution becomes narrower than in the case in which the verify operation is not executed.

1-4-3. Threshold Distribution of Multilevel Memory Cell (MLC: Multi Level Cell)

Figure 9:
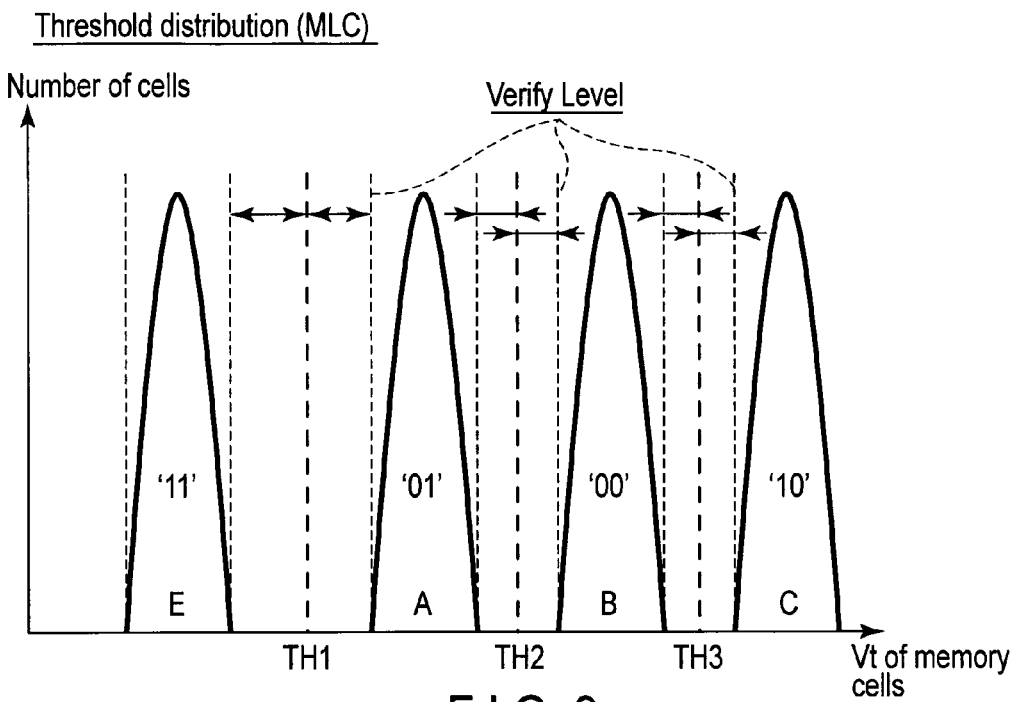
FIG. 9 shows a threshold distribution of a multilevel memory cell.

Next, referring to FIG. 9, a threshold distribution of a multilevel memory cell (MLC: Multi Level Cell) is described.

In the multilevel memory cell, the injection amount of electrons in the programmed state (Programmed state) is finely controlled. Thereby, for example, when two bits are stored in one memory cell, four threshold distributions are formed. When three bits are stored in one memory cell, eight threshold distributions are formed.

In this example, two-bit data is recorded in one memory cell in the threshold distribution (Vth distribution) of the multilevel memory cell. Thus, '11', '01', '00' and '10', as shown in FIG. 9, are allocated to four threshold distributions, in the order from the lower threshold voltage side. For the purpose of convenience, in some cases, the four threshold distributions are referred to as 'E' level, 'A' level, 'B' level and 'C' level in the order from the lower threshold voltage side.

Also in the case of the data write of the multilevel memory cell, like the case of data write of the single-level memory cell, the write operation is properly controlled in a manner to reach the target threshold voltage. In addition, a verify level (Verify level) is similarly provided in each of the '11', '01', '00' and '10' distributions.

At the time of data read in the multilevel memory cell, read voltages TH1, TH2 and TH3 are set at middle points between the respective distributions. Thereby, it is determined which data of '11', '01', '00' and '10' is stored in each memory cell.

In many cases, a bit which is distinguishable according to whether the bit is TH2 or more, that is, the MSB bit in the Figure, and a bit which is distinguishable according to whether the bit is TH1 or more and TH3 or less, that is, the LSB bit in the Figure, are assigned to different pages, and these pages are called, for example, "Lower page" and "Upper page". Specifically, one page is read, not by using TH1, TH2 and TH3 at the same time. When Lower page is read, TH2 is used, and when Upper page is read, TH1 and TH3 are used.

1-4-4. Threshold Distribution in Degradation Mode

Figure 10:
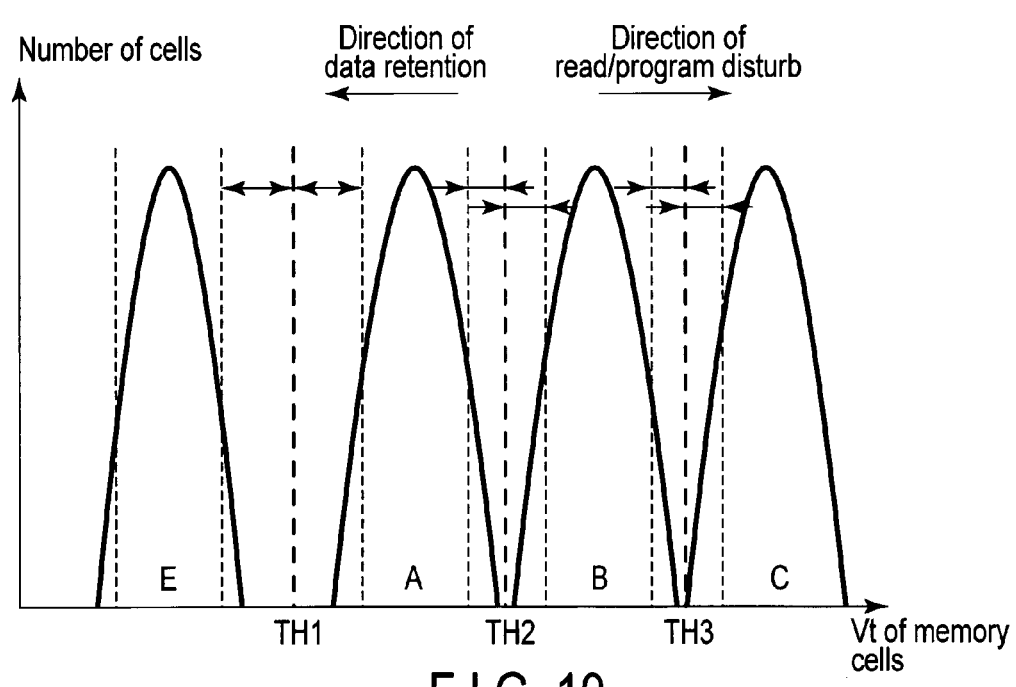
FIG. 10 shows a threshold distribution of a multilevel memory cell in a degradation mode.

To begin with, referring to FIG. 10, a threshold distribution in a degradation mode is described. In the description below, a degradation mode in the multilevel memory cell is described by way of example.

As described above, after data is programmed in the memory cell, if a data write operation is executed in the same memory cell or in a memory cell near this memory cell, a predetermined voltage, which is lower than the write voltage, is applied between the control gate CG of this cell and the p-well (Pwell) in the semiconductor substrate 51. Consequently, a weak programmed state is created, and the threshold voltage shifts to the higher voltage side (Direction of read/program disturb). This state is called "read disturb" or "program disturb". The width of the threshold distribution increases, and the read capability is degraded. Such disturb greatly varies depending on the condition of use of the NAND flash memory.

The influence of the program disturb upon the memory cell is disclosed in, for example, Jpn. Pat. Appln. KOKAI Publication No. 2008-117471 (based on which U.S. patent application Ser. No. 11/934,330, which was registered as U.S. Pat. No. 7,613,048, claims priority). The influence of the read disturb upon the memory cell is disclosed in, for example, Jpn. Pat. Appln. KOKAI Publication No. 2004-326867 (based on which U.S. patent application Ser. No. 10/822,177, which was registered as U.S. Pat. No. 7,099,190, claims priority). The contents of these documents are incorporated herein by reference.

On the other hand, if the memory cell is left for a predetermined period after data is programmed in the memory cell, the electrons retained in the floating gate FG are de-trapped, and the threshold voltage shifts to the lower voltage side (Direction of data retention). This state is called "data retention", and the width of the threshold distribution increases, leading to degradation in read capability. The data retention greatly varies depending on the period in which the memory cell is left, or the environment of temperature and humidity at the time when the memory cell is left. In addition, it is known that if the number of times of reprogram of the memory cell (e.g. the number of times of erase), the data retention becomes worse.

The data retention characteristics of the memory cell are disclosed in, for example, Jpn. Pat. Appln. KOKAI Publication No. 2008-269473 (based on which U.S. patent application Ser. No. 12/107,984 claims priority), and the contents of this document are incorporated herein by reference.

Besides, immediately after the data program, the electrons, which are trapped in the tunnel oxide film TO, are apparently indistinguishable from the electrons which are trapped in the floating gate FG. Thus, there occurs such a phenomenon that the threshold voltage varies according to whether such electrons are de-trapped or not. For example, in the case of the NAND flash memory as in the present embodiment, the density of integration has been increasing by the development of microfabrication processes. Thus, the amount of electrons, which can be retained in the floating gate FG, decreases, and the relative contribution ratio of electrons, which are trapped in the tunnel oxide film TO, increases, and thus the electrons trapped in the tunnel oxide film TO may become a large factor in the degradation mode.

As has been described above, the state of the threshold voltage distribution after data program varies due to various factors, such as the condition of use of the memory cell, the environment of the use of the memory cell, etc. In addition, in the environment at the time of reproduction, the threshold voltage distribution is not constant, depending on the environment of use, such as temperature. Moreover, since these characteristics greatly vary due to the variance of products at the time of manufacture, it is almost impossible to predict the state of each memory cell in each NAND flash memory.

Taking the above into account, in the present embodiment, this difficulty in prediction, which is physically inherent in the NAND flash memory, is used for the difficulty in prediction in the random number generation circuit 16. Thereby, the increase in circuit scale and power consumption can be minimized, and a high-capability random number can be generated. Concrete structures, etc. will be described later.

In the present embodiment, the NAND flash memory is described as an example of the semiconductor memory device. However, the semiconductor memory device in this embodiment is not limited to the NAND flash memory. The reason for this is that the phenomenon in which read-out data or the like varies also occurs in semiconductor memory devices such as a DRAM (Dynamic Random Access Memory) and an MRAM (Magnetic Random Access Memory), as well as in the NAND flash memory.

1-5. Re: Random Number Generation Circuit 16

Next, referring to FIG. 11, a description is given of a structure example of the random number generation circuit 16 according to the first embodiment.

As shown in FIG. 11, the random number generation circuit 16 according to the first embodiment includes a clock generation circuit 160, a linear feedback shift register 161 and a TRNG controller 162.

The clock generation circuit (Clock Generator) 160 supplies a predetermined clock CLK to the linear feedback shift register 161. The clock generator 160 is not necessarily disposed in the random number generation circuit 16, and a necessary clock CLK may be supplied from a component included in the NAND flash memory. Alternatively, a clock CLK, which is supplied from the outside of the NAND flash memory, may be used.

The linear feedback shift register (LFSR: Linear Feedback Shift Register) (pseudo-random number generation circuit) 161 starts an operation with a predetermined initial value by the supplied operation clock CLK, and generates a random number (Random Number) by signals PRESET and CLR which are input from the TRNG controller 162.

The TRNG controller (TRNG Controller) (random number control circuit) 162 receives a random number generation trigger signal which is supplied from the control circuit (Controller) 19, and starts a process. As the random number generation trigger signal which is supplied from the control circuit (Controller) 19, use may be made of a signal which is generated by using a request command (random number trigger command) relating to random number generation, which is input from a host device on the outside of the NAND flash memory. Alternatively, a new control signal input terminal may be added to the NAND flash memory, and a random number generation trigger signal may be generated in accordance with an input from the control signal input terminal.

The TRNG controller 162 receives the random number trigger signal, and then sets a read voltage setting parameter (Read voltage parameter) by using the random number which is input from the LFSR 161. The read voltage setting parameter (Read voltage parameter) is output to the control circuit (Controller) 19 via, e.g. the data input/output buffer 54 which is disposed on the outside of the random number generation circuit 16. Alternatively, the read voltage setting parameter (Read voltage parameter) may be directly output from the random number generation circuit 16 to the control circuit (Controller) 19.

Subsequently, the control circuit (Controller) 19 executes a data read operation on the memory cell array 11, according to the read voltage setting parameter (Read voltage parameter). Data (Page Data), on which the data read process has been executed, is successively input to the TRNG controller 162 via, e.g. a page buffer in the bit line control circuit 52.

Then, the TRNG controller 162 generates a PRESET value (seed value) which depends on the read-out data, and delivers the PRESET vale to the LFSR 161.

Subsequently, the LFSR 161 stores the received PRESET value in its own register, and generates a random number by making use of the PRESET value as a seed value.

By the above series of operations, even when the seed value, which is set at the time of the initial operation of the LFSR 161, is fixed, the time itself until the random number generation trigger signal is input makes contribution as a random number generation parameter. Further, since the read-out data varies due to the read voltage setting parameter (Read voltage parameter) which is determined by the random number that is output from the LFSR 161, the property of the random number can be improved by setting the read-out data as the seed value of the LFSR 161 once again.

In this case, if the random number generation trigger signal is always input after the passage of a fixed time from the start of the operation of the LFSR 161, the read voltage setting parameter (Read voltage parameter) becomes a fixed parameter. Even in this case, however, as described above, since the read-out data is not unique due to the degradation mode of the NAND flash memory or the environment dependency, it is highly expectable that the seed value also varies.

In the present structure example, the mode in which the LFSR 161 is used has been illustrated. However, according to the level of requirement, some other pseudo-random number generator can be used. For example, when a higher-level random number generation function is to be provided, it is possible to use the TRNG controller 162 as a physical random number seed, and to replace the LFSR 161 with a pseudo-random number generator based on AES (Advanced Encryption System) encryption as indicated in FIPS 140-2, or a random-number generator based on elliptic curve cryptograpy, or a pseudo-random number generator based on discrete logarithm cryptography. On the other hand, it can be said that the random number generation circuit 16 of the present embodiment is effective for a seed setting method which may become a weak point of the pseudo-random number generator.

Besides, by further repeating the above-described series of operations a plurality of times, the property of the random number can be further improved. Specifically, even in the case where the read voltage setting parameter (Read voltage parameter) that is output by the LFSR 161 is fixed and the property of the random number of the read-out data is low, if even 1 bit is different, the read voltage setting parameter (Read voltage parameter) that is used for the next-stage process is different, and therefore the property of the random number is improved.

1-5-1. Structure Example of Linear Feedback Shift Register (LFSR) 161

Figure 12:
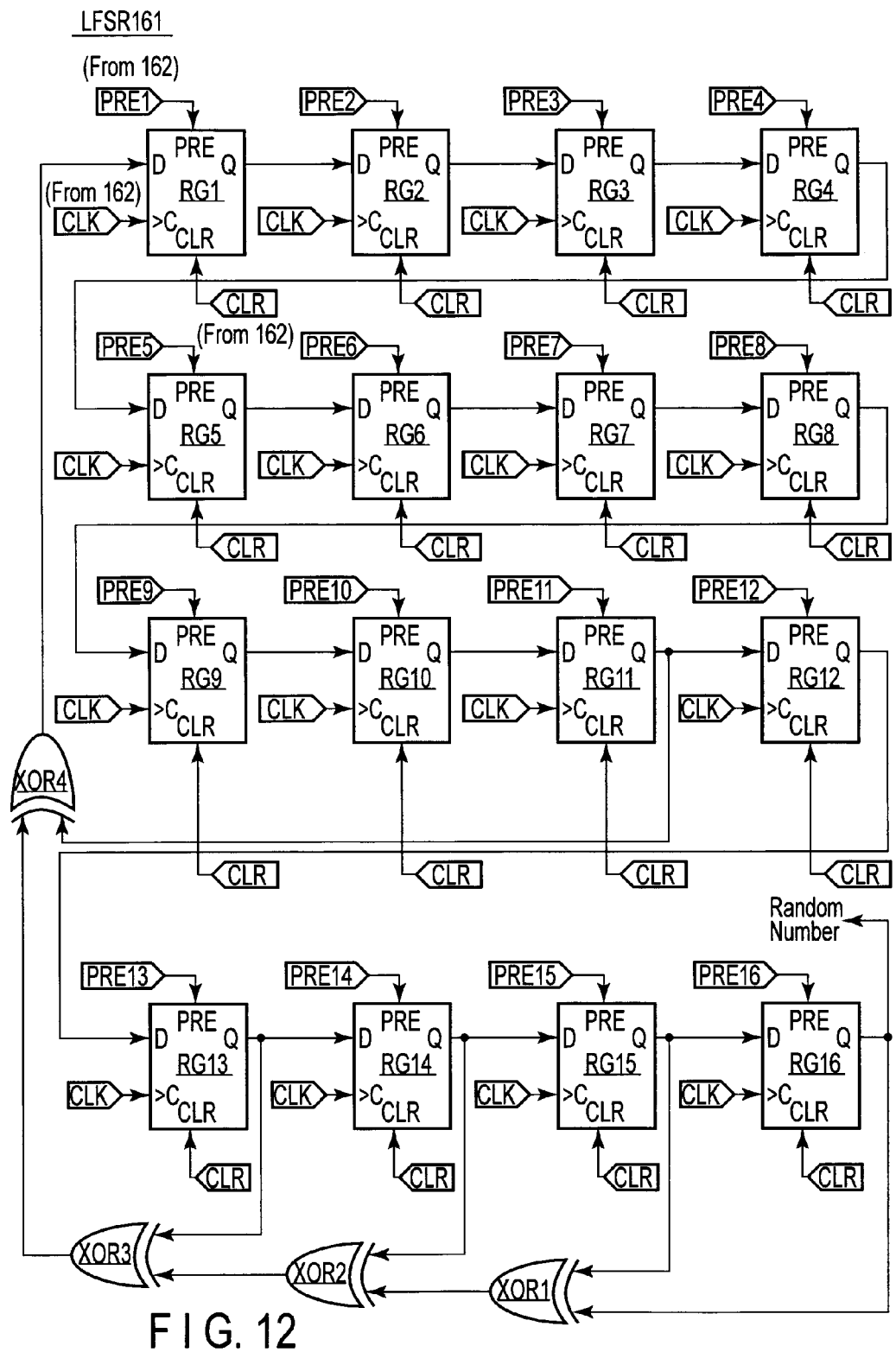
FIG. 12 is an equivalent circuit diagram showing a structure example of a pseudo-random number generation circuit in FIG. 11.

Next, referring to FIG. 12, a structure example of the linear feedback shift register (LFSR) 161 relating to the first embodiment is described.

As shown in FIG. 12, the linear feedback shift register (LFSR) 161 relating to the first embodiment includes a plurality of register circuits RG1 to RG16 and a plurality of exclusive-OR circuits XOR1 to XOR4.

A PRE terminal of each of the register circuits RG1 to RG16 receives, as a register setting signal reception portion, a PRESET signal from the TRNG controller 162. A CLR terminal of each of the register circuits RG1 to RG16 receives, as a register setting signal reception portion, a CLR signal from the TRNG controller 162. D terminals of the register circuits RG1 to RG16 receive, as data input portions, an output of XOR4 or an output of a preceding register circuit. A C terminal of each of the register circuits RG1 to RG16 receives, as a clock input portion, a clock CLK from the clock generator 160, and a Q terminal of each of the register circuits RG1 to RG16 outputs output data as a data output portion. The plural register circuits RG1 to RG16 are connected in series such that the output Q of the preceding state becomes the input D of the subsequent stage.

In the present embodiment, as will be described later, in order to illustrate an example of 16 bits, the output Q of the register circuit RG16 of the last stage is used as a random number (Random Number). In accordance with the necessary number of bits, the output Q of necessary register circuits RG1 to RG16 can be used.

The exclusive-OR circuits XOR1 to XOR4 have their inputs and outputs connected in series. The other input of the exclusive-OR circuit XOR4 is connected to the output Q of the register circuit RG11, and the output of the exclusive-OR circuit XOR4 is connected to the input D of the register circuit RG1. The other input of the exclusive-OR circuit XOR3 is connected to the output Q of the register circuit RG13, and the output of the exclusive-OR circuit XOR3 is connected to the input of the exclusive-OR circuit XOR4. The other input of the exclusive-OR circuit XOR2 is connected to the output Q of the register circuit RG14, and the output of the exclusive-OR circuit XOR2 is connected to the input of the exclusive-OR circuit XOR3. The inputs of the exclusive-OR circuit XOR1 are connected to the outputs Q of the register circuits RG15 and RG16, and the output of the exclusive-OR circuit XOR1 is connected to the input of the exclusive-OR circuit XOR2.

Like the register circuits RG1 to RG16, the exclusive-OR circuits XOR1 to XOR4 can be disposed, where necessary, in accordance with the necessary number of bits and the corresponding register circuits RG.

In the case of the use for the generation of the random number as in the present embodiment, the register circuits RG1 to RG16 and the exclusive-OR circuits XOR1 to XOR4 in the LFSR 161 are connected according to a polynomial expression having a maximum cyclic period. The random number sequence, which is output by the structure of this embodiment, is called, for example, "M-sequence".

1-5-2. Structure Example of TRNG Controller (TRNG Controller) 162

Next, referring to FIG. 13, a description is given of a structure example of the TRNG controller (TRNG Controller) 162 relating to the first embodiment.

As shown in FIG. 13, the TRNG controller (random number control circuit) 162 is composed of a read voltage setting parameter generation circuit (Read voltage parameter generator) 162A and an accumulation circuit (Accumulators) 162B.

The read voltage setting parameter generation circuit (Read voltage parameter generator) (parameter generation circuit) 162A latches the output (output) of the LFSR 161 by the random number generation trigger signal, and then develops the LFSR output into a parameter (to be described later), and outputs it as a read voltage setting parameter (Read voltage parameter).

The accumulation circuit (Accumulators) 162B receives read-out data (Page Data) from the memory cell array 11, and then executes an accumulation process and outputs a random seed value (Random seed) to the LFSR 161. This random seed value (Random seed) is output in the form of the above-described PRESET signal and CLR signal that are register setting parameters.

1-5-3. Structure Example of Parameter Generation Circuit (Read Voltage Parameter Generator) 162A Next, referring to FIG. 14A, a description is given of a structure example of the parameter generation circuit (Read voltage parameter generator) 162A in FIG. 13.

As shown in FIG. 14A, the parameter generation circuit 162A includes a page address setting circuit (Page address setting) 162A-1 and a read voltage setting circuit (Vth level setting) 162A-2.

The page address setting circuit (Page address setting) 162A-1 receives the random number generation trigger signal from the controller 19, and generates a control parameter of Page address that is read out, by using the output value of the LFSR 161. The reason for this is that when data recorded in respective Pages are different, the change of the data that serves as the base contributes to an improvement of the property of the random number.

Referring to FIG. 14B, a description is given of the data which is recorded in a page that is set to be a target of read-out by the page address setting circuit 162A-1. It is desirable that the data, which is recorded in the read-out target page, meet such conditions that this data is data which is randomized by a random number sequence, that this data includes data which is different between NAND flash memories, that data in the same page cannot be read out from the outside, and that this data is renewed at a predetermined timing.

As regards the condition that the data, which is recorded in the read-out target page, is the data which is randomized by a random number sequence, the read-out data is subjected to an accumulation process in units of a segment of a predetermined size, as will be described later. Thus, it is desirable that there be no deviation in the data in the segment. If there is deviation in the data in the segment, for example, if all data are "1" or "0", there may arise such a case that no variation occurs in the read-out data, depending on a set read voltage. It is desirable that the probability of occurrence of "1" and the probability of occurrence of "0" be equal as much as possible, or in other words, that the data be randomized by a random number sequence.

As regards the condition that the data, which is recorded in the read-out target page, includes data which is different between NAND flash memories (Chip unique data), when all data are common to all NAND flash memories, it is possible that a common tendency occurs in all chips with respect to the relationship between the read voltage and the read data. It is desirable that at least a part of the data is different.

As regards the condition that data in the same page cannot be read out from the outside (Read inhibited area), the difficulty of an attack greatly varies, depending on whether data in the read-out page is accessed by an attacker or not. For example, if the read voltage is acquired by the attacker by some method, the difficulty of predicting a bit having a possibility of flip, from the combination of the data recorded in the page and the read voltage, greatly varies depending on whether the attacker holds the data or not.

As regards the condition that the data, which is recorded in the read-out target page, is renewed at a predetermined timing (Renewal data), if at least a part of the recorded data is renewed, it is ensured that the read-out data is necessarily different, and the random seed value is necessarily renewed. It is thinkable that the timing of renewal is set at a time point after power-on of the NAND flash memory, a time point after a command relating to the random number generation is input to the NAND flash memory, or a time point after the generation of the random number. It is thinkable that the data renewal is executed by a method of providing a data field for renewal in a part of page data and adding data in this field, a method of recording a random number which is generated as data in this field, or a method of recording an exclusive logical sum between the data recorded as data in the field and the generated random number.

The read voltage setting circuit (Vth level setting) 162A-2 receives the random number generation trigger signal from the controller 19, and generates, with use of the output value of the LFSR 161, a control parameter of read voltage at a time of reading a page from the cell array.

Both parameters, which are generated by the circuits 162A-1 and 162A-2, are output as a read voltage setting parameter (Read voltage parameter) signal. The reason for this is that the necessary parameter, which is output from the read voltage setting circuit (Vth level setting) 162A-2, differs according to whether the page that is read out is the above-described Lower page or Upper page of the multilevel memory cell.

1-5-4. Structure Example of Accumulation Circuit (Accumulators) 162B

Next, referring to FIG. 15, a description is given of a structure example of the accumulation circuit (Accumulators) 162B in the TRNG controller 162 in FIG. 13.

As shown in FIG. 15, the accumulation circuit (Accumulators) 162B includes a plurality of accumulation circuits (Accumulator) (1) to (N), and calculates seed setting values (Accumulated data) to the LFSR 162 from the read-out page data (Page data).

The page data (Page data), which is read out from the memory cell array 11 and is input to the accumulation circuits (Accumulator) (1) to (N), is divided in units of a predetermined data length, and is subjected to an accumulation process. Each divided data is referred to as "segment" (Segment 1-N). The accumulation circuits (Accumulator) (1) to (N) execute bit addition of the segments. In the bit addition, an exclusive logical sum is used. Specifically, in the bits in the segment, if the number of 1's is odd, "1" is output. If the number of 1's is even, "0" is output.

The number of accumulation circuits (Accumulator) (1) to (N) may be determined according to necessity. For example, in the present embodiment, it should suffice if output bits to the LFSR 161 are 16 bits. Thus, the number of accumulators is 16 (N=16).

By the structure of the accumulation circuit (Accumulators) 162B relating to this embodiment, the accumulation process is executed. Even if almost all read-out data are the same as the previous read-out data, if there is even one bit that is different, the accumulated result is different. Thus, there is an effect of increasing information entropy, contributing to the improvement of the property of the random number.

The accumulated data, which has been calculated with respect to each segment (Segment 1-N), is used for the seed setting value of the LFSR 161.

Although the present embodiment is directed to the case in which a plurality of accumulation circuits are provided, the same applies to the case of the structure in which reset is executed for each segment boundary by using a single accumulator.

In addition, the accumulator can be constructed by using a feedback register which is composed of a single register circuit and a single exclusive-OR circuit, as will be described below.

1-5-4. Structure Example of Accumulation Circuit (Accumulator) (1)

Next, referring to FIG. 16, a description is given of a structure example of the accumulation circuit (Accumulator) in FIG. 15. The accumulation circuit (Accumulator) (1) is described by way of example.

As shown in FIG. 16, the accumulation circuit (Accumulator) (1) of this example is composed of an exclusive-OR circuit XOR0 and a register circuit RG0.

Segment data (Segment Data (1)) and an output Q of the register circuit RG0 are input to the inputs of the exclusive-OR circuit XOR0. The output of the exclusive-OR circuit XOR0 is connected to an input D of the register circuit RG0.

A clock CLK, a precharge signal PRE and a clear signal CLR are input to the register circuit RG0, and an accumulated signal (Accumulated data) is output from the output terminal Q.

As described above, the accumulation circuit (Accumulator) relating to this embodiment can be constructed by only the feedback register which is composed of a single register circuit and a single exclusive-OR circuit. The same applies to the other accumulation circuits (Accumulator) (2) to (N).

<2. Data Read Operation by Control Parameter (Read Voltage Parameter)>

Next, referring to FIG. 17 to FIG. 20, a description is given of a data read operation by a read voltage setting parameter (Read voltage parameter) which is set by the above structure example.

2-1. Data Read in Multilevel Memory Cell ('A', 'B', 'C')

Figure 17:
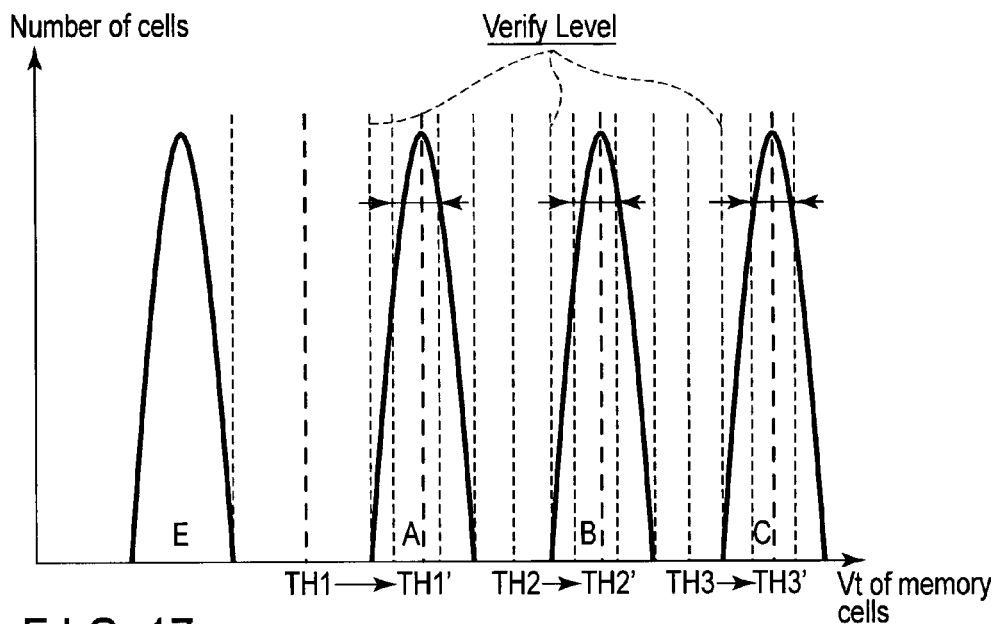
FIG. 17 illustrates data read by a control parameter.

To begin with, referring to FIG. 17, a description is given of data read by the read voltage setting parameter in the multilevel memory cell. As shown in FIG. 17, in this case, read voltage TH1'/TH2'/TH3' is set at a center reference of threshold voltage distribution 'A', 'B', 'C'.

The read voltage setting parameter (Read voltage parameter), which is designated by the TRNG controller (TRNG Controller) 162, is used as a read voltage at a time of reading a predetermined page of the memory cell array 11, by the control of the control circuit 19.

In normal data read, a data read reference (read voltage) is set at a target of a middle level between respective threshold voltage distributions, like TH1/TH2/TH3 shown in FIG. 17.

However, according to the read voltage setting parameter (Read voltage parameter) relating to this example, center points of 'A', 'B' and 'C' of the respective threshold voltage distributions, namely, TH1'/TH2'/TH3' shown in FIG. 17, are set as data read references. In this manner, by setting the data read reference at the center of each threshold voltage distribution 'A', 'B', 'C', the flip number of a detection bit can be maximized even in the case of a minute variation of the threshold voltage level.

To be more specific, the center point of each threshold voltage distribution 'A', 'B', 'C', is set as a reference, and a range with a predetermined width is set to be the set range of the read voltage TH1'/TH2'/TH3'. In this set range, based on the random number that is output from the LFSR 161, the TRNG controller 162 selects the read voltage setting parameter (Read voltage parameter). The details will be described later.

2-2. Data Read in Multilevel Memory Cell ('E', 'A', 'B')

Figure 18:
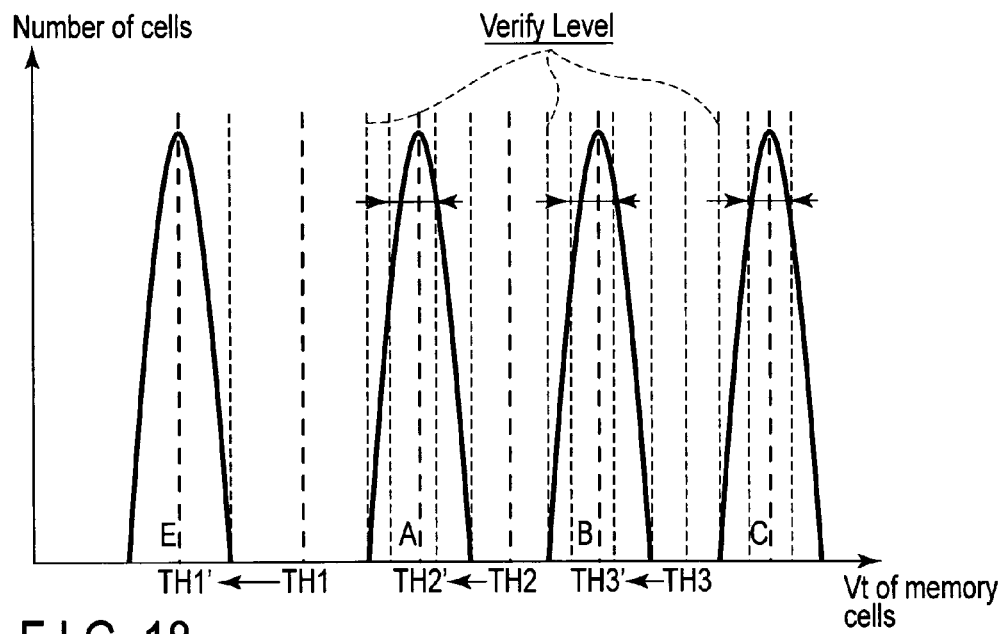
FIG. 18 illustrates data read by a control parameter.

Next, referring to FIG. 18, a description is given of data read by the control parameter in the multilevel memory cell.

The example illustrated is different from the example shown in FIG. 17 in that the center level of the threshold voltage distribution 'E', 'A', 'B', is set as the target of the read voltage TH1'/TH2'/TH3'. This setting can be used, where necessary.

2-3. Relationship Between Read Voltage Setting Parameter (Read Voltage Parameter) and Threshold Voltage (MLC)

Figure 19:
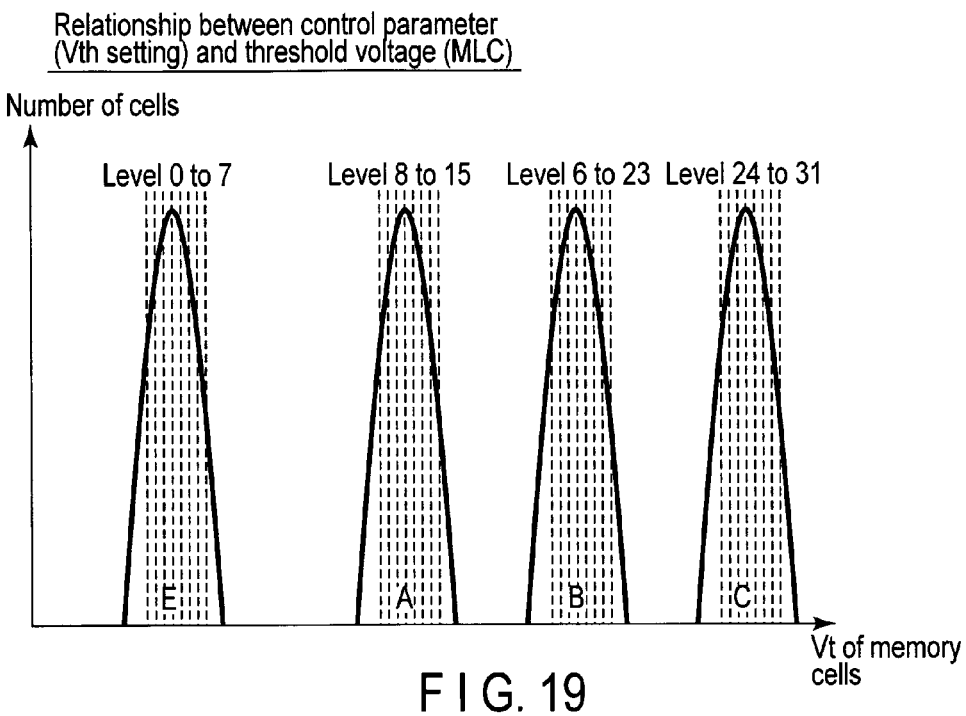
FIG. 19 shows a relationship between a control parameter and a threshold distribution (MLC)

Next, referring to FIG. 19, with respect to the relationship between the read voltage setting parameter (Read voltage parameter) and the threshold voltage in the multilevel memory cells (MLC) described in the above sections 2-1 and 2-2, a concrete parameter setting method covering both examples is described.

FIG. 19 illustrates an example of the relationship between the read voltage setting parameter (Read voltage parameter), which is output by the parameter setting circuit (Vth parameter setting) 162A-2, and the threshold voltages in the multilevel mode.

As shown in FIG. 19, in the present example, a level is selected from among level 0 to level 31 in total by the read voltage setting parameter (Read voltage parameter) with respect to the threshold voltage distributions 'E', 'A', 'B' and 'C'.

For example, in the threshold voltage distribution 'E', a set range of a predetermined width is provided with reference to the center point of the threshold voltage distribution 'E', and this range is divided at predetermined intervals from level 0 to level 7. In the threshold voltage distribution 'A', a set range of a predetermined width is provided with reference to the center point of the threshold voltage distribution 'A', and this range is divided at predetermined intervals from level 8 to level 15. In the threshold voltage distribution 'B', a set range of a predetermined width is provided with reference to the center point of the threshold voltage distribution 'B', and this range is divided at predetermined intervals from level 16 to level 23. In the threshold voltage distribution 'C', a set range of a predetermined width is provided with reference to the center point of the threshold voltage distribution 'C', and this range is divided at predetermined intervals from level 24 to level 31.

2-4. Relationship Between Read Voltage Setting Parameter (Read Voltage Parameter) and Threshold Voltage (SLC)

Figure 20:
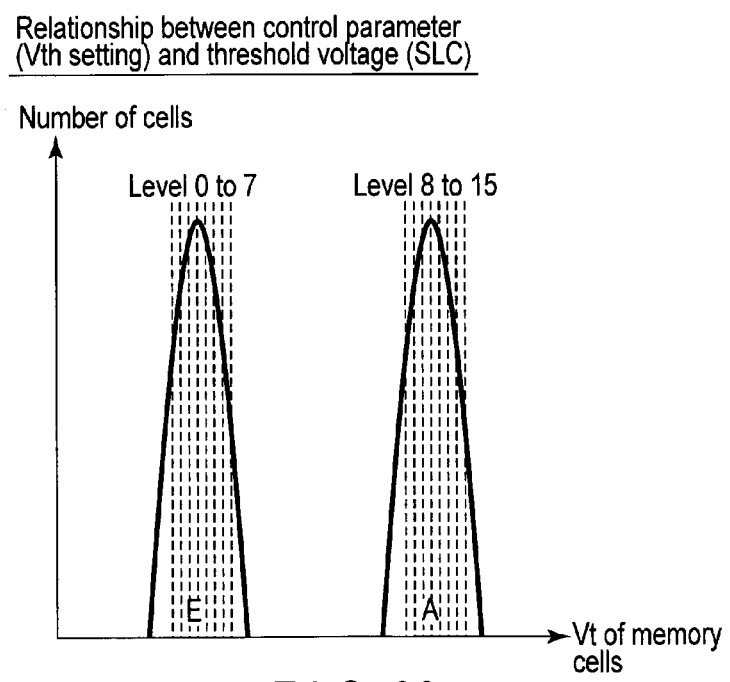
FIG. 20 shows a relationship between a control parameter and a threshold distribution (SLC)

Next, referring to FIG. 20, a description is given of the relationship between the read voltage setting parameter (Read voltage parameter) and the threshold voltage in the single-level memory cells (SLC).

As shown in FIG. 20, in the present example, a level is selected from among level 0 to level 15 in total by the read voltage setting parameter (Read voltage parameter) with respect to the threshold voltage distributions 'E' and 'A'.

For example, in the threshold voltage distribution 'E', a set range of a predetermined width is provided with reference to the center point of the threshold voltage distribution 'E', and this range is divided at predetermined intervals from level 0 to level 7. In the threshold voltage distribution 'A', a set range of a predetermined width is provided with reference to the center point of the threshold voltage distribution 'A', and this range is divided at predetermined intervals from level 8 to level 15.

In the case of this single-level memory cell, a value, which is obtained by expressing an output 4-bit value of the LFSR 161 by decimal notation, corresponds to the Level i. In the case of SLC record, since the read voltage parameter (Read voltage parameter) is single, one threshold voltage parameter, which is selected by the output 4-bit value of the LFSR 161, is used as TH'.

<3. Advantageous Effects>

According to the semiconductor memory device relating to the first embodiment, at least the following advantageous effects (1) to (4) can be obtained.

(1) A high-capability random number can be generated, and the difficulty in prediction can be improved.

As has been described above, the NAND flash memory according to the first embodiment includes at least the memory cell array 11 in which memory cells MC are arranged, the random number generation circuit 16 which generates random numbers, and the control circuit (Controller) 19 which controls the memory cell array 11 and the random number generation circuit 16.

The random number generation circuit 16 includes the random number control circuit 162 which generates the random number parameter (PRESET, CLR) based on the data which has been read out from the memory cell MC by the generated read voltage setting parameter (Read voltage parameter); and the pseudo-random number generation circuit 161 which generates the random number (Random number) by using the random number parameter (PRESET, CLR) as the seed value.

As described above, the random number generation circuit 16 relating to this embodiment includes the pseudo-random number generation circuit 161 which generates the random number (Random number) by using, as the seed value, the random number parameter (PRESET, CLR) based on the data which has been read out from the memory cell MC by the generated read voltage setting parameter (Read voltage parameter).

In the present embodiment, as described above, firstly, the time-varying property of the threshold voltage distribution in the read data of the NAND flash memory can be used in the structure for generating random numbers.

To be more specific, as described with reference to FIG. 10 in connection with the threshold voltage distribution of the degradation mode, the state of the threshold voltage distribution after data program in the memory cell of the NAND flash memory varies due to various factors such as the condition of use, the environment of use. In addition, in the environment at the time of reproduction, the threshold voltage distribution is not constant, depending on the environment of use, such as temperature. Moreover, since these characteristics greatly vary due to the variance of products at the time of manufacture, it is almost impossible to predict the state of each memory cell in each NAND flash memory.

In the present embodiment, this difficulty in prediction, which is physically inherent in the NAND flash memory, can be used for the difficulty in prediction of the random number which is generated by the random number generation circuit 16.

Therefore, a high-capability random number (Random number) can be generated, and the difficulty in prediction can be enhanced.

(2) The uniformity and long periodicity of the random number can be ensured.

The pseudo-random number generation circuit 161, which is included in the random number generation circuit 16, feeds the generated random number (Random number) back to the random number control circuit 162.

According to the above-described structure, secondly, the uniformity and long periodicity of the random number can be ensured by using the generated high-capability random number (Random number) once again as a so-called initial value of the random number control circuit 162.

(3) The circuit scale of the random number generation circuit 16 and the increase in power consumption can be minimized.

As described above, in the present embodiment, the difficulty in prediction, which is physically inherent in the NAND flash memory, is used in the structure with which the random number generation circuit 16 generates the random number.

Therefore, the random number generation circuit 16 of this embodiment is advantageous in that in order to generate a high-level random number, there is no need to increase the circuit scale, and there is no increase in power consumption, and the circuit scale and power consumption can advantageously be minimized.

For example, in the environment of smartphones, tablet PCs, etc. in recent years, in which the restrictions to circuit scales and power consumption are strict, the random number generation circuit 16 of this embodiment can be applied as the random number generation circuit which generates the high-capability random numbers which are to be used in the use of commercial contents or in accounting/settlement.

On the other hand, in mobile devices which are exemplified by smartphones and tablet PCs, NAND flash memories, for instance, are mainly used as nonvolatile memories.

Therefore, it can be said that there is a high utility value in the structure in which the NAND flash memory includes the random number generation circuit 16, independently from the controller 9. Moreover, the manufacturing cost can advantageously be reduced.

(4) The information entropy of the seed value (RESET, CLR) can be enhanced, and the property of the random number can be improved.

The random number generation circuit 162 of the present embodiment includes the parameter generation circuit 162A which latches the random number by the random number generation trigger signal and generates the threshold read voltage setting parameter signal (Read voltage parameter), and the accumulation circuit 162B which generates the seed value (RESET, CLR) by executing the accumulation process on the read-out data (Page Data).

In the above-described structure, the data (Page Data), which is read out from the memory cell array 11, is subjected to the smoothing process by the accumulation in units of a predetermined segment by the accumulation circuit 162B. Thereby, the information entropy of the generated seed (RESET, CLR) can be enhanced.

Therefore, there is the advantage that the information entropy can be enhanced and the property of the random number can be improved.

[Second Embodiment (Another Structure Example of Random Number Generation Circuit)]

Next, a semiconductor memory device according to a second embodiment is described with reference to FIG. 21. This embodiment relates to another structure example of the random number generation circuit 16. A detailed description of the parts common to those of the first embodiment is omitted.

<Structure Example of Random Number Generation Circuit 16>

As shown in FIG. 21, the random number generation circuit 16 of the second embodiment differs from that of the first embodiment in that the random number generation circuit 16 includes LFSR1 (161-1), LFSR2 (161-2) and TRNG Controller 162, and operation clocks CLK1 and CLK2 are supplied to the LFSR1 (161-1) and LFSR2 (161-2) from Clock Generator 1 (160-1) and Clock Generator 2 (160-2).

The operation of Clock Generator 1 (160-1) is enabled by a free-run trigger signal which is supplied from the outside. As the free-run trigger signal, use may be made of, for example, a chip enable signal (CE), an address latch enable signal (ALE) or a command latch enable signal (CLE) at the interface of the NAND flash memory. In addition, these enable signals may be used singly or in combination. Further, some other signal, for instance, a read enable signal (RE) or a write enable signal (WE) may be used. The Clock Generator 1 (160-1) operates when the free-run trigger signal is ON, and supplies the clock CLK1 to the LFSR1.

The LFSR1 (161-1) starts an operation with a predetermined initial value by the supplied operation clock CLK1, and generates a random number 1 as a stage number 1. The period during which the LFSR1 (161-1) operates, that is, the value which is output from the LFSR1 (161-1), is updated by the time of the supply of the enable signal which is supplied from the outside.

The TRNG Controller 162 receives a random number generation trigger signal which is supplied from the controller 19, and starts the operation. As the random number generation trigger signal which is supplied from the outside, use is made of, for example, a signal which is generated by using, as a trigger, a request command relating to random number generation, which has been input from the outside of the NAND flash memory. After receiving the trigger signal, the TRNG Controller 162 sets a read voltage setting parameter (Read voltage parameter) by using the random number 1 which has been input from the LFSR1 (161-1).

The read voltage setting parameter (Read voltage parameter) is output to the outside of the random number generation circuit 16, and the controller 19 of the NAND flash memory executes a data read operation on a predetermined cell array according to this parameter. The data, which has been subjected to the read process, is successively input to the TRNG Controller 162. The TRNG Controller 162 generates a seed value (PRESET, CLR) which depends on the read-out data, and supplies the seed value as a stage number 2 to the LFSR2.

The LFSR2 (161-2) stores the received seed value (PRESET, CLR) in a register which is included in the LFSR2 (161-2), and generates a random number (Random Number) by using this seed value.

The LFSR1 (161-1), LFSR2 (161-2) and TRNG Controller 162 in this embodiment have the same structures as the LFSR (pseudo-random number generation circuit) 161 and TRNG Controller (random number control circuit) 162 which have been described in the first embodiment.

The Clock Generator 1 (160-1) and Clock Generator 2 (160-2) may be included in the random number generation circuit 16, or a clock generator which is included in the NAND flash memory may be substituted. In addition, without providing the Clock Generator 2 (160-2), the clock of the Clock Generator 1 (160-1) may be supplied as the operation clock to the LFSR1 (161-1) and LFSR2 (161-2). In many cases, the required operation frequency band is different between the clock generator, which is originally provided in the NAND flash memory, and the clock generator which is used for the random number generation circuit 16, and the timing which is necessary for operations is also different. For example, the clock generator, which is included in the NAND flash memory, is required to operate at high frequencies of, e.g. several-ten to several-hundred MHz. On the other hand, in general, the operation frequency in the random number generation circuit 16 may be low, although this frequency varies depending on the size of the random number that is generated and the required operation time. In this case, separately from the high-speed clock generator that is originally provided in the NAND flash memory, a low-speed clock generator as in the present embodiment is prepared, and this contributes to reduction in power consumption.

It is desirable that the clock, which is used for general operations of the NAND flash memory, have a highest possible quality. However, from the standpoint of the random number generation circuit 16, it is desirable that there is a variance in the quality of the operation clock. The reason for this is that the variance in quality contributes to the difficulty in prediction. The quality, in this context, is, for example, the amount of clock jitter, or the variance of the clock frequency due to temperature variation. In addition, to prepare plural clock generators as in this embodiment means to increase the factors of the above-described quality variance, and this contributes to the improvement of the property of the random number. These depend on the required capability of random numbers, and how to design penalties such as the circuit size and power consumption. The present embodiment is applicable to any case.

Other structures and operations are substantially the same as in the first embodiment.

<Advantageous Effects>

According to the semiconductor memory device relating to the second embodiment, at least the same advantageous effects (1) to (4) as described above can be obtained.

Furthermore, the random number generation circuit 16 of the second embodiment includes the LFSR1 (161-1), LFSR2 (161-2) and TRNG Controller 162, and operation clocks CLK1 and CLK2 are supplied to the LFSR1 (161-1) and LFSR2 (161-2) from the Clock Generator 1 (160-1) and Clock Generator 2 (160-2).

By the structure in which the pseudo-random number generation circuit is divided into two components, i.e. the LFSR1 (161-1) and LFSR2 (161-2), there is the advantage that the long periodicity can further be improved by making use of the difference in length of signals which are input to the LFSR1 (161-1) and LFSR2 (161-2).

In the present embodiment, the random number 1 is generated as the stage number 1 and the seed value (PRESET, CLR) is generated as the stage number 2, by making use of the difference in length between the free-run signal that is input to the Clock Generator 1 (160-1) and the random number trigger signal that is input to the Clock Generator 2 (160-2). Thus, in the present embodiment, it is desirable that the stage number 1 be smaller than the stage number 2 (stage number 1<state number 2).

Variations of the Clock Generator 1 (160-1) and Clock Generator 2 (160-2) are as described above.

[Third Embodiment (Another Structure Example of Random Number Generation Circuit)]

Next, a semiconductor memory device according to a third embodiment is described with reference to FIG. 22. This embodiment relates to another structure example of the random number generation circuit 16. A detailed description of the parts common to those in the above description is omitted.

<Structure Example of Random Number Generation Circuit 16>

As shown in FIG. 22, the random number generation circuit 16 of the third embodiment differs from that of the second embodiment in that the random number generation circuit 16 further includes, in addition to the seed setting of the LFSR1, an exclusive-OR circuit XOR9 for using a physical random number, which is output from the TRNG Controller 162, for the pseudo-random number which is output from the LFSR2.

<Advantageous Effects>

According to the semiconductor memory device relating to the third embodiment, at least the same advantageous effects (1) to (4) as described above can be obtained.

The random number generation circuit 16 of the third embodiment further includes, in addition to the seed setting of the LFSR1, the exclusive-OR circuit XOR9 for using a physical random number, which is output from the TRNG Controller 162, for the pseudo-random number which is output from the LFSR2.

By the above-described structure, not only the seed value, but also the physical random number, which is output from the TRNG Controller 162, is added. Thereby, the difficulty in prediction can be imparted to the output random number sequence (Random number) itself. Therefore, advantageously, the property of the random number can further be improved.

In the meantime, in the case where the uniformity, which is a requirement of the random number, cannot be ensured by only the physical random number that is output from the TRNG Controller 162, the physical random number may be combined with a pseudo-random number.

[Fourth Embodiment (Another Structure Example of Random Number Generation Circuit)]

Next, a semiconductor memory device according to a fourth embodiment is described with reference to FIG. 23. This embodiment relates to another structure example of the random number generation circuit 16. A detailed description of the parts common to those in the above description is omitted.

<Structure Example of Random Number Generation Circuit 16>

As shown in FIG. 23, the random number generation circuit 16 of the fourth embodiment differs from that of the third embodiment in that the seed value (PRESET, CLR) from the TRNG Controller 162 is also input to the LFSR1 (161-1), and thereby the seed setting process is executed.

<Advantageous Effects>

According to the semiconductor memory device relating to the fourth embodiment, at least the same advantageous effects (1) to (4) as described above can be obtained.

According to the structure of the random number generation circuit 16 of the fourth embodiment, the seed value (PRESET, CLR) from the TRNG Controller 162 is also input to the LFSR1 (161-1), and thereby the random number property of the read voltage setting parameter itself can be improved.

Accordingly, the finally output random number sequence (Random Number) can advantageously be improved.

[Fifth Embodiment (Example of System)]

Next, a system according to a fifth embodiment, is described with reference to FIG. 24. The system according to the fifth embodiment relates to a system example including the semiconductor memory device of the foregoing embodiments. A detailed description of the parts common to those in the above description is omitted.

<System Structure Example>

As shown in FIG. 24, the system of the fifth embodiment includes, for example, a semiconductor device 100 according to the first to fourth embodiments, to which, for instance, an eMMC, an SSD (trademark) Card, etc. are applicable, and a host device 200, to which, for example, a PC, a smartphone, a table PC, etc., are applicable.

The semiconductor memory device 100 includes an RNG as the above-described random number generation circuit 16. Further, the controller 19 includes a crypto engine 190, and in this respect the present embodiment differs from the foregoing embodiments. The crypto engine 190 notifies a random number, which has been generated by the random number generation circuit 16, to a crypto engine 290 on the host device side, via a secure channel (Secure channel) 199, in response to a random number request from the host device 200.

The host device 200 includes the crypto engine 290, an application interface 240, and a predetermined application 220.

Other structures and operations are substantially the same as in the first embodiment.

<Advantageous Effects>

According to the system relating to the fifth embodiment, at least the same advantageous effects (1) to (4) as described above can be obtained.

Furthermore, in the present embodiment, the controller 19 includes the crypto engine 190 which notifies a random number, which has been generated by the random number generation circuit 16, to the crypto engine 290 on the host device side, via the secure channel (Secure channel) 199, in response to a random number request from the host device 200.

The crypto engine 190 notifies the random number, which has been generated by the random number generation circuit 16, via the secure channel (Secure channel). Thus, there is the advantage that the security of the entire system can further be improved.

Next, a description is given of Comparative Example 1, Comparative Example 2, and sixth to 17th embodiments, with respect to concrete examples in which authentication is executed by using random numbers which are generated by the random number generation circuits 16 of the first to fifth embodiments.

Comparative Example 1

An Example of HB+Protocol

Figure 25:
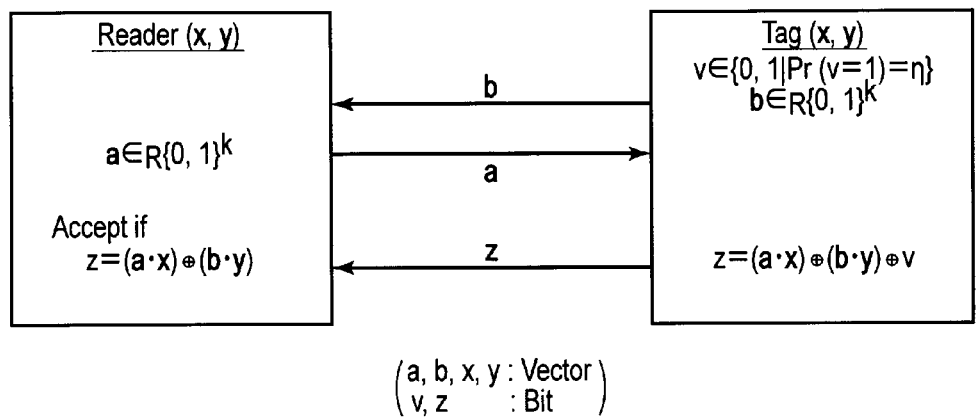
FIG. 25 is a block diagram showing a protocol according to Comparative Example 1.

To begin with, referring to FIG. 25, Comparative Example 1 is described. Comparative Example 1 relates to an example of HB+Protocol.

The HB+Protocol is an improved protocol of HB Protocol which is a lightweight authentication protocol proposed by Hopper and Blum in the year of 2000. The HB protocol is based on the fact that identification of parity values with noise is difficult (LPN: Learning Parity with Noise), and the security against a passive attack has been proved. However, the HB protocol has a vulnerability to an active attack, such as a disguise of a reader (Reader). In order to solve this problem, the HB+Protocol was proposed by Juels, et al. in 2005.

The outline of the HB+Protocol is as shown in FIG. 25. In FIG. 25, a, b, x and y are vectors, and v and z are bits.

As shown in the Figure, in the HB+Protocol, a tag (Tag), which is an authenticatee (to-be-authenticated component), and a reader (Reader), which is an authenticator (authenticating component), share secret information vectors x and y.

The tag delivers a nonce random number vector b to the reader.

Then, the reader delivers a nonce random number a to the tag.

Subsequently, the tag calculates an inner product (a·x) between the random number a and secret information vector x, and an inner product (b·y) between the random number b and secret information vector y. Further, the tag creates a variable v which becomes 1 with a probability of η. Then, the tag adds the inner product (a·x), the inner product (b·y) and variable v, and calculates z=ax⊕ by⊕ v. In this case, ax means the inner product (a·x), and ⊕means an exclusive logical sum.

Then, the tag transmits the calculated z to the reader.

Subsequently, the reader compares the received z and ax⊕ by, which is calculated by itself, and checks agreement/disagreement. The series of the above processes may be referred to as "1 round".

When the process of 1 round is repeated a plural number of times (e.g. several-ten to several-ten-thousand times), and when the above-described probability of disagreement lowers below a predetermined t, it is regarded that the tag holds secret information, and authentication is successfully executed.

In the meantime, ax⊕ by is the inner product of the secret information x, y and the binding vector a, b. Thus, if the binding vector xy of x, y is secret information and the binding vector of a, b is Concat(a, b), ax⊕ by may be expressed as Concat(a, b)xy.

Comparative Example 2

An Example of Random HB#Protocol

Figure 26:
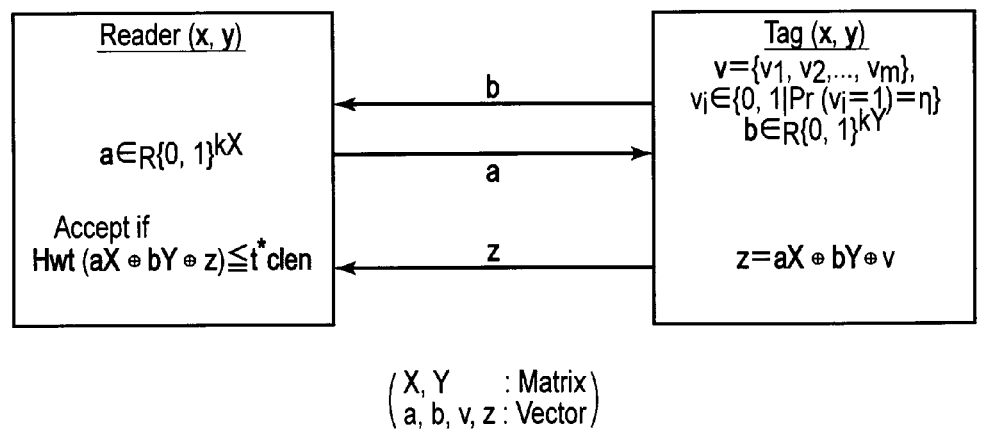
FIG. 26 is a block diagram showing a protocol according to Comparative Example 2.

Next, referring to FIG. 26, Comparative Example 2 is described. Comparative Example 2 relates to an example of Random HB#Protocol. The Random HB#Protocol is a protocol which is a further improvement of the HB+Protocol shown in the above-described Comparative Example 1.

Although the above-described HB+Protocol provides solutions to the passive attack and active attack, there is a tendency that the HB+Protocol has a vulnerability to a man-in-the-middle attack. In order to resolve this issue, the Random HB#Protocol was proposed by Gilbert, et al., as an improved protocol of HB+Protocol.

The outline of the Random HB#Protocol is as shown in FIG. 26. In FIG. 26, X and Y are matrices, and a, b, z, and v are vectors.

As shown in FIG. 26, in the Random HB#Protocol, a tag (Tag) and a reader (Reader) share secret information matrices X and Y.

To begin with, the tag delivers a nonce random number vector b to the reader.

Then, the reader delivers a nonce random number a to the tag.

Subsequently, the tag calculates an inner product (aX) between the random number a and secret information matrix X and an inner product (bY) between the random number b and secret information vector Y. In this case, since X and Y are matrices and a and b are vectors, each internal product result is a vector. Further, the tag creates a variable v which becomes 1 with a probability of η. Then, the tag adds the above-described value, and calculates z=aX⊕ bY⊕ v. In this case, z is a vector.

Then, the tag transmits the calculated z to the reader.

Subsequently, the reader executes bit addition between the received z and aX⊕ bY calculated by itself, that is, calculates a Hamming weight Hwt(aX⊕ bY⊕ z) of aX⊕ bY⊕ z by using a result of an exclusive OR operation. When the Hamming weight Hwt(aX⊕ bY⊕ z) lowers below a predetermined value t*clen, it is regarded that the tag holds secret information, and authentication is successfully executed. In this case, η≤t<0.5, and clen is a bit length of aX⊕ bY.

In the meantime, aX⊕ bY is the inner product between the binding matrix of the secret information pieces X and Y and the binding vector of a and b.

Thus, if the binding matrix XY of X and Y is secret information and the binding vector of a and b is Concat(a, b), aX⊕ bY may be expressed as Concat(a, b)XY.

<Points of Improvement on Implementation>

In the protocols of the above-described Comparative Examples 1 and 2, however, for example, when the protocols are to be implemented on a NAND flash memory, etc., the following points (I) to (IV) of improvement are thinkable.

(I) Sharing Means of Secret Information Pieces X and Y

As described above, in the above-described Comparative Examples 1 and 2, the reader and the tag need to share the secret information X, Y. However, Examples 1 and 2 fail to preset concrete sharing methods for sharing the secret information X, Y.

Thus, in the case where all readers and tags share the same X, Y in advance, if X, Y is once exposed, the entire system would be fatally affected. On the other hand, in the case where different information X, Y is applied to each tag, the reader side is requested to access, e.g. a database which stores X and Y which are applied to all tags or totally manages X and Y. As a result, a load on the reader side increases.

As related prior art, Jpn. Pat. Appln. KOKAI Publication No. 2000-357213 proposes a method of mutual authentication between a recording device which records duplicate content in a recording medium having an arithmetic processing function, and the recording medium. The recording medium stores at least first information which depends on the recording medium, and second information which depends on the recording medium and is to be shared with the recording device at a time of executing mutual authentication with the recording device. Based on the first information obtained from the recording medium, the recording device generates authentication information which is used when mutual authentication with the recording medium is executed. Mutual authentication between the recording device and the recording medium is executed by using the generated authentication information and the second information.

(II) Means for Efficiently Recording Secret Information Pieces X and Y in Component P In the above-described HB+Protocol and Random HB#Protocol, a commensurate secret information amount, i.e., a commensurate data size of X, Y, is necessary in order to make it difficult to identify the above-described LPN problem with a practical calculation amount. If X, Y is common to all tags, hardwired log implementation is possible. However, when X, Y is varied from tag to tag, the tag needs to have a sufficient memory capacity in order to hold X, Y. At the same time, it is necessary to individually record the data in the tag fabrication, and the recording time is reflected on the fabrication time.

As a result, the cost of the tag increases due to the increase in memory capacity and the increase in recording time.

(III) Means for Protection Against Damage of Secret Information Pieces X and Y Stored in Component P In the case where the component P stores X, Y in an internal memory, when X, Y is used for authentication, the data completeness of X, Y is required. However, the prior art is silent on this. In order to ensure the data completeness, such a method is thinkable that X, Y, to which an error correction code is added, is stored in the internal memory of the tag, and a correction process is executed at the time of authentication. However, in general, inexpensive memories do not always have a correction function. When the memory does not have the correction function, the correction function needs to be provided as a component in the tag, other than the memory.

As a result, the cost of the tag increases.

(IV) Secret Information Update Means at Time of Exposure of Secret Information Pieces X and Y The above-described Random HB#Protocol is recognized as having the resistance to the passive attack, active attack and main-in-the-middle attack under predetermined conditions. However, in recent years, the vulnerability to a generalized man-in-the-middle attack has been reported, and the possibility of exposure of X, Y cannot be excluded. Although a commensurate attack cost is required for exposure of X, Y, if X, Y is once exposed, the fabrication of falsified tags using the X, Y becomes possible. Thus, means for updating secret information is desirable in order to transition to new X,Y even when X, Y has been exposed.

Taking the above into account, embodiments are described below with reference to the drawings. The reader and tag of RFID have been described above by way of example. However, the same requirements apply to a memory chip, such as a NAND flash memory, in which the circuit area is directly related to the cost. Thus, in the embodiments below, examples are described in which a host device (Host) which authenticates a NAND flash memory is used as a reader (Reader) functioning as an authenticator, and a NAND flash memory (NAND chip) is used as a tag (Tag) functioning as an authenticatee. However, the embodiments are not limited to these examples. For example, the embodiments are applicable to various implementation modes, such as a NOR flash memory, a resistive random access memory (ReRAM), a magnetoresistive random access memory (MRAM), a phase change random access memory (PRAM), a ferroelectric random access memory (FeRAM), a storage device with an arithmetic function and a memory, such as a hard disk drive or a solid-state drive, a component requiring authentication such as an RFID or IC card, and a system comprising a computer including a general-purpose arithmetic element and a general-purpose memory, and software. In the description below, common parts are denoted by like reference numerals throughout the drawings.

[Sixth Embodiment]

Next, a description is given of an authenticator, an authenticatee and an authentication method according to a sixth embodiment.

<11. Structure Example (Memory System)>

Figure 27:
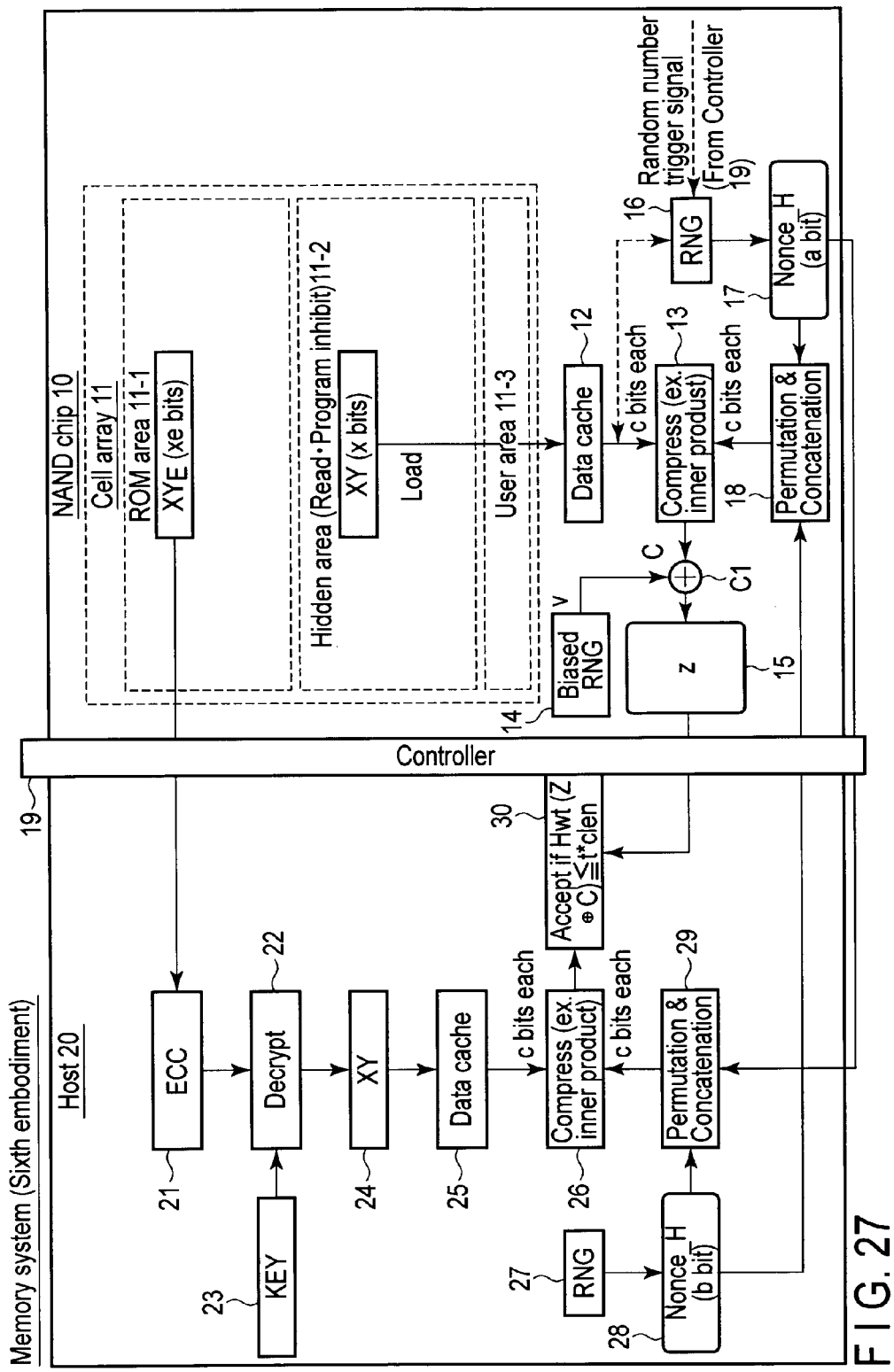
FIG. 27 is a block diagram showing a structure example according to a sixth embodiment.

To begin with, referring to FIG. 27, a structure example according to the sixth embodiment is described.

A memory system shown in FIG. 27 includes a NAND flash memory 10 which is an authenticatee, a host device 20 which is an authenticator, and a controller 19 which mediates between both. As shown in FIG. 27, the host device 20 accesses the NAND flash memory 10 via a device called "controller 19", which has a function of accessing the NAND flash memory 10.

A fabrication process of a semiconductor product is described. The fabrication process of a semiconductor product is mainly divided into a pre-process of forming a circuit on a substrate wafer, and a post-process of dicing the wafer into pieces and performing wiring and resin package sealing. In this case, the controller 19 is variously configured, for example, such that the controller 19 is included in the NAND flash memory 10 in the pre-process, the controller 19 is not included in the pre-process but is included in the same package in the post-process, or the controller 19 is formed as a chip which is different from the NAND flash memory 10. In the Figures including FIG. 27, the case is described, by way of example, in which the controller 19 is formed as a chip different from the NAND flash memory 10. However, the present embodiment is applicable to any of the above cases. In the description below, unless otherwise specified, the controller mediates, in many cases, in the transactions of data and instructions between the host device 20 and NAND flash memory 10, but a description of this will be omitted. Structure examples of the NAND flash memory 10 and controller 19 will be described later.

The respective components and data processing, illustrated in FIG. 27, will be described below. As shown in the Figure, a method of sharing secret information X, Y and a structure in the case of applying this method to the NAND flash memory 10 are illustrated.

11-1. NAND Flash Memory

The NAND flash memory 10 is an authenticatee. The NAND flash memory 10 according to this example includes a cell array 11, a data cache 12 which is disposed in a peripheral area of the cell array 11, a compression arithmetic circuit 13, a biased RNG 14, an output module 15, a random number generator 16, a permutation & concatenation circuit 18, and a bit-by-bit addition circuit C1.

In the cell array (Cell array) 11, a plurality of memory cells are arranged in a matrix at intersections between bit lines and word lines (not shown). The memory cell includes, in the named order on a semiconductor substrate, a tunnel insulation film, a floating gate, an interlayer insulation film, and a control gate connected to the word line. Current paths of memory cells in the bit line direction are connected in series, thereby constituting a cell unit. The cell unit is selected by a select transistor which is connected to the bit line and a source line. A plurality of memory cells in the word line direction constitute 1 page (Page) which is a unit of data read and data write. In addition, a plurality of pages constitute a block (Block) which is a unit of data erase.

The cell array (Cell array) 11 includes a ROM area 11-1, a hidden area 11-2 and a user area 11-3.

The ROM area (ROM area) 11-1 is an area in which data record is prohibited and data read is permitted. In the ROM area 11-1 according to this example, data $XY_E$(xe bits), which is obtained by encrypting secret information XY and further adding a correction code to the encrypted secret information, is recorded. For the encryption, use may be made of an encryptor of, e.g. AES (Advanced Encryption Standard), which is a symmetric key cipher. As the encryption mode, use may be made of CTR (Counter), CBC (Cipher block chain), etc. In addition, use may be made of ECDSA (elliptic curve cipher) or RSA, which is an asymmetric cipher. Besides, as the error correction code, use may be made of a BCH code, a Reed Solomon code, LDPC (Low density parity check) code, etc. In this manner, the present example is applicable to any encryption method and any correction code. In this case, $XY_E$ is expressed as data which is obtained by encrypting secret information XY and further adding a correction code to the encrypted secret information. In addition, (xe bits) represents a bit number.

The hidden area (Hidden area) 11-2 is an area in which the outside of the NAND flash memory 10 is prohibited from data record, and in which data read is prohibited (Read Program inhibit). In the hidden area 11-2 according to this example, data XY corresponding to X, Y for use in the authentication is recorded.

The user area (User area) 11-3 is an area in which data record and data read can be freely executed. In the user area 11-3, for example, image data such as photos, and moving picture data are recorded.

The above-described ROM area, hidden area and user area may be realized by making physical structures different, or may be realized by logical control within the NAND flash memory, with the physical structure being the same. In this case, the logical control is, for example, such a method that the respective areas are provided with identifiers which control access from the outside of the NAND flash memory, these identifiers are stored, and access control is executed by the identifiers when the NAND flash memory has received access to the areas from the outside.

In addition, each of the memory cells constituting the cell array (Cell array) 11 may be a memory cell which stores a plurality of bits (MLC: Multi Level Cell) or a memory cell which stores 1 bit (SLC: Single Level Cell). Further, the ROM area and hidden area may be configured to be used by the SLC, and the user area may be configured to be used by the MLC. At this time, the physical structure of the cell array may be different between the SLC area and the MLC area, or only partial bits of the memory cell, which is usable as the MCL, may be utilized as a pseudo-SLC area.

The data cache (Data cache) 12 temporarily stores data which has been read out from the cell array 11.

The biased RNG (Biased RNG) 14 generates a random number v which becomes 1 with a predetermined probability η. In the meantime, the random number generator, which is described below, may be used as an input source of the biased RNG. In this case, a random number corresponding to the probability η can be generated by executing an arithmetic operation, such as AND or OR, on a plurality of random number sequences which are output from the random number generator.

The random number generator (RNG: Random Number Generator) 16 generates a random number Nonce_N (a bit) which is used in authentication. As the random number generator 16, use may be made of the random number generation circuits 16 according to the above-described first to fifth embodiments. In this case, for example, the random number generator 16 similarly receives read-out data Data and the random number trigger signal, through a path indicated by a broken line in FIG. 27. Thereby, the random number generation circuits 16 according to the first to fifth embodiments can be similarly applied, and the same advantageous effects can be obtained.

The permutation & concatenation circuit (Permutation & Concatenation) 18 generates a random number Nonce (c bits) which is constituted from a random number Nonce_H that is input from the host device 20, and a random number Nonce_N that is input from the memory 10, by using XY which is shared by both. In this case, a means a bit length of Nonce_N, b means a bit length of Nonce_H, and c means a bit length which is input per 1 process of the compression arithmetic circuit. Specifically, an individual random number Nonce, which is output from the permutation & concatenation circuit (Permutation & Concatenation), is data for 1 process of the compression arithmetic circuit, and total bits of Nonce_N and Nonce_H may be used for 1 process or parts thereof may be used selectively.

The compression arithmetic circuit (Compress (ex. inner product)) 13 executes a predetermined arithmetic operation, such as an inner product arithmetic operation, with respect to the output XY (c bit each) of the data cache 12 and the output (c bits) of the permutation & concatenation circuit 18, and outputs data C.

The bit-by-bit addition circuit C1 outputs, to the output module 15, Z=C+v, which is obtained by adding v that has been generated by the biased RNG to the output bit of the compression arithmetic circuit 13. As described above, the bit addition means an exclusive logical sum. Specifically, the bit-by-bit addition circuit outputs an exclusive logical sum of bits of 2 input data.

The output module 15 outputs the result (Z=C+v) of the bit-by-bit addition circuit C1 to the host device 20 via the controller 19.

The structural components, such as the data cache 12, other than the cell array 11, may also be disposed in the memory controller 19.

11-2. Host

The host (Host) 20 according to the present example includes a correction process module 21, a decrypt module 22, a key holding module 23, a data temporary storage module 25, a compression arithmetic circuit 26, a random number generator 27, a permutation & concatenation circuit 29, and a determination module 30.

The correction process module (ECC) 21 executes an error correction process (ECC) on the data $XY_E$ which has been read out from the ROM area 11-1 of the NAND flash memory 10.

The decrypt module (Decrypt) 22 decrypts, after the read-out data $XY_E$ has been subjected to the error correction process, the data $XY_E$ by a key (KEY) which is held in the key holding module 23, thereby obtaining XY.

The data temporary storage module (Data cache) 25 temporarily stores the decrypted XY. Thereby, the host device 20 and NAND flash memory 10 can share secret information XY.

The compression arithmetic circuit (Compress (ex. inner product)) 26 executes a predetermined arithmetic operation, such as an inner product arithmetic operation, with respect to the output (c bit each) of the data cache 25 and the output (c bits) of the permutation & concatenation circuit 29, and outputs data C.

The random number generator (RNG) 27 generates a random number Nonce_H (b bit) of the host.

The permutation & concatenation circuit (Permutation & Concatenation) 29 generates a random number Nonce (c bits) which is constituted from a random number Nonce_H that is input from the host 20, and a random number Nonce_N that is input from the memory 10, by using XY which is shared by both.

The determination module (Accept if Hwt(Z⊕ C)≤t*clen) 30 calculates a Hamming weight Hwt(Z⊕ C), as described above, with respect to the output C of the compression arithmetic module 26 and the output Z of the output module 15. When the Hamming weight Hwt(Z⊕ C) becomes lower than the predetermined value t*clen, the determination module 30 regards that the secret information is held, and determines the success of authentication. It is assumed that η≤t<0.5, and clen is the bit length of Z⊕ C.

In this manner, the host 20, excluding the biased RNG process 27, confirms the authenticity of the NAND flash memory 10 that is the authenticatee, by the determination module 30 comparing C and Z which have been obtained by the same process.

Meanwhile, the same process by the above-described structure may be executed a plural number of times, and thereby the authenticity may be finally confirmed. For example, in the present Figure, the case in which C is plural bits is illustrated by way of example, and the comparison determination method employs, in the determination, the Hamming weight in the addition bit sequence of Z and C. If C is a single bit, the above-described process needs to be executed a plural number of times, like the above-described HB+Protocol. In this case, like the HB+Protocol, it should suffice if the ratio of disagreement between Z and C is checked based on the probability of occurrence of an error variable.

11-3. Modification

Aside from the above, the structure of this embodiment may be modified, where necessary, as will be described below.

The compression process may correspond to the inner product calculation according to Comparative Examples 1 and 2 shown in FIG. 25 and FIG. 26, but may not necessarily correspond to the inner product calculation. For example, in the compression process, data based on XY and data based on Nonce_H and Nonce_N may be input to the arithmetic device which is composed of an LFSR (Linear Feedback Shift Register), and a part or all of the register values in the LFSR after the input may be used as a compression result. Alternatively, a CRC arithmetic device may be used as the LFSR. Further, a hash function may be used as a function which is used for the compression process. The hash function may be, or may not be, based on an encryptor. No matter which arithmetic method is used, the method proposed in this embodiment is applicable. There is no difference in belonging to the LPN problem that is the basis of security. The compression process may be lossless compression or lossy compression. The compression process means a process of outputting data which is, at least, smaller than input data, and depends on the input data.

A description is given of a process of sending Nonce which is generated based on Nonce_H and Nonce_N. Nonce is data which is generated by binding Nonce_H and Nonce_N in a predetermined order, and is then sent. The binding/sending method may be a simple forward-feed data binding/sending method, or an interleave data binding/sending method in which mutual data is alternately inserted. Data may be sent a plural number of times by the above-described method. In any case, Nonce is data which is generated from at least a part of Nonce_N and Nonce_H, and is data with c bit length. It is assumed that the data length of Nonce_N is a, the data length of Nonce_H is b, and the total data length of both is d. If c=d and data is not sent a plural number of times, the output from the compression calculation module is 1 bit. If c=d and data is sent a plural number of times, the output from the compression calculation module is such that 1 bit is sent a plural number of times. If c<d and data is sent a plural number of times, the output from the compression calculation module is such that 1 bit is sent a plural number of times.

On the other hand, as regards XY with respect to which compression with Nonce is calculated, data in XY is sent to the compression calculation module in units of c bit. The bit size x of XY data is equal to c or an integer number of times of c. When the bit size x is equal to c, the output of the compression calculation module is 1 bit. When the bit size x of XY data is an integer number of times of c, the output of the compression calculation module is such that 1 bit is output a plural number of times. Typical combinations are as follows:

In case of c=d=x, the output of the compression calculation module is 1 bit,

In case of c=d<x, the output of the compression calculation module is a plural number of times of 1 bit, and In case of c<d, and c<x, the output of the compression calculation module is a plural number of times of 1 bit.

In the meantime, the above example relates to the case in which the compression calculation module compresses 2 inputs to 1 bit. In the case where the compression calculation module compresses 2 inputs to plural bits, the output value itself per one time becomes plural bits.

<20. Authentication Flow>

Figure 28:
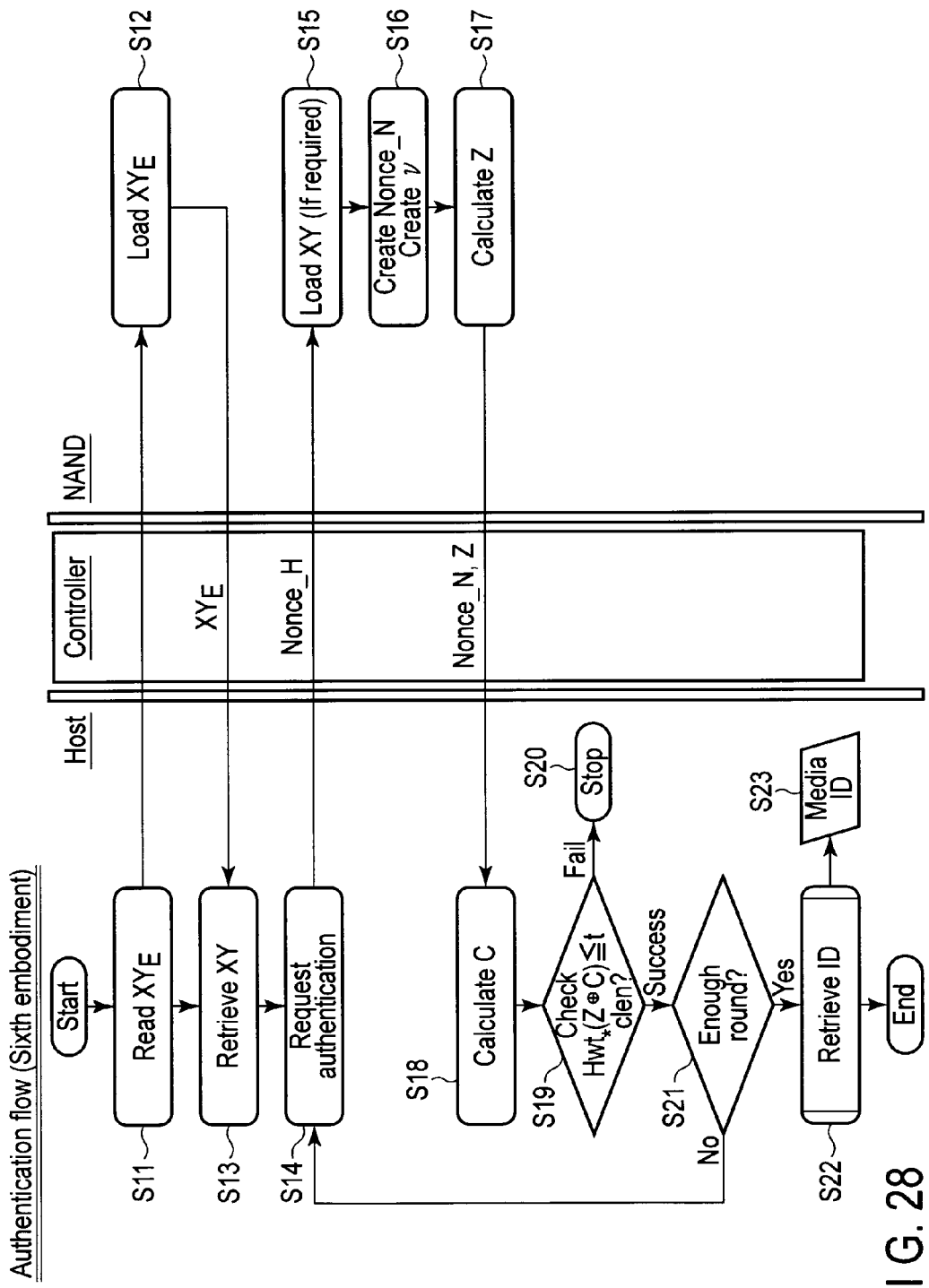
FIG. 28 is a flow chart illustrating an authentication flow according to the sixth embodiment.

Next, referring to FIG. 28, a description is given of an authentication flow of the memory system having the structure shown in FIG. 27.

If authentication is started (Start), the host device 10, in step S11, sends a read instruction (Read $XY_E$) of $XY_E$ to the NAND flash memory 10.

Then, in step S12, the NAND flash memory 10 loads $XY_E$ (load $XY_E$) from the cell array 11-1 according to the read instruction, and sends this to the host device 20.

Subsequently, in step S13, the host device 20 executes the above-described decrypt process on the received $XY_E$, and retrieves XY (Retrieve XY).

Then, in step S14, the host device 20 sends an authentication request (Request authentication) to the NAND flash memory 10. In this case, the authentication request may include Nonce_H.

Thereafter, in step S15, the NAND flash memory 10 receives Nonce_H, and loads XY (Load XY (if required)).

Then, in step S16, the NAND flash memory 10 creates Nonce_N and v (Create Nonce_N, Create v).

Subsequently, in step S17, the NAND flash memory 10 adds the generated v, as described above, and calculates Z. The NAND flash memory 10 sends Nonce_N and Z to the host 20.

Then, in step S18, after receiving Nonce_N and Z, the host 20 executes a predetermined arithmetic operation such as an inner product arithmetic operation, and calculates data C.

Subsequently, in step S19, the host device 20 calculates a Hamming weight $Hwt(Z \oplus C)$ with respect to the sequence of bit-by-bit XOR values of Z and C, and executes a determination process to determine whether the Hamming weight Hwt$(Z \oplus C)$ is lower than a predetermined value t*Clen (Check Hwt$(Z \oplus C) \leq$ t*Clen). As described above, t is a value based on an error addition probability (or a probability of occurrence of 1 in data) η in an error bit or an error vector which was used by the NAND flash memory 10 at the time of calculating Z, and it is assumed that $\eta \leq t < 0.5$. In addition, it is assumed that clen is the bit length of C.

Subsequently, in step S20, when the determination result in step S19 fails to become lower than the predetermined value (Fail), the host 20 determines failure and stops the operation.

Then, in step S21, when the determination result in step S19 is lower than the predetermined value (Success), the host 20 determines whether a predetermined round number has been reached (Enough round). The round number, in this context, refers to a series of processes from the authentication request process to the determination process. If the round number is not reached (No), the authentication request process (S14~) is repeated.

Subsequently, in step S22, when the round number is reached (Yes), the host device 10 regards that the authentication has been successfully executed, and executes, where necessary, a process of calculating Media ID, based on the XY. The calculation process of Media ID and the method of using Media ID (S23 and the following) will be described later.

By the above-described operation, the authentication flow according to the sixth embodiment is finished (End).

In the meantime, it is necessary to use different parameters of Nonce_N, Nonce_H and v between the respective rounds. In addition, when the NAND flash memory 10 has received an authentication request, if XY at the time of the previous authentication request remains loaded in the Data Cache, it is possible to omit the loading of XY from the cell array, and to use the values in the Data Cache. In addition, after step S17, the XY in the Data Cache may be erased. In particular, in the case where the NAND flash memory 10 provides to the outside the function of accessing the Data Cache, it is useful, in terms of security, to erase the secret information XY in the Data Cache at a stage when the data Z that is necessary for authentication has been calculated.

<30. Advantageous Effects>

According to the structure and the authentication method relating to the sixth embodiment, the above points (I) to (IV) can be improved, and at least the following advantageous effect (11) can be obtained.

(11) Different secret information XY can be shared between the authenticator and the authenticatee while the secret state of the secret information XY is maintained, and authentication can be executed by a light amount of calculation based on the shared secret information.

The NAND flash memory 10 according to the present embodiment stores the secret information XY in the hidden area 11-2 that is the record prohibition/read prohibition area, and stores $XY_E$, which is obtained by encrypting the secret information XY and adding the correction code to the encrypted secret information, in the ROM area 11-1 that is the record prohibition/read permission area. Further, the host device 20 has the function of reading out the $XY_E$ and executing the error correction process 21 and decryption process 22, and can share the secret information XY between the NAND flash memory 10 and host device 20 by the key 23 that is used for decryption. Thus, the authenticator and authenticatee can execute authentication by the shared secret information XY (S11 to S23).

In addition, the NAND flash memory 10 and the host device 20 include the RNG 16, 17 which creates nonce random numbers, the permutation & concatenation module 18, 29, the compression calculation module 13, 26, the bit-by-bit addition module C1, 26 of nonce random numbers, and the output module 15. Furthermore, the NAND flash memory 10 includes the biased RNG 14. The host 20 includes the determination module 30 which compares the Z that is output from the NAND flash memory 10 and the C that is calculated within the host device, thereby executing authentication.

As described above, in the sixth embodiment, since the secret information XY is stored in the hidden area 11-2 that is the record prohibition/read prohibition area and the data Z is generated by using this information, the secrecy can be secured. Moreover, the $XY_E$, which is obtained by encrypting the secret information XY and adding the correction code to the encrypted secret information, is stored in the ROM area 11-1 that is the record prohibition/read permission area. The host 20 subjects the $XY_E$, which is read out therefrom, to the error correction process 21 and the decryption process 22 using the key 23, thereby sharing the XY. Thus, different secret information XY can be shared between the authenticator and the authenticatee while the secret state of the secret information XY is maintained.

Therefore, according to the structure and the authentication method relating to the sixth embodiment, there is the advantage that different secret information XY can be shared between the authenticator and the authenticatee while the secret state of the secret information XY is maintained, and authentication can be executed by a light amount of calculation based on the shared secret information.

[Seventh Embodiment]

Figure 29:
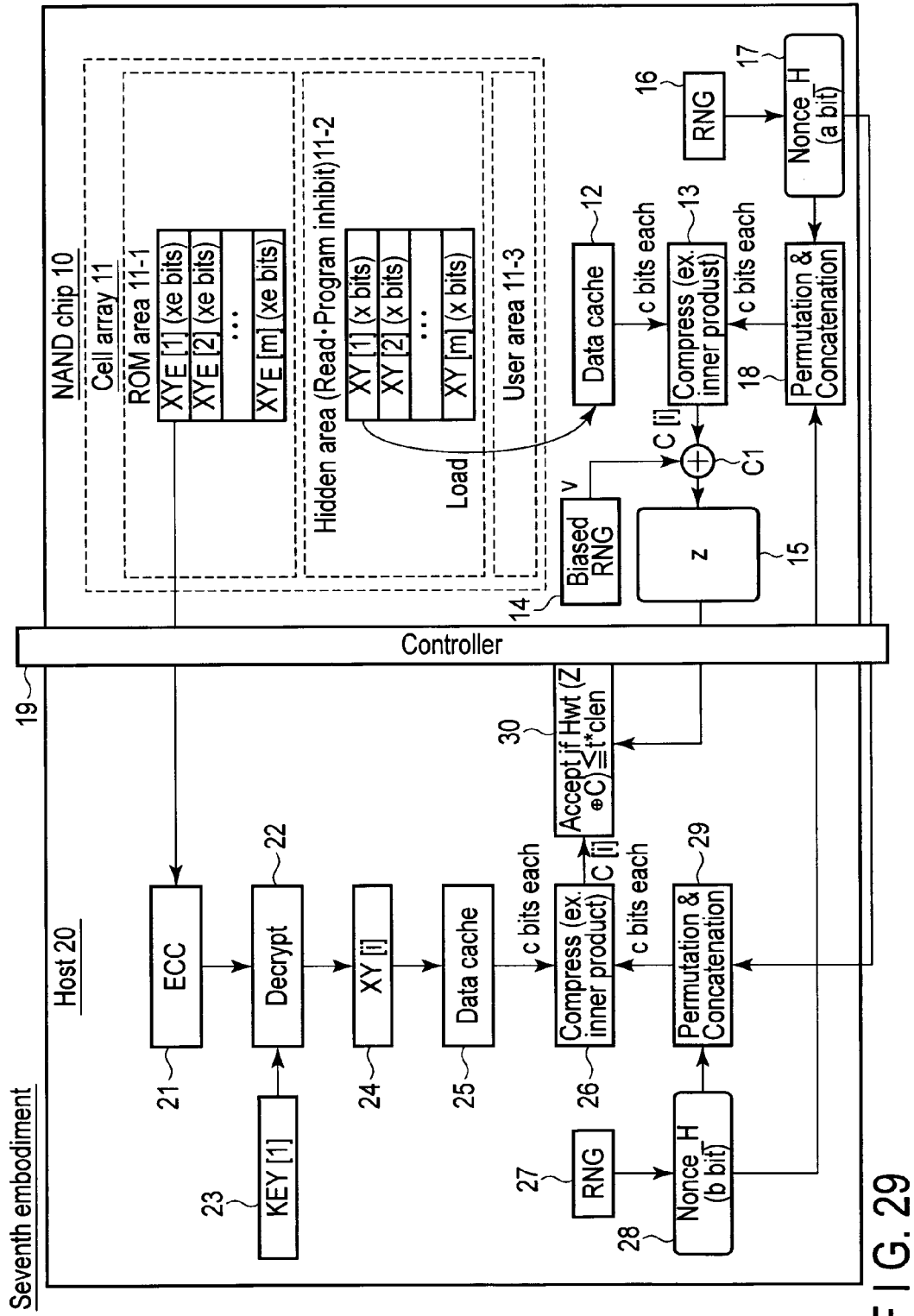
FIG. 29 is a block diagram showing a structure example according to a seventh embodiment.
Figure 30:
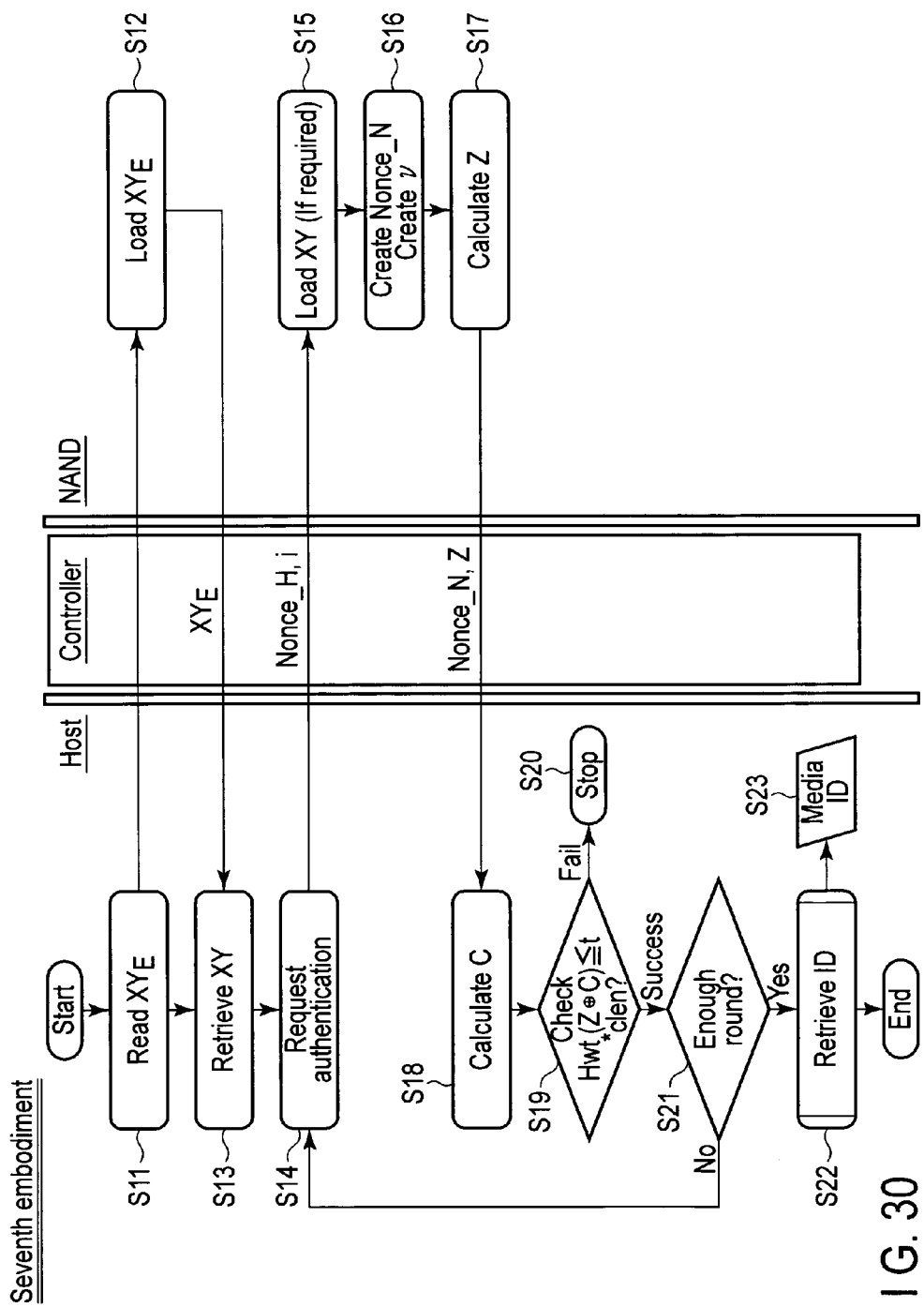
FIG. 30 is a flow chart illustrating an authentication flow according to the seventh embodiment.

Next, referring to FIG. 29 and FIG. 30, a description is given of an authenticator/authenticatee and an authentication method according to a seventh embodiment. In the description below, a description of parts overlapping the sixth embodiment is omitted.

<Structure Example (Memory System)>

Referring to FIG. 29, a structure example of the seventh embodiment is described.

As shown in FIG. 29, the structure example of the seventh embodiment differs from the sixth embodiment in that the NAND flash memory 10 stores a plurality of pieces of $XY_E$ and a plurality of pieces of XY in the ROM area 11-1 and hidden area 11-2, respectively. In this example, when i and j are different, $XY[i] \neq XY[j]$, and $XY_E[i] \neq XY_E[j]$.

In this manner, by storing sets of plural $XY_E$ and plural XY, it is possible to provide means for updating secret information when secret information pieces X and Y are exposed. If one set of XY and $XY_E$ is exposed by a man-in-the-middle attack or the like, and a falsified device is fabricated by misappropriating the exposed XY and $XY_E$, it is possible, in the present embodiment, to update the KEY[1]23 that is held by the host device 20 (e.g. KEY[1]⇒ updated KEY[2]). In this manner, by using a set other than the set of exposed XY and $XY_E$, it becomes possible to eliminate falsified devices. As regards the KEY that is used for encryption of each XY[i], when i is different, it is preferable to use different KEY.

In the other respects, the seventh embodiment is substantially the same as the sixth embodiment, so a detailed description is omitted.

<Authentication Flow>

Next, referring to FIG. 30, the authentication operation according to the seventh embodiment is described.

In the seventh embodiment, since the plural XY and plural $XY_E$ are recorded in the NAND flash memory 10, the host device 20 selects the XY that is to be used, thereby executing authentication.

Thus, in the seventh embodiment, in step S14, when the host 20 requests authentication (Request authentication), the host device 20 sends a parameter i, which designates the XY that is to be used, together with the random number Nonce_H, to the NAND flash memory 10. In this respect, the seventh embodiment differs from the sixth embodiment.

In the other respects, the seventh embodiment is substantially the same as the sixth embodiment, so a detailed description is omitted.

<Advantageous Effects>

According to the authenticator/authenticatee and the authentication method relating to the seventh embodiment, the above points (I) to (IV) can be improved, and at least the above-described advantageous effect (11) can be obtained.

Furthermore, the seventh embodiment differs from the sixth embodiment in that the NAND flash memory 10 stores a plurality of pieces of $XY_E$ and a plurality of pieces of XY in the ROM area 11-1 and hidden area 11-2, respectively.

In this manner, by storing sets of plural $XY_E$ and plural XY, it is possible to provide means for updating secret information when secret information pieces X and Y are exposed. If one set of XY and $XY_E$ is exposed by a man-in-the-middle attack or the like, and a falsified device is fabricated by misappropriating the exposed XY and $XY_E$, it is possible, in the present embodiment, to update the KEY[1]23 that is held by the host 20 (e.g. KEY[1]⇒ updated KEY[2]).

Thus, in the authentication flow of the seventh embodiment, in step S14, when the host device 20 requests authentication (Request authentication), the host device 20 sends a parameter i, which designates the XY that is to be used, together with the random number Nonce_H, to the NAND flash memory 10.

In the seventh embodiment, as described above, the NAND flash memory 10 has plural XY and plural $XY_E$, has the function of selectively sending $XY_E$ by an instruction from the host device, and selectively sets the XY that is used for authentication by an instruction from the host device. In addition, the host device has the function of selectively reading out the $XY_E$ which corresponds to the key that is held by the host device itself, has the function of decrypting the $XY_E$, and has the function of updating the key that is held by itself under a predetermined condition.

As a result, by using a set other than the set of exposed XY and $XY_E$, it becomes possible to advantageously eliminate falsified devices.

[Eighth Embodiment]

Figure 31:
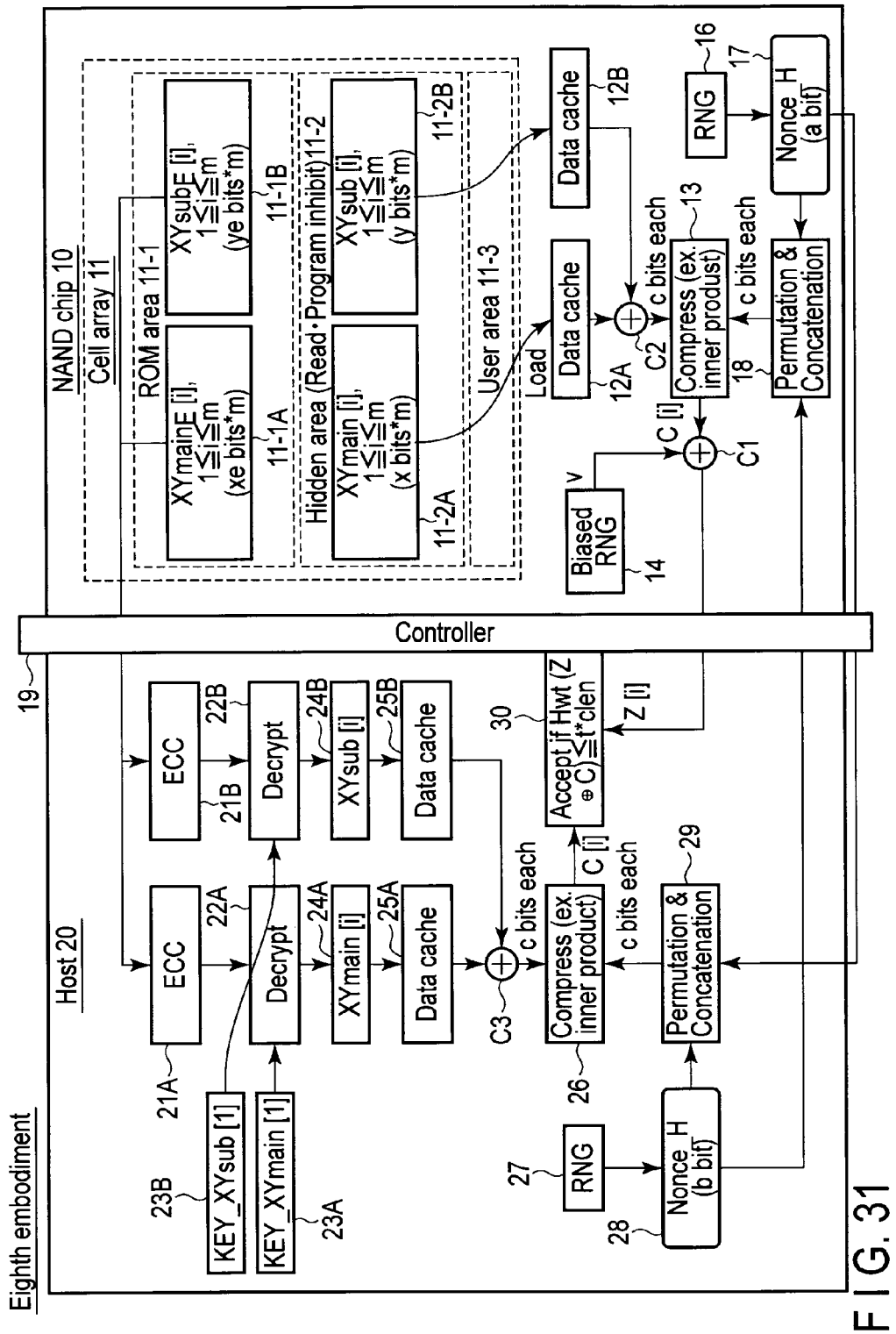
FIG. 31 is a block diagram showing a structure example according to an eighth embodiment.
Figure 32:
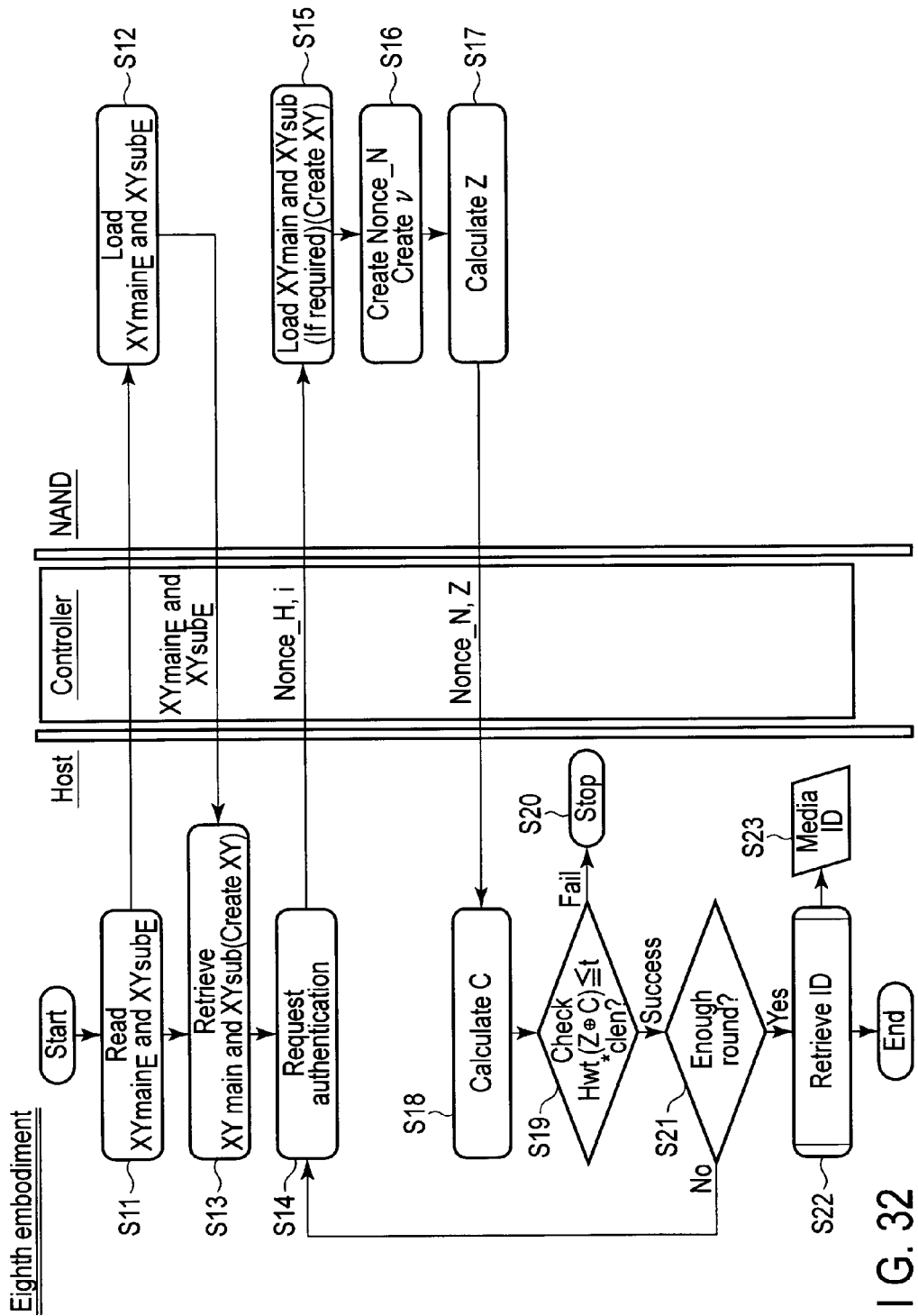
FIG. 32 is a flow chart illustrating an authentication flow according to the eighth embodiment.
Figure 33:
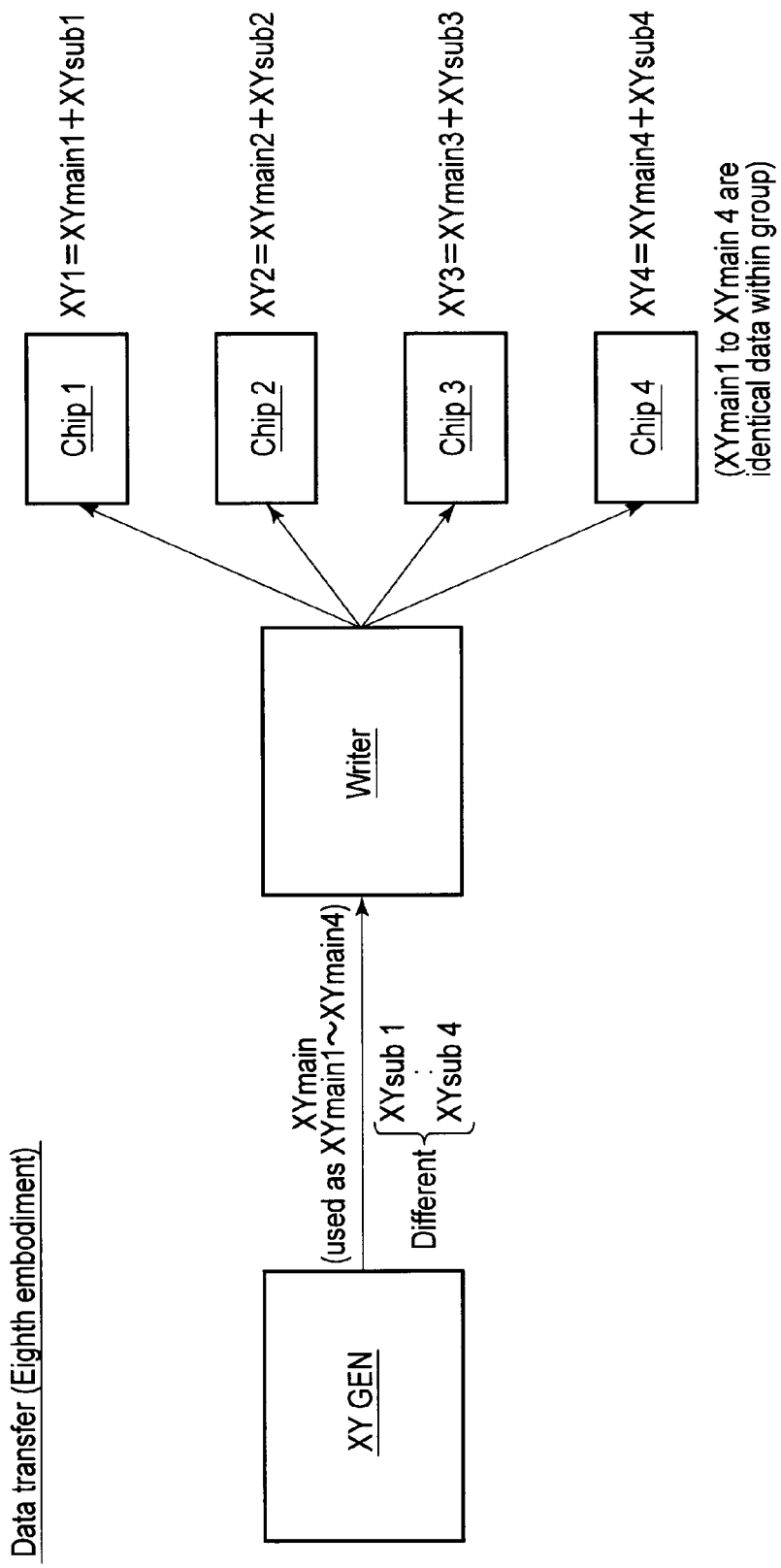
FIG. 33 is a block diagram showing data transfer of secret information in the eighth embodiment.

Next, referring to FIG. 31 to FIG. 33, a description is given of an authenticator/authenticatee and an authentication method according to an eighth embodiment.

<Structure Example (Memory System)>

Referring to FIG. 31, a structure example of the eighth embodiment is described.

As shown in FIG. 31, the eighth embodiment differs from the seventh embodiment in that the NAND flash memory 10 stores a plurality of pieces of $XYsub_E$ and a plurality of pieces of XYsub in a ROM area 11-1B and hidden area 11-2B, respectively. In this example, when i and j are different, $XYsub[i] \neq XYsub[j]$, and $XYsub_E[i] \neq XYsub_E[j]$. $XYsub_E$ is data which is obtained by encrypting XYsub and then adding a correction code thereto.

The XYsub, like XY, is recorded in the record prohibition/read prohibition area (hidden area) 11-2B, and $XYsub_E$, like $XY_E$, is stored in the record prohibition/read permission area (ROM area) 11-1B.

The data size of XYmain is greater than that of XYsub (data size: XYmain>XYsub). In addition, the data composed of XYmain and XYsub corresponds to the above-described secret information XY.

In the eighth embodiment, as described above, since the set of XYsub[i] and $XYsub_E[i]$ is further included in addition to the set of XY, the eighth embodiment is advantageous in that the secret information X and Y can efficiently be recorded. The details will be described later.

Furthermore, the NAND flash memory 10 includes a data cache 12B for storing the XYsub, and a bit-by-bit addition module C2 for adding XYmain and XYsub on a bit-by-bit basis. The output value of the bit-by-bit addition module C2 corresponds to the above-described XY value that is used for authentication. In this example, since the bit length is different between XYmain and XYsub, repetitive data of XYsub is applied to the bit addition C2.

For example, as shown in the Figure, the bit addition is thinkable as the predetermined arithmetic operation. When the data size of XYmain is an integer number of times of the data size of XYsub, such a configuration is thinkable that the XYmain is successively sent from the Data cache which stores the data of XYmain, and XYsub is successively and repeatedly sent from the Data cache which stores the data of XYsub. The Data cache which stores XYsub may be thought to be a ring buffer. Aside from the bit-by-bit addition, the bound value of XYmain and XYsub may be used as XY, or the interleave bound value of XYmain and XYsub may be used as XY. Besides, XYmain and XYsub may be input to the LFSR and the value of a predetermined register of the LFSR may be used as XY. In short, in the present embodiment, although the bit-by-bit addition module is used, it is possible to apply any of arithmetic methods using the data, which is composed of two inputs, as XY.

Similarly, the host device 20 further includes a correction process module 21B, a decrypt module 22B, a key holding module 23B, a data storage module 25B, and an addition module C3, which are adaptive to the read-out $XYsub_E$. By the above structure, the host 20 similarly executes an error correction process, and executes decryption by the corresponding KEY_XYsub, thereby obtaining XYsub. Thus, the secret information XYmain and XYsub can be shared between the host device and the NAND flash memory. Although the KEY_XYmain and KEY_XYsub are depicted as different objects in the Figure, these may actually be the same. As regards the KEY_XYsub that is used for encryption of each XYsub[i}, when i is different, it is preferable to use different KEY_XYsub. Besides, the host device 20 and memory 10 execute the authentication process, based on the XY value which is obtained by executing a predetermined arithmetic operation by using XYmain and XYsub.

<Authentication Flow>

Next, referring to FIG. 32, the authentication operation according to the eighth embodiment is described.

In the eighth embodiment, XYsub, in addition to XYmain, is recorded in the NAND flash memory 10, and $XYmain_E$ and $XYsub_E$, which are obtained by encrypting them, are also recorded.

Thus, as shown in the Figure, in the corresponding step S13, the host 10 further reads out $XYmain_E$ and $XYsub_E$, decrypts them, and creates secret information XY based on the secret information XYmain and XYsub (Create XY). Subsequently, the host 20 executes similar authentication by using the information which is derived from the secret information XYmain and XYsub.

Similarly, on the NAND flash memory 10 side, in step S15, secret information XY is created based on the read-out secret information XYmain and XYsub (Create XY). In this respect, the eighth embodiment differs from the seventh embodiment.

<Advantageous Effects>

According to the authenticator/authenticatee and the authentication method relating to the eighth embodiment, the above points (I) to (IV) can be improved, and at least the above-described advantageous effect (11) can be obtained. Further, in the eighth embodiment, the following advantageous effect (12) can be obtained.

(12) Secret information X, Y can efficiently be recorded, and the recording time can advantageously be shortened.

In the eighth embodiment, the NAND flash memory 10 has plural XYsub and plural $XYsub_E$, selectively sends $XYsub_E$ by an instruction from the host 20, selectively sets XYsub that is used for authentication by an instruction from the host 20, and executes authentication by the value which is derived by a predetermined arithmetic operation of the selected XYsub and XY.

In addition, the host device has the function of selectively reading out the $XYsub_E$ which corresponds to the key 23B that is held by the host device itself, has the function 22B of decrypting the $XYsub_E$, and has the function of updating the key 23B that is held by itself under a predetermined condition, and executes the authentication 30 by the value which is derived by a predetermined arithmetic operation of the selected XYsub and XYmain.

As described above, since the set of XYsub[i] and $XYsub_E$[i] is further included in addition to the set of XYmain, there is the advantage that the secret information X and Y can be efficiently recorded.

To be more specific, for example, this is illustrated in FIG. 33. As shown in FIG. 33, in the fabrication process of the NAND flash memory, a plurality of sets of XYmain, $XYmain_E$, XYsub and $XYsub_E$ are generated by an XY generator (XY GEN), and are written in a plurality of NAND flash memories (in this example, Chip 1 to Chip 4) by a writer (Writer).

In this example, the data of XYmain and $XYmain_E$ may be identical data in a group (e.g. lot) comprising plural chips Chip 1 to Chip 4. On the other hand, the XYsub and $XYsub_E$ need to be different data (XYsub1 to XYsub4, and $XYsub_E$1 to $XYsub_E$4) between the chips Chip 1 to Chip 4.

As described above, in the eighth embodiment, in the data write operation, the XYmain and $XYmain_E$, the data amount of which is large, are made common between the plural chips Chip 1 to Chip 4. Thereby, the process of data write in the memory can be optimized and the data can be efficiently recorded.

If the XYmain and $XYmain_E$ are structured by hardwired configuration, the actually recorded data are the XYsub and $XYsub_E$, the data amount of which is small, and the recording time can be shortened. If the XYmain and $XYmain_E$ are recorded on the cells, since these are identical in the group, it is possible to shorten the time for transferring record data to a data recording device in the NAND flash memory. As has been described above, since the increase in recording time becomes the increase in cost, the eighth embodiment has a great merit that the manufacturing cost can be reduced.

[Ninth Embodiment (An Example of Multiple Recording)]

Figure 34:
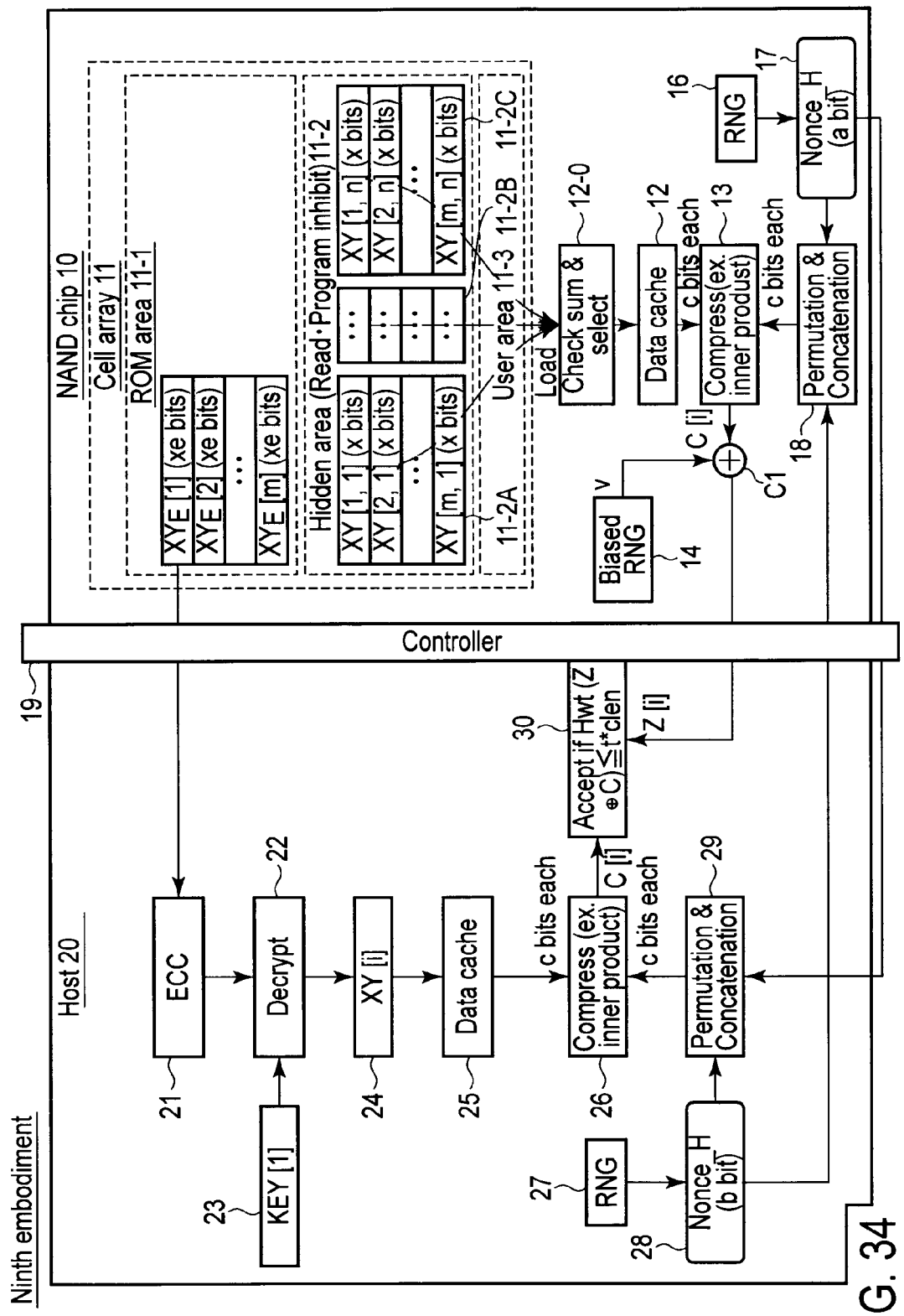
FIG. 34 is a block diagram showing a structure example according to a ninth embodiment.
Figure 35:
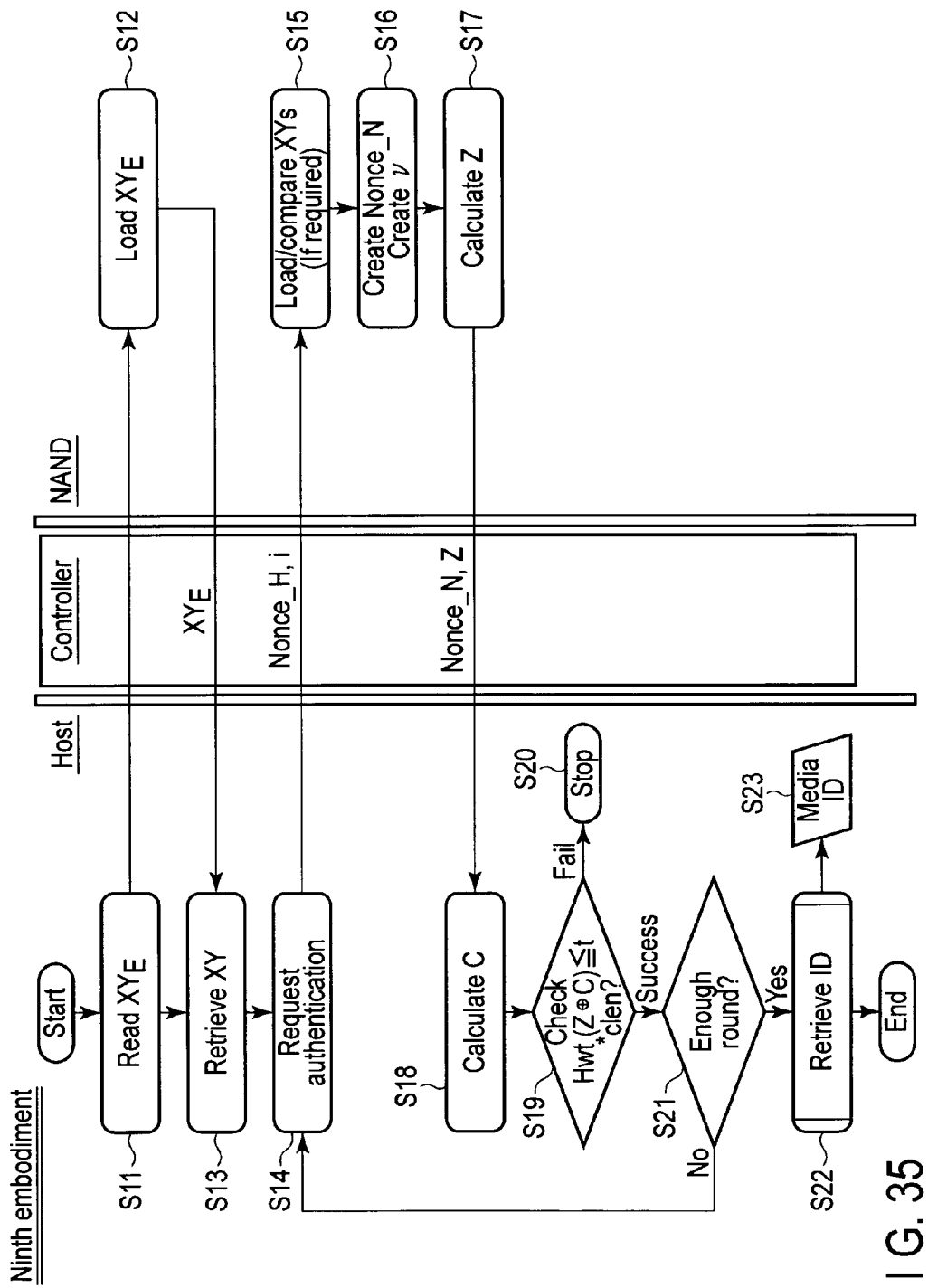
FIG. 35 is a flow chart illustrating an authentication flow according to the ninth embodiment.

Next, referring to FIG. 34 and FIG. 35, a description is given of an authenticator/authenticatee and an authentication method according to a ninth embodiment.

<Structure Example (Memory System)>

Referring to FIG. 34, a structure example of the ninth embodiment is described.

The ninth embodiment differs from the seventh embodiment in that information pieces 11-2A, 11-2B and 11-2C, which are created by multiply duplicating a plurality of XY[i], are further included in the hidden area 11-2 of the memory 10.

Specifically, the data, which are obtained by duplicating XY[i] in the seventh embodiment, are indicated by XY[i, 1], XY[i, 2], ..., XY[i, n] in FIG. 34, and XY[i, 1]=XY[i, 2]=, ..., =XY[i, n], where 1≤i≤m. In addition, XY[1, j]≠XY[2, j]≠, ..., ≠XY[m, j], where 1≤j≤n.

In this example, while ECC is added to $XY_E$, ECC is not added to XY. Thus, when an error is included in the data that has been read out of the cell in the NAND flash memory, it can be thought that the completeness of the XY, which is used for authentication by the NAND flash memory, is lost. However, as in the present embodiment, since the information pieces 11-2A, 11-2B and 11-2C, which are created by duplicating the plural XY[i], are further included, a check sum & select module 12-0 can detect whether the error is included or not, by data comparison between the duplicate data.

Thus, the memory of the present embodiment differs from that of the seventh embodiment in that this embodiment further includes the check sum & select module (Check sum & select) 12-0 for adapting to the information pieces 11-2A, 11-2B and 11-2C which are created by duplicating the XY[i].

In FIG. 34, a data set of at least two XYs, which are loaded from the cell 11-2, is compared by the same predetermined method as described above, and it is checked whether an error is included or not. If an error is included or if an error cannot be eliminated, a different data set of at least two XYs is loaded once again, and a similar check is executed. This is repeated until no error is included or until a data set, from which an error can be eliminated, is found. When such a data set is found, this is used for authentication. As an example of the predetermined method, such a method is thinkable that two XYs are loaded, and an XOR value is calculated on a bit-by-bit basis, and then a check is executed as to whether all XOR values are 0. Alternatively, such a method is thinkable that three or more XYs are loaded, and XY, from which an error has been eliminated on a bit-by-bit basis by a majority check, is obtained. In addition, although all duplicate data of XY are identical data in this Figure, it is thinkable to adopt such a method that data, which have such a complementary relationship that the polarity of odd-numbered data and the polarity of even-numbered data in the duplicate data are reversed, are formed and recorded in advance. In this case, two XYs having the complementary relationship are loaded, and the XOR value is calculated on a bit-by-bit basis, and then a check is executed as to whether all XOR values are 1.

<Authentication Flow>

Next, referring to FIG. 35, the authentication operation according to the ninth embodiment is described.

As shown in FIG. 35, in the ninth embodiment, a plurality of XYs are multiply recorded in the hidden area 11-2 of the NAND flash memory 10.

Thus, in step S15, the NAND flash memory 10 reads out at least two XYs, compares them, and executes authentication by using the XY which includes no error (Load/compare XYs).

<Advantageous Effects>

According to the authenticator/authenticatee and the authentication method relating to the ninth embodiment, the above points (I) to (IV) can be improved, and at least the above-described advantageous effect (11) can be obtained.

Furthermore, according to the ninth embodiment, information pieces 11-2A, 11-2B and 11-2C, which are created by multiply duplicating a plurality of XY[i], are further included in the hidden area 11-2 of the memory 10.

In this case, while ECC is added to $XY_E$, ECC is not added to XY. Thus, when an error is included in the data that has been read out of the cell in the NAND flash memory, it can be thought that the completeness of the XY, which is used for authentication by the NAND flash memory, is lost.

However, according to the ninth embodiment, since the information pieces 11-2A, 11-2B and 11-2C, which are created by duplicating the plurality of XY[i], are further included, the check sum & select module 12-0 can detect whether the error is included or not, by the data comparison between the duplicate data. As a result, even in the case where an error is included in the data that has been read out of the cell in the memory 10, it is possible to advantageously prevent the completeness of the XY, which is used for authentication by the memory 10, from being lost.

[Tenth Embodiment]

Figure 36:
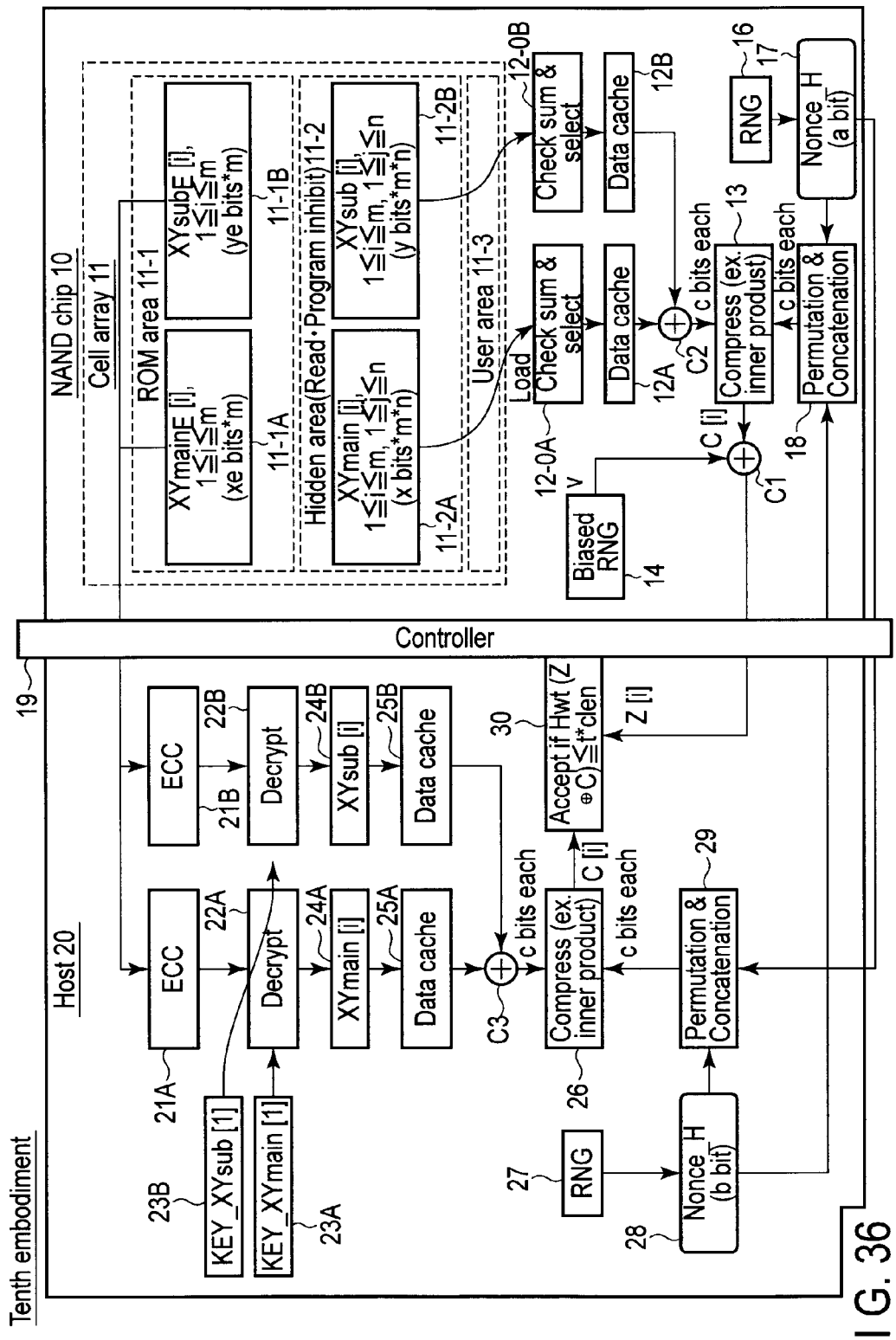
FIG. 36 is a block diagram showing a structure example according to a tenth embodiment.
Figure 37:
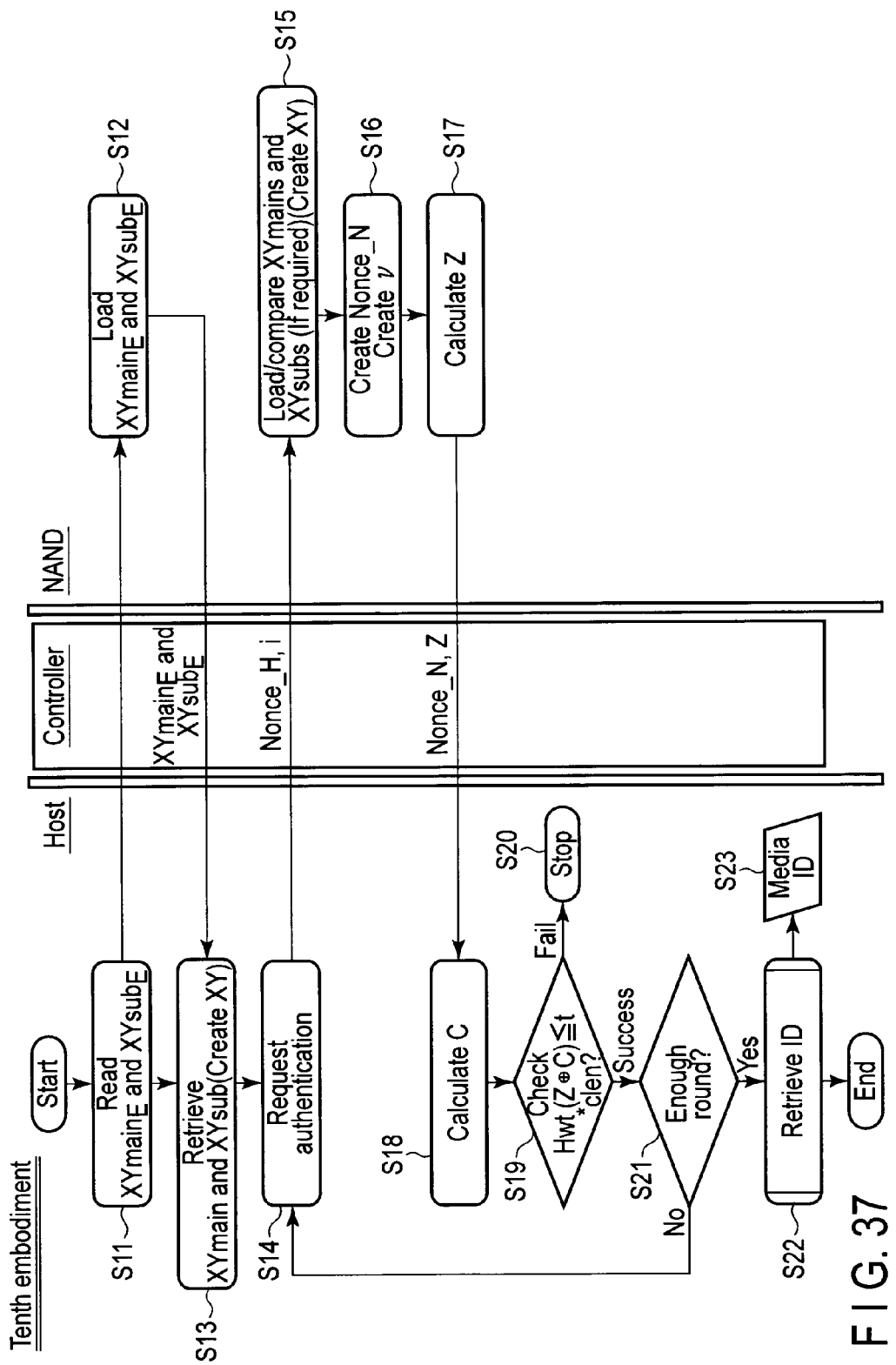
FIG. 37 is a flow chart illustrating an authentication flow according to the tenth embodiment.

Next, referring to FIG. 36 and FIG. 37, a description is given of an authenticator/authenticatee and an authentication method according to a tenth embodiment.

<Structure Example (Memory System)>

Referring to FIG. 36, a structure example of the tenth embodiment is described. The structure example of the tenth embodiment is an example relating to a combination of the eighth and ninth embodiments.

As shown in FIG. 36, the NAND flash memory 10 of the tenth embodiment differs from that of the ninth embodiment in that duplicate data XYsub[i, j] and $XYsub_E$[i, j] of XYsub and $XYsub_E$ are also recorded in the hidden area 11-2.

In addition, this embodiment further includes a check sum & select module 12-0B and a data cache 12B for adapting to the above.

<Authentication Flow>

Next, referring to FIG. 37, the authentication operation according to the tenth embodiment is described.

In the tenth embodiment, XYsubs are also multiply recorded in the NAND flash memory 10 (XYsub[i, j] and $XYsub_E[i, j]$).

Thus, in step S15, the NAND flash memory 10 further reads out at least two XYsubs, compares them, and executes authentication by using XYsub including no error (Load/compare XYs and XYsubs).

<Advantageous Effects>

According to the authenticator/authenticatee and the authentication method relating to the tenth embodiment, the above points (I) to (IV) can be improved, and at least the above-described advantageous effect (11) can be obtained.

Furthermore, according to the tenth embodiment, the NAND flash memory 10 also records the duplicate data XYsub[i, j] and $XYsub_E[i, j]$ of XYsub and $XYsub_E$ in the hidden area 11-2.

Where necessary, the structure and method of the present embodiment are applicable.

[Eleventh Embodiment]

Figure 38:
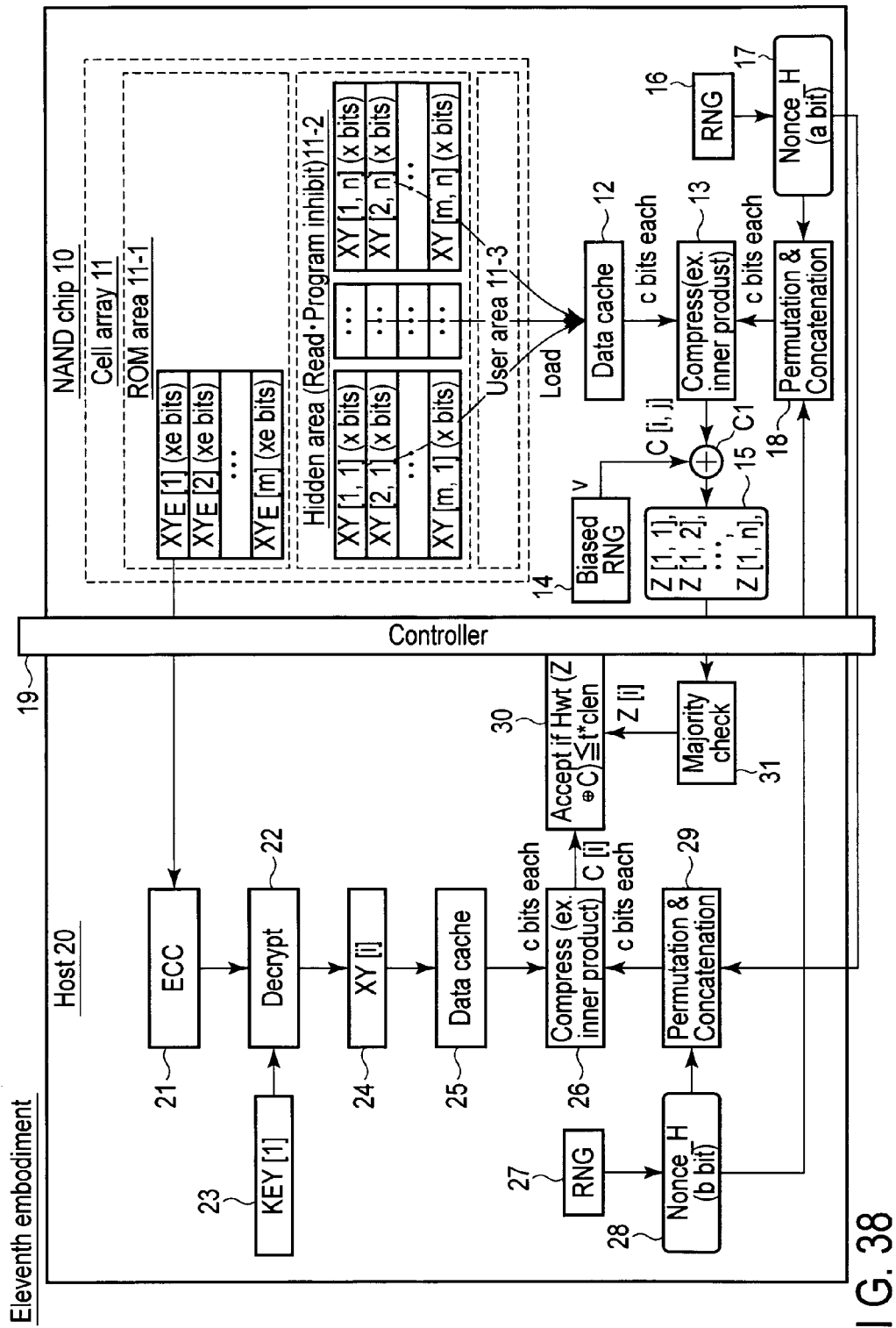
FIG. 38 is a block diagram showing a structure example according to an eleventh embodiment.
Figure 39:
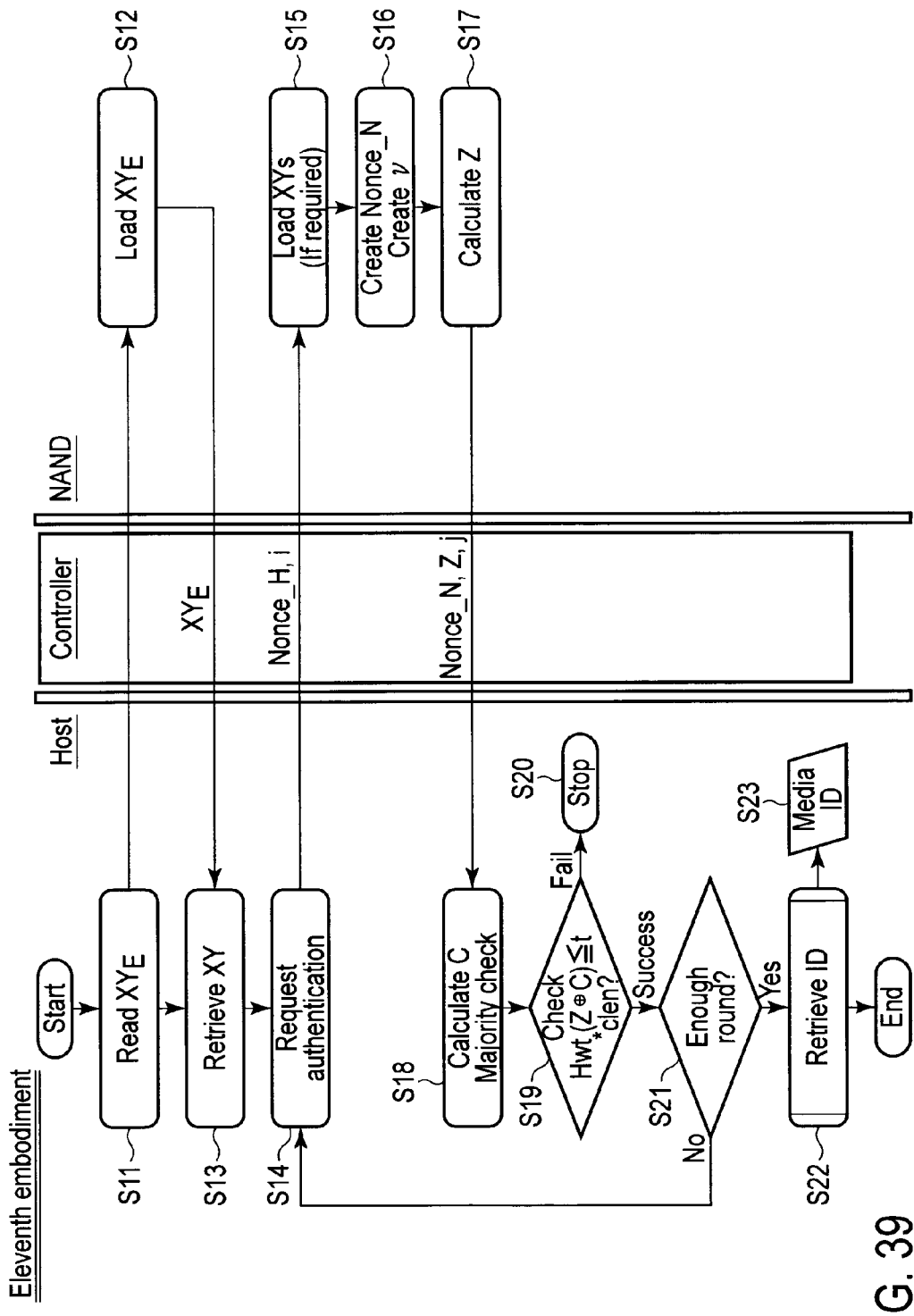
FIG. 39 is a flow chart illustrating an authentication flow according to the eleventh embodiment.

Next, referring to FIG. 38 and FIG. 39, a description is given of an authenticator/authenticatee and an authentication method according to an eleventh embodiment.

<Structure Example (Memory System)>

Referring to FIG. 38, a structure example of the eleventh embodiment is described.

Also in the eleventh embodiment, the NAND flash memory 10 includes information which is created by duplicating a plurality of pieces of XY[i]. Specifically, the data, which are created by duplicating XY[i] in the seventh embodiment, are indicated by XY[i, 1], XY[i, 2], . . . , XY[i, n] in FIG. 38, and XY[i, 1]=XY[i, 2]=, . . . , =XY[i, n], where 1≤i≤m. In addition, XY[1, j]≠XY[2, j]≠, . . . , ≠XY[m, j], where 1≤j≤n.

In this example, the duplication of XY data is the same as in the ninth embodiment. However, in the eleventh embodiment, the comparison process of duplicate data is not executed on the NAND flash memory 10 side. Instead, the comparison process is executed in the host 20. In this respect, the eleventh embodiment differs from the ninth embodiment. In addition, the eleventh embodiment differs from the ninth embodiment in that the host 20 includes a majority check module (Majority check) 31.

Specifically, in accordance with i which is designated by the host device 20, the NAND flash memory 10 loads at least two of XY[i, 1], XY[i, 2], . . . , XY[i, n], and executes the above-described authentication process with respect to each XY. In this case, the identical Nonce_N and identical Nonce_H are used for each XY, and also the identical v that is created by the biased RNG is applied.

The transmission module 15 of the NAND flash memory 10 calculates a plurality of Z (Z[i, 1], Z[i, 2], . . . , Z[i, n]) with respect to plural XYs under the same conditions of the other parameters, and sends them to the host device 20.

After receiving the plurality of Z (Z[i, 1], Z[i, 2], . . . , Z[i, n]), the host device executes a majority check by the majority check module 31 and obtains a single Z. In this case, when each Z is composed of a plurality of bit elements, and when the output of the compression calculation module is composed of plural bits, the majority check is executed on a bit-by-bit basis.

After obtaining Z from which an error has been eliminated by the majority check, the host device executes the same determination process 30 as described above, thereby authenticating the NAND flash memory 10.

<Authentication Flow>

Next, referring to FIG. 39, the authentication operation according to the eleventh embodiment is described.

In the eleventh embodiment, the NAND flash memory 10 calculates a plurality of Z's by using the XYs which are multiply recorded in the NAND flash memory 10, and sends the Z's. The host device executes the majority check on the plural Z's, thereby obtaining a single Z and executing authentication.

Thus, in step S17, the NAND flash memory 10 transmits the calculated plural Z's and j's to the host 20.

Subsequently, in step S18, the host 20 executes a majority check (Majority check) of the plural Z's, which is the difference from the ninth embodiment.

<Advantageous Effects>

According to the authenticator/authenticatee and the authentication method relating to the eleventh embodiment, the above points (I) to (IV) can be improved, and at least the above-described advantageous effect (11) can be obtained.

Furthermore, in the eleventh embodiment, the NAND flash memory 10 further includes the information which is created by duplicating a plurality of XY[i]. In addition, the host 20 includes the majority check module (Majority check) 31.

Therefore, the load of the comparison process in the NAND flash memory 10, in which the calculation resources are restricted, can be reduced, and the host 20 with sufficient calculation resources can be relied upon to execute the comparison process (majority process) 31. As a result, advantageously, the increase in cost of the NAND flash memory 10 can be suppressed, and an error can be eliminated.

[Twelfth Embodiment]

Figure 41:
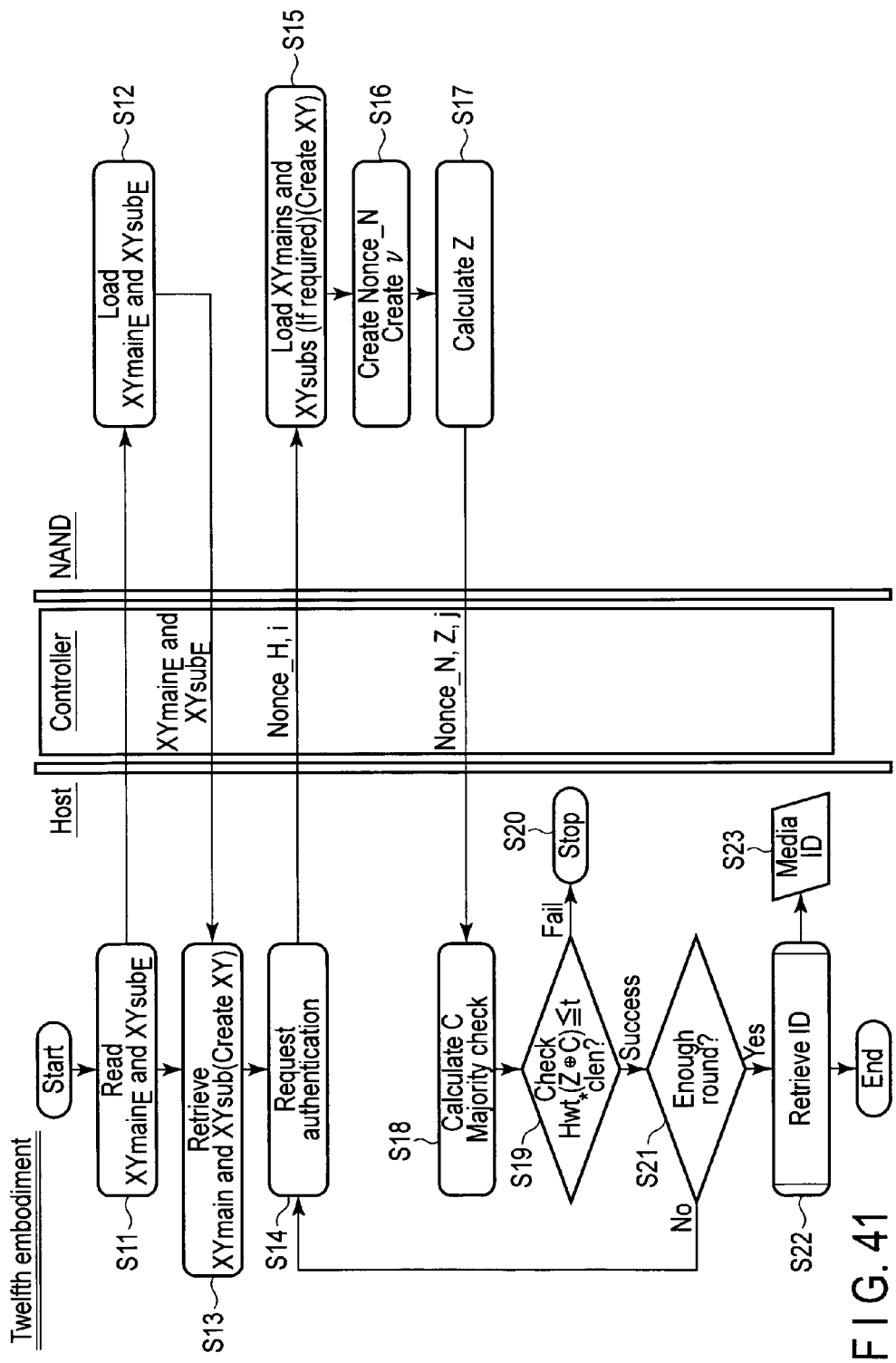
FIG. 41 is a flow chart illustrating an authentication flow according to the twelfth embodiment.

Next, referring to FIG. 40 to FIG. 41, a description is given of an authenticator/authenticatee and an authentication method according to a twelfth embodiment.

<Structure Example (Memory System)>

Referring to FIG. 40, a structure example of the twelfth embodiment is described. The twelfth embodiment relates to an example of a combination of the eighth and eleventh embodiments.

As shown in FIG. 40, the NAND flash memory 10 also stores duplicate data 11-2B and 11-1B of XYsub and $XYsub_E$. Like the above-described eleventh embodiment, authentication data Z for plural XYs are calculated and sent to the host 20 by the calculation module 15, and a majority check 31 is executed in the host device 20.

<Authentication Flow>

Next, referring to FIG. 41, the authentication operation according to the twelfth embodiment is described.

In the twelfth embodiment, the NAND flash memory 10 calculates a plurality of Z's by using the XYmain and XYsub, which are multiply recorded in the NAND flash memory 10, and sends the Z's. The host device executes the majority check on the plural Z's, thereby obtaining a single Z and executing authentication.

Thus, in step S11, the host 20 issues a read-out request (Read $XYmain_E$ and $XYsub_E$) of the multiply recorded XYmain and XYsub.

Subsequently, in step S12, the NAND flash memory 10 reads out the multiply recorded XYmain and XYsub (Load $XYmain_E$ and $XYsub_E$), and sends the XYmain and XYsub to the host 20 ($XYmain_E$ and $XYsub_E$).

<Advantageous Effects>

According to the authenticator/authenticatee and the authentication method relating to the twelfth embodiment, the above points (I) to (IV) can be improved, and at least the advantageous effect (11) can be obtained.

Furthermore, according to the twelfth embodiment, the NAND flash memory 10 also records the duplicate data 11-2B and 11-1B of XYsub and XYsub$_E$. Like the above-described eleventh embodiment, the authentication data Z for plural XYs are calculated and sent to the host 20 by the calculation module 15, and the majority check 31 is executed in the host 20.

In this manner, where necessary, the present embodiment is applicable.

[13th Embodiment (Media ID Retrieve Process)]

Next, referring to FIG. 42 to FIG. 45, a 13th embodiment is described. The 13th embodiment relates to various processes (Media ID retrieve process) of calculating a media ID (Media ID) in the above-described step S22.

ID Retrieve Process (1)

ID retrieve process (1) is as shown in FIG. 42. As shown in FIG. 42, in this example (1), in step RS1, a one-way function process (One-way function) is executed on XYmain and XYsub which are used in the above-described authentication. The result of the process is treated as the Media ID.

In this case, as the one-way function process, use can be made of a one-way arithmetic operation based on ciphers such as SHA-1, SHA-256 or AEG-H.

ID Retrieve Process (2)

ID retrieve process (2) is as shown in FIG. 43. As shown in FIG. 43, in this example (2), in step RS1, RS2, the XYmain and XYsub, which have been used in the above-described authentication, are further subjected to a decoding process (Decode) by using the KEYXY corresponding to one of the KEY_XYmain and KEY_XYsub which have been used in decryption of KEY_XYmain$_E$ and KEY_XYsub$_E$ in the above-described authentication process.

Subsequently, in step RS3, a similar one-way function process (One-way function) is executed, and the result of the process is treated as the Media ID.

ID Retrieve Process (3)

ID retrieve process (3) is as shown in FIG. 44. As shown in FIG. 44, in this example (3), in step RS1, RS2, the XYmain and XYsub, which have been used in the above-described authentication, are further subjected to a decoding process (Decode) by using the KEY_XYmain and KEY_XYsub which have been used in decryption of KEY_XYmain$_E$ and KEY_XYsub$_E$ in the above-described authentication process.

Subsequently, in step RS3, a similar one-way function process (One-way function) is executed, and the result of the process is treated as the Media ID.

ID Retrieve Process (4)

ID retrieve process (4) is as shown in FIG. 45. As shown in FIG. 45, in this example (4), in step RS1, RS2, the XYmain and XYsub, which have been used in the above-described authentication, are further subjected to a decoding process (Decode) by using KEY_XYmain2 and KEY_XYsub2 which are different from the KEY_XYmain and KEY_XYsub which have been used in decryption of KEY_XYmain$_E$ and KEY_XYsub$_E$ in the above-described authentication process. In this case, the KEY_XYmain2 and KEY_XYsub2 may have the same value.

Subsequently, in step RS3, a similar one-way function process (One-way function) is executed, and the result of the process is treated as the Media ID.

[14th Embodiment (Media ID Binding Process)]

Next, referring to FIG. 46 and FIG. 47, a 14th embodiment is described. The 14th embodiment relates to a use method of Media ID (Media ID binding process).

For example, when commercial moving picture content or the like is recorded on a physical medium and played back, such a method is used that identification information unique to the physical medium is used in an encryption process at a time of content recording, and the content is bound to the physical medium.

At a time of playing back the content, such a method is adopted that a decryption process or a check process based on the identification information is executed, and when the identification information that has been reproduced does not agree with the identification information which was used in the encryption process at the time of recording the content, the playback of the content is stopped. Examples of the physical medium include a removable medium such as an SD card, and an embedded memory which is incorporated in a mobile phone, etc.

In any case, the object of the above-described method is to stop playback of unlawfully duplicated content, when encrypted content, which is recorded on a certain medium, has been unlawfully copied to another medium. As information for this purpose, use is made of the above-described identification information (media ID) which varies from media to media.

ID Binding Process (1)

ID binding process (1) is as shown in FIG. 46. As shown in FIG. 46, in this example (1), a MAC (Message Authentication Code) generation process is executed, and this is used for preventing unlawful duplication.

Specifically, in step BP1, in an example of a method of using Media ID as the above-described identification information, a MAC generation process is executed on Media ID or other information, based on Content Key which is used for content encryption.

Subsequently, in an apparatus which records content in media, the MAC is generated and the generated MAC is recorded on the media. In an apparatus which plays back the content from the media, the recorded MAC is checked, based on the Media ID, or Content Key. When the authenticity has been confirmed, the content is played back. When the authenticity has not been confirmed, such a method is applied that the playback of the content is stopped.

ID Binding Process (2)

ID binding process (2) is as shown in FIG. 47. As shown in FIG. 47, in this example (2), Media ID is used as information for generating Content Key which is used for content encryption.

In step BP1, in an apparatus which records content in media, Media ID and Content Key Precursor are subjected to a one-way function process (One-way function).

In the apparatus which records content in media, the content which has been encrypted by the processed Content Key is recorded.

In an apparatus which plays back the content from the media, the recorded Content Key Precursor and Media ID are subjected to a similar one-way function process, thereby obtaining the Content Key. Thus, the decryption and playback of the content are executed. In the case where the Media ID does not coincide, that is, in the case where the content data has been unlawfully copied to different media, the derived Content Key does not coincide with the Content Key which was used in the content encryption. Thus, the decryption of the content fails, and the playback is stopped.

[15th Embodiment (An Example of a Memory and a Storage/Playback Host)]

Figure 48:
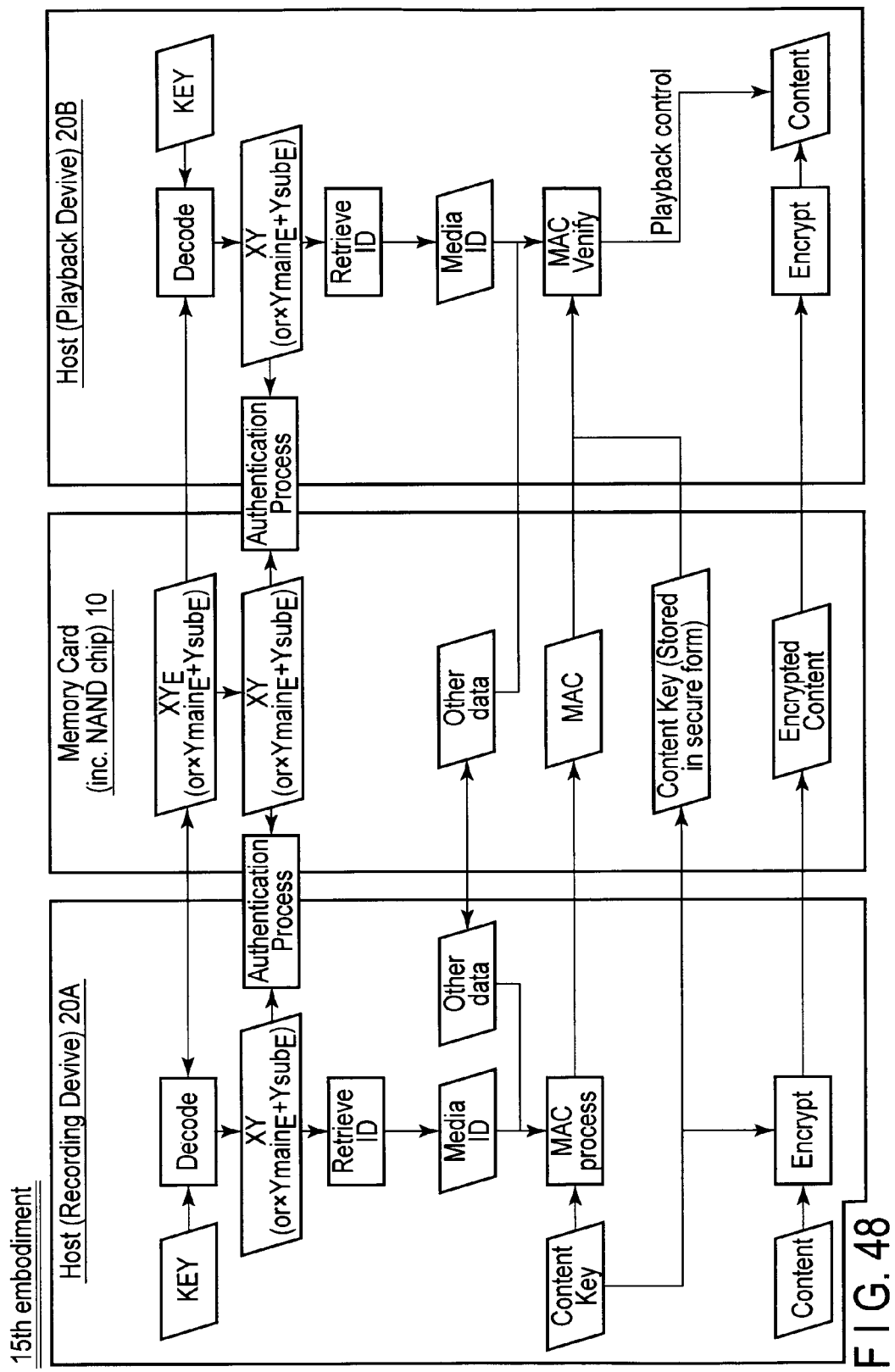
FIG. 48 is a block diagram showing a structure example according to a 15th embodiment.

Next, referring to FIG. 48, a 15th embodiment is described. The 15th embodiment relates to an example in which in a system of a memory card (inc. NAND chip) 10, a recording host (Recording Device) 20A and a playback host (Playback Device) 20B, which is a combination of the structures of the above-described embodiments, the above-described authentication is executed and content is played back in the host 20B by using the above-described media ID.

When the recording host (Recording Device) 20A records content in the memory card (inc. NAND chip) 10, the authentication process in the above embodiments is first executed between the memory card (inc. NAND chip) 10 and the recording host (Recording Device) 20A. After the authentication process has been successfully executed, the ID retrieval process in the above embodiments is executed. Then, the MAC, which has been generated by the ID binding process (1) in the above embodiment, is recorded in the memory card (inc. NAND chip) 10. In addition, content (Encrypted Content) encrypted by the Content Key used in the ID binding process (1) is recorded. Further, the Content Key itself is also recorded in a secure form. The secure form, in this context, may be a form of recording in a recording area in the memory card (inc. NAND chip) 10 which becomes accessible after the authentication is successfully executed between the memory card (inc. NAND chip) 10 and the recording host (Recording Device) 20A. The authentication, in this context, may be the authentication method described in the present application, or may be realized by some other authentication function which is possessed by the memory card (inc. NAND chip) 10. Another example of the secure form may be an encrypted form by a key which is possessed by the memory card (inc. NAND chip) 10 or the recording host (Recording Device) 20A.

When the playback host (Playback Device) 20B reads out the content from the memory card (inc. NAND chip) 10 and plays back the content, the authentication process in the above embodiments is first executed between the memory card (inc. NAND chip) 10 and the playback host (Playback Device) 20B. After the authentication process has been successfully executed, the ID retrieval process in the above embodiments is executed. Then, the MAC, which is recorded in the memory card (inc. NAND chip) 10, is verified by the process corresponding to the ID binding process (1) in the above embodiment. Thereafter, the Content Key is read out from the memory card (inc. NAND chip) 10, and the encrypted content (Encrypted Content) is decrypted, and thereby the content is played back.

[16th Embodiment (Another Example of a Memory and a Storage/Playback Host)]

Figure 49:
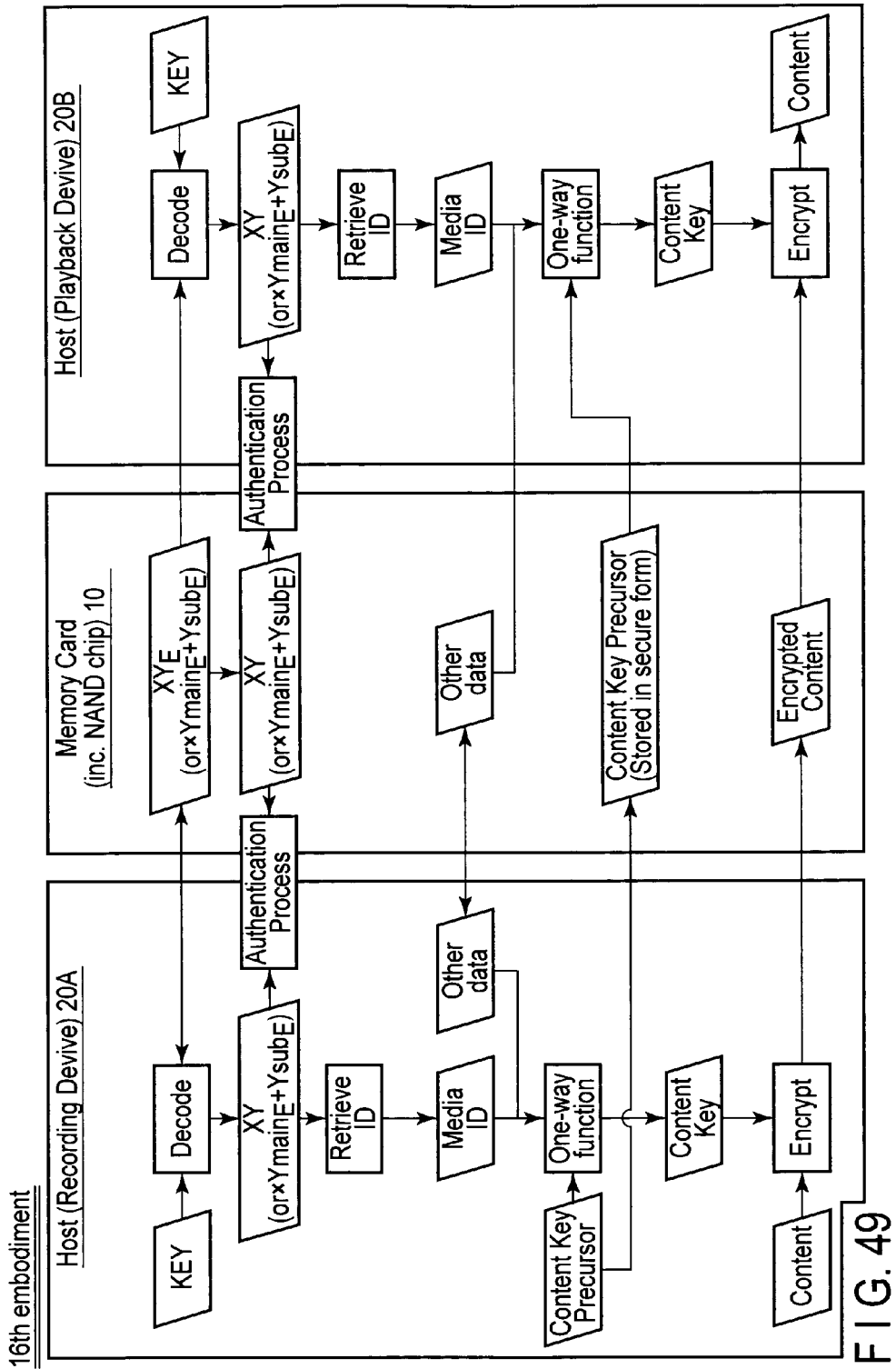
FIG. 49 is a block diagram showing a structure example according to a 16th embodiment.

Next, referring to FIG. 49, a 16th embodiment is described. The 16th embodiment relates to an example in which in a system of a memory card (inc. NAND chip) 10, a recording host (Recording Device) 20A and a playback host (Playback Device) 20B, which is a combination of the structures of the above-described embodiments, the above-described authentication is executed and content is played back in the host 20B by using the above-described media ID.

When the recording host (Recording Device) 20A records content in the memory card (inc. NAND chip) 10, the authentication process in the above embodiments is first executed between the memory card (inc. NAND chip) 10 and the recording host (Recording Device) 20A. After the authentication process has been successfully executed, the ID retrieval process in the above embodiments is executed. Then, the Content Key, which has been generated by the ID binding process (1) in the above embodiment, is recorded in the memory card (inc. NAND chip) 10. In addition, content (Encrypted Content) encrypted by the Content Key, which has been generated by the ID binding process (2), is recorded. Further, the Content Key Precursor itself is also recorded in a secure form.

The secure form, in this context, may be a form of recording in a recording area in the memory card (inc. NAND chip) 10 which becomes accessible after the authentication is successfully executed between the memory card (inc. NAND chip) 10 and the recording host (Recording Device) 20A. The authentication, in this context, may be the authentication method described in the present application, or may be realized by some other authentication function which is possessed by the memory card (inc. NAND chip) 10. Another example of the secure form may be an encrypted form by a key which is possessed by the memory card (inc. NAND chip) 10 or the recording host (Recording Device) 20A.

When the playback host (Playback Device) 20B reads out the content from the memory card (inc. NAND chip) 10 and plays back the content, the authentication process in the above embodiments is first executed between the memory card (inc. NAND chip) 10 and the playback host (Playback Device) 20B. After the authentication process has been successfully executed, the ID retrieval process in the above embodiments is executed. Then, the Content Key is generated from the Content Key Precursor, which is recorded in the memory card (inc. NAND chip) 10, by the process corresponding to the ID binding process (2) in the above embodiment. Thereafter, the encrypted content (Encrypted Content) is decrypted, and thereby the content is played back.

[17th Embodiment (An Example of a Memory, a Controller and a Host)]

Figure 50:
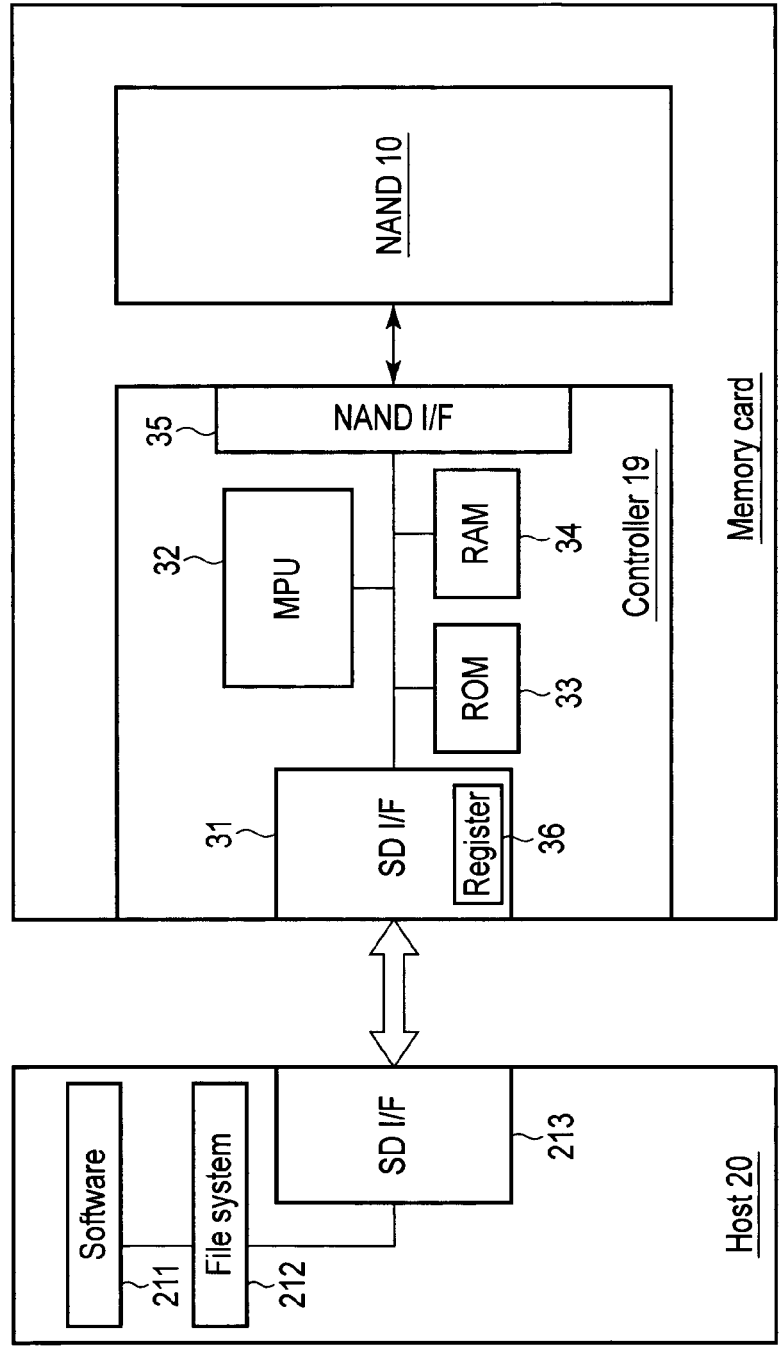
FIG. 50 is a block diagram showing a structure example according to a 17th embodiment.

Next, referring to FIG. 50, a 17th embodiment is described. The 17th embodiment relates to an example of the NAND flash memory 10, controller 19 and host device 20, which are applicable to the above-described embodiments. In this embodiment, an SD card (trademark) is taken as an example of a memory card.

As shown in FIG. 50, in this embodiment, functional blocks of the host device, which is connected to the memory card, are illustrated. The respective functional blocks can be realized by either hardware or computer software, or by a combination of both. Thus, the respective blocks are described, in general, from the standpoint of their functions, so as to clarify by which of them each block is realized. Whether such functions are executed as hardware or software depends on concrete modes of implementation or on design restrictions imposed on the entire system. A person skilled in the art may realize these functions by various methods in each concrete mode of implementation, but all methods of implementation fall within the scope of the present invention.

The host 20 includes software 211 such as an application or an operating system. The software 211 is instructed by the user to write data in the memory card, or to read out data from the memory card. The software 211 instructs a file system 212 to write and read data. The file system 212 is a scheme for managing file data which is recorded in a storage medium that is an object of management. The file system 212 records management information in a memory area in the storage medium, and manages the file data by using the management information.

The host 20 includes an SD interface 213. The SD interface 213 is composed of hardware and software, which are necessary for executing an interface process between the host 20 and the memory card. The host 20 communicates with the memory card via the SD interface 213. The SD interface 213 specifies various protocols which are necessary for communication between the host 20 and the memory card, and includes a set of various commands which are mutually recognizable by an SD interface 31 of the memory card, which will be described later. In addition, the SD interface 213 includes a hardware structure (arrangement of pins, number of pins, etc.) which is connectable to the SD interface 31 of the memory card.

The memory card includes a NAND flash memory 10 and a controller 19 for controlling the memory 10. When the memory card is connected to the host 20, or when the host 20 is turned on in the state in which the memory card is inserted in the host 20 that is in the OFF state, the memory card is supplied with power, executes an initializing process, and executes a process corresponding to the access from the host 20.

The NAND memory 10 stores data in a nonvolatile state, and executes data write and read in a unit called "page" which comprises a plurality of memory cells. A unique physical address is allocated to each page. In addition, the memory 10 executes erase of data in a unit called "block" (erase block) which comprises a plurality of pages. In some cases, a physical address is allocated to a physical block unit.

The controller 19 manages the storage state of data by the memory 10. The management of the storage state includes managing a relationship between a physical address of a page (or a physical block) and a logical address of data which is stored in this page, and managing which physical address is indicative of a page (or a physical block) that is in an erase state (a state in which no data is written or invalid data is stored).

The controller 19 includes an SD interface 31, an MPU 32, a ROM (read only memory) 33, a RAM (random access memory) 34, and a NAND interface 35.

The SD interface 31 is composed of hardware and software, which are necessary for executing an interface process between the host 20 and the controller 19. Like the SD interface 213, the SD interface 31 specifies protocols which enable communication between both, includes a set of various commands, and also includes a hardware structure (arrangement of pins, number of pins, etc.). The memory card (controller 19) communicates with the host 20 via the SD interface 31. The SD interface 31 includes a register 36.

The MPU 32 controls the entire operation of the memory card. For example, when the memory card is supplied with power, the MPU 32 reads out firmware (control program), which is stored in the ROM 33, into the RAM 34, and executes a predetermined process. The MPU 32 creates various tables on the RAM 34 according to the control program, or executes a predetermined process on the memory 10 according to a command which is received from the host 20.

The ROM 33 stores, e.g. a control program which is controlled by the MPU 32. The RAM 34 is used as a working area of the MPU 32, and temporarily stores the control program or various tables. Such tables include a conversion table (logical/physical table) for converting a logical address allocated to data by the file system 12 to a physical address of a page in which the data is actually stored. The NAND interface 35 executes an interface process between the controller 19 and the memory 10.

The memory areas in the NAND flash memory 10 include, for example, a system data area, a secret data area, a protected data area, a user data area, etc., in accordance with the kinds of data which is stored. The system data area is an area which is secured in the memory 10 by the controller 19 in order to store data which is necessary for the operation of the controller 19. The secret data area stores key information for use in encryption, and secret data for use at a time of authentication, and is inaccessible from the host 20. The protected data area stores important data, secure data, etc. The user data area is freely accessible and usable by the host 20, and stores, for instance, user data such as AV content files and image data. The controller 19 secures a part of the user data area, and stores control data (e.g. logical/physical address conversion table) which is necessary for the operation of the controller 19 itself.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
a memory cell array including a plurality of memory cells;
a random number generation circuit configured to generate a random number; and
a controller configured to control the memory cell array and the random number generation circuit,
wherein the random number generation circuit includes:
a random number control circuit configured to generate a random number parameter based on data which is read out from the memory cell by a generated control parameter; and
a pseudo-random number generation circuit configured to generate the random number by using the random number parameter as a seed value.

2. The device of claim 1, wherein the random number control circuit includes:
a control parameter generation circuit configured to generate the control parameter; and
an accumulation circuit configured to generate the seed value by executing an accumulation process on read-out data of the memory cell, which is input.

3. The device of claim 2, wherein the control parameter generation circuit includes:
an address setting circuit configured to receive a random number generation trigger signal from the controller, and to generate a control parameter of an address at a time of reading out data from the memory cell array, by using an output value of the pseudo-random number generation circuit; and
a voltage setting circuit configured to receive the random number generation trigger signal from the controller, and to generate a control parameter of read voltage at a time of reading out data from the memory cell array, by using the output value of the pseudo-random number generation circuit,
wherein both the parameters generated by the address setting circuit and the voltage setting circuit are output as the control parameter.

4. The device of claim 2, wherein the accumulation circuit includes a plurality of accumulation circuits to which segments each with a predetermined data length, into which read-out data from the memory cell array is divided, are input, and which execute accumulation processes,
wherein the plurality of accumulation circuits execute bit addition of the segments.

5. The device of claim 1, further comprising a clock generator configured to generate a clock which is delivered to the pseudo-random number generation circuit.

6. The device of claim 5, wherein the pseudo-random number generation circuit includes a register circuit having a setting signal input terminal to which the seed value is input, a data input terminal to which the random number is input, and a clock input portion to which the clock generated by the clock generator is input.

7. The device of claim 1, wherein the memory cell is either a single-level cell which is configured such that one memory cell is capable of storing 1-bit data, or a multilevel cell which is configured such that one memory cell is capable of storing plural-bit data.

8. The device of claim 7, wherein according to the control parameter, a threshold voltage distribution of the memory cell is configured such that a set range with a predetermined width is provided by setting a center of the threshold voltage distribution to be a reference, and the set range is divided at predetermined intervals by a plurality of levels.

9. A semiconductor memory device comprising:
a memory cell array including a plurality of memory cells;
a random number generation circuit configured to generate a random number; and
a controller configured to control the memory cell array and the random number generation circuit,
wherein the random number generation circuit includes:
a random number control circuit configured to generate a random number parameter based on data which is read out from the memory cell by a generated control parameter; and
a pseudo-random number generation circuit configured to generate the random number by using the random number parameter as a seed value, and to feed the random number back to the random number control circuit.

10. The device of claim 9, wherein the random number control circuit includes:
a control parameter generation circuit configured to generate the control parameter; and
an accumulation circuit configured to generate the seed value by executing an accumulation process on read-out data of the memory cell, which is input.

11. The device of claim 10, wherein the control parameter generation circuit includes:
an address setting circuit configured to receive a random number generation trigger signal from the controller, and to generate a control parameter of an address at a time of reading out data from the memory cell array, by using an output value of the pseudo-random number generation circuit; and
a voltage setting circuit configured to receive the random number generation trigger signal from the controller, and to generate a control parameter of read voltage at a time of reading out data from the memory cell array, by using the output value of the pseudo-random number generation circuit,
wherein both the parameters generated by the address setting circuit and the voltage setting circuit are output as the control parameter.

12. The device of claim 10, wherein the accumulation circuit includes a plurality of accumulation circuits to which segments each with a predetermined data length, into which read-out data from the memory cell array is divided, are input, and which execute accumulation processes,
wherein the plurality of accumulation circuits execute bit addition of the segments.

13. The device of claim 9, further comprising a clock generator configured to generate a clock which is delivered to the pseudo-random number generation circuit.

14. The device of claim 13, wherein the pseudo-random number generation circuit includes a register circuit having a setting signal input terminal to which the seed value is input, a data input terminal to which the random number is input, and a clock input portion to which the clock generated by the clock generator is input.

15. The device of claim 9, wherein the memory cell is either a single-level cell which is configured such that one memory cell is capable of storing 1-bit data, or a multilevel cell which is configured such that one memory cell is capable of storing plural-bit data.

16. The device of claim 15, wherein according to the control parameter, a threshold voltage distribution of the memory cell is configured such that a set range with a predetermined width is provided by setting a center of the threshold voltage distribution to be a reference, and the set range is divided at predetermined intervals by a plurality of levels.

17. A semiconductor memory device comprising:
a memory cell array including a plurality of memory cells;
a random number generation circuit configured to generate a random number; and
a controller configured to control the memory cell array and the random number generation circuit,
wherein the random number generation circuit includes:
a random number control circuit configured to generate a random number parameter based on data which is read out from the memory cell by a generated control parameter;
a first pseudo-random number generation circuit configured to start an operation with an initial value, and to output a random number 1 as a stage number 1 to the random number control circuit; and
a second pseudo-random number generation circuit configured to generate the random number by using the random number parameter, which is received, as a seed value (stage number 2).

18. The device of claim 17, wherein the random number generation circuit further includes an exclusive-OR circuit to which an output of the second pseudo-random number generation circuit and an output of the random number control circuit are input.

19. The device of claim 18, wherein the random number generation circuit is configured such that the seed value from the random number control circuit is also input to the first pseudo-random number generation circuit.

20. The device of claim 17, further comprising first and second clock generators configured to generate clocks which are delivered to the first and second pseudo-random number generation circuits.

* * * * *